(12) United States Patent  (10) Patent No.: US 8,574,817 B2
Hatakeyama et al.  (45) Date of Patent: Nov. 5, 2013

(54) POSITIVE RESIST COMPOSITION AND PATTERNING PROCESS

(75) Inventors: Jun Hatakeyama, Joetsu (JP); Koji Hasegawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/613,939

(22) Filed: Sep. 13, 2012

(65) Prior Publication Data

US 2013/0084529 A1   Apr. 4, 2013

(30) Foreign Application Priority Data

Oct. 3, 2011 (JP) .................................. 2011-218941

(51) Int. Cl.
*G03F 7/039* (2006.01)
*G03F 7/20* (2006.01)
*G03F 7/30* (2006.01)

(52) U.S. Cl.
USPC ........ 430/270.1; 430/905; 430/907; 430/910; 430/311; 430/326; 430/330; 430/921; 430/925

(58) Field of Classification Search
None
See application file for complete search history.

(56) References Cited

U.S. PATENT DOCUMENTS

| | | | |
|---|---|---|---|
| 5,879,851 A | 3/1999 | Takahashi et al. | |
| 6,242,161 B1 * | 6/2001 | Kawaguchi et al. | 430/313 |
| 6,448,420 B1 | 9/2002 | Kinsho et al. | |
| 6,746,817 B2 | 6/2004 | Takeda et al. | |
| 7,482,108 B2 | 1/2009 | Matsumaru et al. | |
| 7,510,820 B2 | 3/2009 | Hatakeyama et al. | |
| 7,537,880 B2 | 5/2009 | Harada et al. | |
| 7,598,016 B2 | 10/2009 | Kobayashi et al. | |
| 7,625,690 B2 | 12/2009 | Mizutani et al. | |
| 7,887,988 B2 | 2/2011 | Mizutani et al. | |
| 2008/0090172 A1 | 4/2008 | Hatakeyama et al. | |
| 2009/0297979 A1 * | 12/2009 | Hatakeyama et al. | 430/270.1 |

FOREIGN PATENT DOCUMENTS

| | | |
|---|---|---|
| EP | 0473547 A1 | 3/1992 |
| JP | 04-230645 A | 8/1992 |
| JP | 2000-327633 A | 11/2000 |
| JP | 3429592 B2 | 7/2003 |
| JP | 3438103 B2 | 8/2003 |
| JP | 2005-084365 A | 3/2005 |
| JP | 2006-045311 A | 2/2006 |
| JP | 2006-169302 A | 6/2006 |
| JP | 2006-178317 A | 7/2006 |
| JP | 3865048 B2 | 1/2007 |
| JP | 2007-171895 A | 7/2007 |
| JP | 2007-279699 A | 10/2007 |
| JP | 2008-096951 A | 4/2008 |
| JP | 2008-111103 A | 5/2008 |
| JP | 2008-122932 A | 5/2008 |
| JP | 2008-239918 A | 10/2008 |
| JP | 2011-123463 A | 6/2011 |

* cited by examiner

*Primary Examiner* — Sin J. Lee
(74) *Attorney, Agent, or Firm* — Westerman, Hattori, Daniels & Adrian, LLP

(57) ABSTRACT

A positive resist composition comprising a polymer having carboxyl groups substituted with an acid labile group having formula (1), (2) or (3) exhibits a high contrast of alkaline dissolution rate before and after exposure, a high resolution, a reduced acid diffusion rate, and forms a pattern with good profile, minimal edge roughness, and etch resistance. In formula (1), $R^1$, $R^2$, $R^5$, $R^6$, $R^8$, and $R^9$ are alkyl, aryl, or alkenyl, $R^3$, $R^4$, $R^7$, $R^{10}$, and $R^{11}$ are hydrogen, alkyl, alkoxy, acyloxy, halogen, cyano, nitro, hydroxyl or trifluoromethyl, M is methylene or ethylene, R is a single bond or linking group.

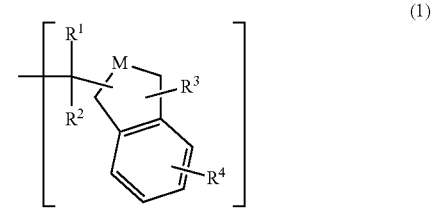

(1)

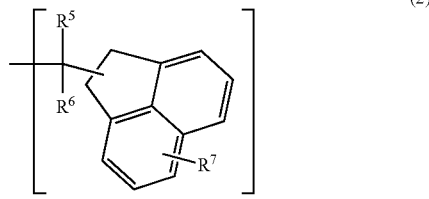

(2)

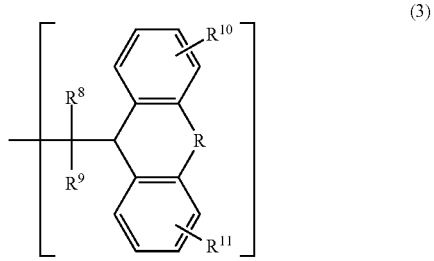

(3)

11 Claims, No Drawings

POSITIVE RESIST COMPOSITION AND PATTERNING PROCESS

CROSS-REFERENCE TO RELATED APPLICATION

This non-provisional application claims priority under 35 U.S.C. §119(a) on Patent Application No. 2011-218941 filed in Japan on Oct. 3, 2011, the entire contents of which are hereby incorporated by reference.

TECHNICAL FIELD

This invention relates to a positive resist composition, and more particularly to a chemically amplified positive resist composition comprising a specific polymer; and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made.

With respect to high-energy radiation of very short wavelength such as electron beam (EB) or x-ray, hydrocarbons and similar light elements used in resist materials have little absorption. Then polyhydroxystyrene base resist materials are under consideration. Resist materials for EB lithography are practically used in the mask image writing application. Recently, the mask manufacturing technology becomes of greater interest. Reduction projection exposure systems or steppers have been used since the time when the exposure light was g-line. While their demagnification factor was 1/5, a factor of 1/4 is now used as a result of chip size enlargement and projection lens diameter increase. It becomes of concern that a dimensional error of a mask has an impact on the dimensional variation of a pattern on wafer. It is pointed out that as the pattern feature is reduced, the value of a dimensional variation on the wafer becomes greater than the value of a dimensional error of the mask. This is evaluated by a mask error enhancement factor (MEEF) which is a dimensional variation on wafer divided by a dimensional error of mask. Patterns on the order of 45 nm often show an MEEF in excess of 4. In a situation including a demagnification factor of 1/4 and a MEEF of 4, the mask manufacture needs an accuracy substantially equivalent to that for equi-magnification masks.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage increased from 10 keV to 30 keV and reached 50 keV in the current mainstream system, with a voltage of 100 keV being under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control whereas electrons can pass straightforward through the resist film so that the resist film becomes less sensitive. Since the mask exposure tool is designed for exposure by direct continuous writing, a lowering of sensitivity of resist film leads to an undesirably reduced throughput. Due to a need for higher sensitivity, chemically amplified resist compositions are contemplated.

Thinning of resist film is in progress to facilitate reduction of pattern feature in the EB lithography for mask manufacturing and to prevent the pattern from collapsing due to a higher aspect ratio during development. In the case of photolithography, a thinning of resist film greatly contributes to resolution improvement. This is because introduction of chemical mechanical polishing (CMP) or the like has driven forward device planarization. In the case of mask manufacture, substrates are flat, and the thickness of processable substrates (e.g., Cr, MoSi or $SiO_2$) is predetermined by a percent light shield or phase shift control. The dry etch resistance of resist film must be improved before the film can be reduced in thickness.

It is generally believed that there is a correlation between the carbon density and the dry etching resistance of resist film. For EB writing which is not affected by absorption, resist materials based on novolac resins having better etching resistance have been developed. Indene copolymers described in Patent Document 1 and acenaphthylene copolymers described in Patent Document 2 are expected to have improved etching resistance due to a high carbon density and a robust main chain structure based on cycloolefin structure.

Also, with respect to the soft x-ray (EUV) lithography at wavelength 5-20 nm, the reduced absorption of carbon atoms was reported. Increasing the carbon density is effective not only for improving dry etching resistance, but also for increasing the transmittance in the soft x-ray wavelength region.

As the feature size is reduced, image blurs due to acid diffusion become a problem. To insure resolution for fine patterns with a size of 45 nm et seq., not only an improvement in dissolution contrast is requisite, but control of acid diffusion is also important, as known from previous reports. Since chemically amplified resist compositions are designed such that sensitivity and contrast are enhanced by acid diffusion, an attempt to minimize acid diffusion by reducing the temperature and/or time of post-exposure baking (PEB) fails, resulting in drastic reductions of sensitivity and contrast. Since the distance of acid diffusion is closely related to the type of acid labile group, it would be desirable to have an acid labile group which permits deprotection reaction to proceed at a very short distance of acid diffusion.

In Patent Document 3, methacrylates having an indane, acenaphthene, fluorene or 9,10-dihydroanthracene pendant are exemplified as the monomer to form a copolymer for use in photoresist underlayer forming material. Acid labile groups in the form of 1-indane or 1-tetrahydronaphthalene (meth)acrylate are proposed. Inclusion of aromatic within the acid labile group improves etch resistance and EUV transmittance. Patent Document 4 discloses a resist material comprising a copolymer of hydroxystyrene wherein an ester bond moiety is secondary or tertiary. In particular, 1-indane and 1-tetrahydronaphthalene of the secondary ester require a high level of activation energy for deprotection and suffer a dimensional change with a change of PEB temperature, that is, a dimensional difference dependent on PEB temperature. On the other hand, 1-indane and 1-tetrahydronaphthalene of the tertiary ester have a very low level of activation energy and low heat resistance so that deprotection reaction may take place by the heat during polymerization.

Proposed as protective groups of aromatic-containing dimethylcarbinol type are dimethylbenzene (Patent Document 5) and dimethylnaphthalene (Patent Document 6). These acid labile groups are highly susceptible to deprotection because the group of benzyl cation type resulting from deprotection is very stable, but have low thermal stability, extreme sensitivity to acid, inability to control acid diffusion, and low maximum resolution.

To overcome the drawback of aromatic-containing dimethylcarbinol type protective groups being susceptible to deprotection, Patent Document 7 proposes secondary aromatic-containing groups. However, the secondary acid labile groups are unsusceptible to deprotection and have a narrow PEB temperature margin, as compared with the tertiary carbinol type protective groups. While the aromatic-containing acid labile groups have the advantage of improved etch resistance, it is still desired to develop an acid labile group having high thermal stability and appropriate deprotection reactivity.

A tradeoff among sensitivity, edge roughness and resolution is reported. Increasing sensitivity leads to reductions of edge roughness and resolution. Controlling acid diffusion improves resolution at the sacrifice of edge roughness and sensitivity. Addition of an acid generator capable of generating a bulky acid is effective for suppressing acid diffusion, but leads to reductions of edge roughness and sensitivity as pointed out above. It is then proposed to copolymerize a polymer with an acid generator in the form of an onium salt having polymerizable olefin. Patent Documents 8 to 10 disclose sulfonium salts having polymerizable olefin capable of generating a sulfonic acid and similar iodonium salts. A photoresist using a base polymer having a polymerizable acid generator copolymerized therein exhibits reduced edge roughness due to controlled acid diffusion and uniform dispersion of acid generator within the polymer, succeeding in improving both resolution and edge roughness at the same time.

CITATION LIST

Patent Document 1: JP 3865048
Patent Document 2: JP-A 2006-169302
Patent Document 3: JP-A 2007-171895
Patent Document 4: JP-A 2007-279699
Patent Document 5: JP 3438103
Patent Document 6: JP-A 2011-123463
Patent Document 7: JP-A 2008-096951
Patent Document 8: JP-A H04-230645
Patent Document 9: JP-A 2005-084365
Patent Document 10: JP-A 2006-045311

DISCLOSURE OF INVENTION

An object of the present invention is to provide a positive resist composition, typically chemically amplified positive resist composition, comprising a specific polymer, which exhibits a high resolution surpassing prior art positive resist compositions, and forms a resist film having a minimal edge roughness (LER or LWR), a good pattern profile after exposure, and improved etch resistance. Another object is to provide a pattern forming process using the same.

Making investigations to seek for a positive resist composition which exhibits a high resolution, a minimal edge roughness (LER or LWR), a good pattern profile after exposure and development, and improved etch resistance, the inventors have found that better results are obtained when a polymer comprising recurring units having an ester of carbinol containing indane, tetrahydronaphthalene, acenaphthylene, fluorene or the like with carboxyl, specifically selected from (meth)acrylic acid and derivatives thereof, styrenecarboxylic acid, and vinylnaphthalenecarboxylic acid, is used as a base resin to formulate a positive resist composition, typically chemically amplified positive resist composition.

The above-specified polymer is used as a base resin in a positive resist composition, especially chemically amplified positive resist composition for the purposes of suppressing acid diffusion and improving dissolution contrast and etch resistance. Then the composition forms a resist film which exhibits a remarkably high contrast of alkaline dissolution rate before and after exposure, a significant effect of suppressing acid diffusion, a high resolution, a pattern of good profile and minimal edge roughness after exposure, and improved etch resistance. The composition is best suited as a fine pattern-forming material for the fabrication of VLSIs and photomasks.

The positive resist composition forms a resist film which has a high dissolution contrast, effective suppression of acid diffusion, a high resolution, exposure latitude, process adaptability, a pattern of good profile after exposure, and improved etch resistance. By virtue of these advantages, the composition is fully useful in commercial application and is best suited as a mask pattern-forming material for the fabrication of VLSIs.

In one aspect, the invention provides a positive resist composition comprising as a base resin a polymer having carboxyl groups whose hydrogen is substituted by an acid labile group having the general formula (1), (2) or (3).

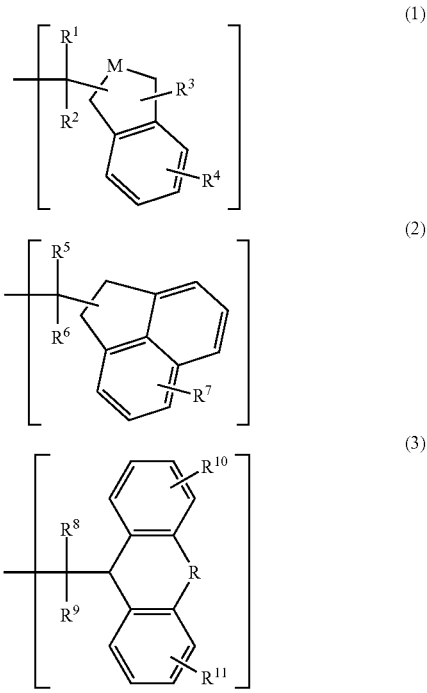

Herein $R^1$, $R^2$, $R^5$, $R^6$, $R^8$, and $R^9$ are each independently a straight, branched or cyclic $C_1$-$C_8$ alkyl, $C_6$-$C_{10}$ aryl, or $C_2$-$C_{10}$ alkenyl group, which may contain an oxygen or sulfur atom, $R^3$, $R^4$, $R^7$, $R^{10}$, and $R^{11}$ are each independently hydrogen, a straight, branched or cyclic $C_1$-$C_6$ alkyl, alkoxy, acyloxy, halogen, cyano, nitro, hydroxyl, or trifluoromethyl group, M is methylene or ethylene, R is a single bond or a $C_1$-$C_2$ linking group which may contain a double bond, oxygen atom or sulfur atom.

In a preferred embodiment, the polymer comprises recurring units (a1), (a2) or (a3) of the general formula (4), selected from (meth)acrylic acid and derivatives thereof, styrenecarboxylic acid, and vinylnaphthalenecarboxylic acid, each having substituted thereon an acid labile group of formula (1), (2) or (3), the polymer having a weight average molecular weight of 1,000 to 500,000.

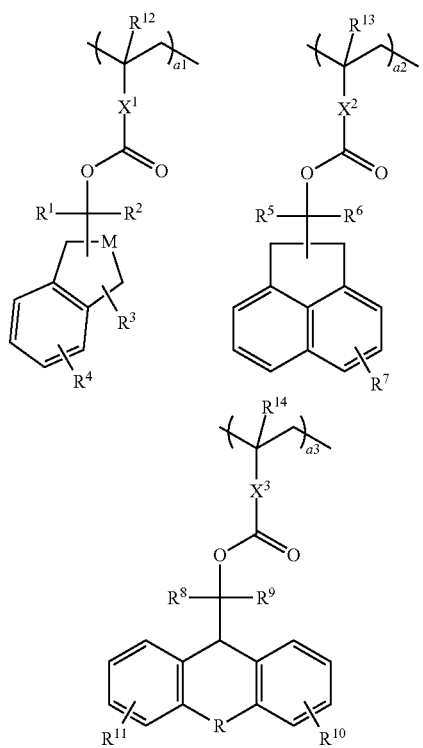

(4)

Herein $R^1$ to $R^{11}$, M and R are as defined above, $X^1$ to $X^3$ each are a single bond, —C(=O)—O—$R^{15}$—, phenylene or naphthylene group, $R^{15}$ is a straight, branched or cyclic $C_1$-$C_{10}$ alkylene group which may have an ester radical, ether radical or lactone ring, and $R^{12}$, $R^{13}$ and $R^{14}$ each are hydrogen or methyl.

In a preferred embodiment, the polymer is a copolymer comprising recurring units (a1), (a2) and/or (a3) of the general formula (4), selected from (meth)acrylic acid and derivatives thereof, styrenecarboxylic acid, and vinylnaphthalenecarboxylic acid, each having substituted thereon an acid labile group of formula (1), (2) and/or (3), and recurring units (b) having an adhesive group selected from the class consisting of hydroxyl, lactone, ether, ester, carbonyl, cyano, sulfonic acid ester, sulfonamide groups, cyclic —O—C(=O)—S— and —O—C(=O)—NH— groups, a1, a2, a3, and b being in the range: 0<a1+a2+a3<1.0, 0<b<1.0, and 0.05≤a1+a2+a3+b≤1.0, the copolymer having a weight average molecular weight of 1,000 to 500,000.

More preferably, the recurring units (b) are recurring units having a phenolic hydroxyl group. Even more preferably, the recurring units having a phenolic hydroxyl group are selected from units (b1) to (b9) represented by the following general formula (5).

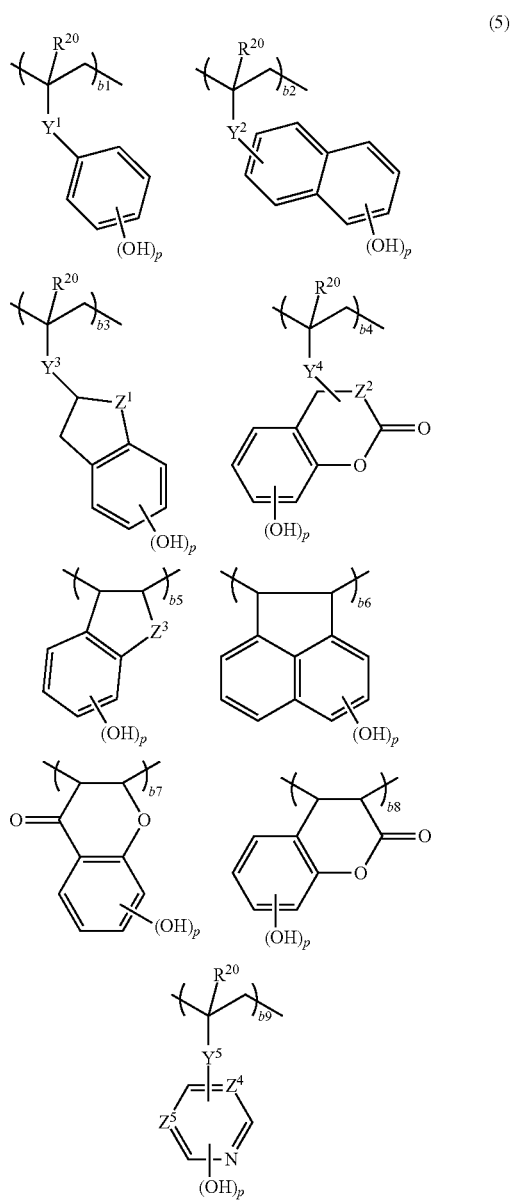

(5)

Herein $Y^1$, $Y^2$ and $Y^5$ each are a single bond or —C(=O)—O—$R^{21}$—, $Y^3$ and $Y^4$ each are —C(=O)—O—$R^{22}$—, $R^{21}$ and $R^{22}$ each are a single bond or a straight, branched or cyclic $C_1$-$C_{10}$ alkylene group which may contain an ether or ester radical, $R^{20}$ is each independently hydrogen or methyl, $Z^1$ and $Z^2$ each are methylene or ethylene, $Z^3$ is methylene, oxygen or sulfur, $Z^4$ and $Z^5$ each are CH or nitrogen, and p is 1 or 2.

In a preferred embodiment, the copolymer has further copolymerized therein recurring units selected from units (c1) to (c5) of indene, acenaphthylene, chromone, coumarin, and norbornadiene, or derivatives thereof, represented by the following general formula (6).

(6)

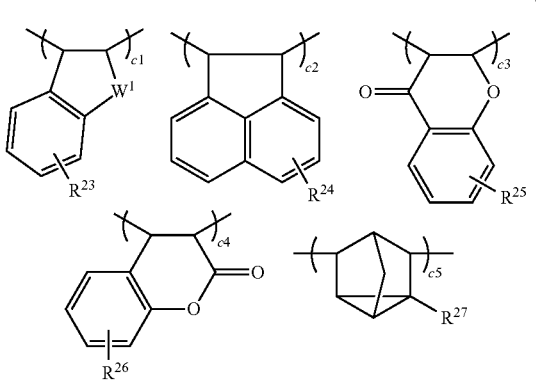

Herein $R^{23}$ to $R^{27}$ are each independently selected from the class consisting of hydrogen, $C_1$-$C_{30}$ alkyl, partially or entirely halo-substituted alkyl, alkoxy, alkanoyl or alkoxycarbonyl group, $C_6$-$C_{10}$ aryl group, halogen, and 1,1,1,3,3,3-hexafluoro-2-propanol, and $W^1$ is methylene, oxygen or sulfur.

In a preferred embodiment, the copolymer has further copolymerized therein units selected from sulfonium salts (d1) to (d3) represented by the following general formula (7) in addition to recurring units (a1), (a2) or (a3) and (b).

(7)

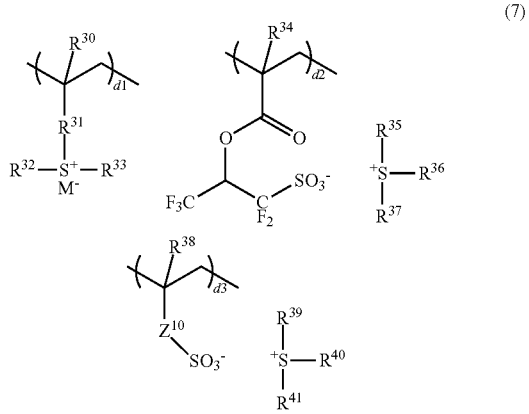

Herein $R^{30}$, $R^{34}$, and $R^{38}$ each are hydrogen or methyl, $R^{31}$ is a single bond, phenylene, —O—$R^{42}$—, or —C(=O)—$Y^{10}$—$R^{42}$—, $Y^{10}$ is oxygen or NH, $R^{42}$ is a straight, branched or cyclic $C_1$-$C_6$ alkylene group, alkenylene or phenylene group, which may contain a carbonyl, ester, ether or hydroxyl radical, $R^{32}$, $R^{33}$, $R^{35}$, $R^{36}$, $R^{37}$, $R^{39}$, $R^{40}$, and $R^{41}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group, $Z^{10}$ is a single bond, methylene, ethylene, phenylene, fluorophenylene, —O—$R^{43}$—, or —C(=O)—$Z^{11}$—$R^{43}$—, $Z^{11}$ is oxygen or NH, $R^{43}$ is a straight, branched or cyclic $C_1$-$C_6$ alkylene group, alkenylene or phenylene group, which may contain a carbonyl, ester, ether or hydroxyl radical, $M^-$ is a non-nucleophilic counter ion, d1, d2 and d3 are in the range of $0 \le d1 \le 0.3$, $0 \le d2 \le 0.3$, $0 \le d3 \le 0.3$, and $0 < d1+d2+d3 \le 0.3$.

The resist composition may further comprise an organic solvent and an acid generator, the composition being a chemically amplified positive resist composition. The resist composition may further comprise a dissolution regulator, a basic compound and/or a surfactant.

In another aspect, the invention provides a pattern forming process comprising the steps of applying the positive resist composition defined above onto a substrate to form a coating, baking, exposing to high-energy radiation, and developing the exposed coating in a developer.

The positive resist composition, typically chemically amplified positive resist composition is used not only in the lithography for forming semiconductor circuits, but also in the formation of mask circuit patterns, micromachines, and thin-film magnetic head circuits.

ADVANTAGEOUS EFFECTS OF INVENTION

The positive resist composition exhibits a remarkably high contrast of alkaline dissolution rate before and after exposure, a high resolution, a good pattern profile and minimal edge roughness (LER or LWR) after exposure, a significant effect of suppressing acid diffusion rate, and improved etch resistance. The composition is thus suited as a fine pattern-forming material for the fabrication of VLSIs or photomasks and a pattern-forming material for EUV lithography.

DESCRIPTION OF EMBODIMENTS

The singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not.

As used herein, the terminology "(meth)acrylic acid" or "(meth)acrylate" refers collectively to acrylic and methacrylic acid or acrylate and methacrylate. The terminology "$C_x$—$C_y$", as applied to a particular unit, such as, for example, a chemical compound or a chemical substituent group, means having a carbon atom content of from "x" carbon atoms to "y" carbon atoms per such unit.

The abbreviations have the following meaning.
EB: electron beam
EUV: extreme ultraviolet
PAG: photoacid generator
PEB: post-exposure bake
LER: line edge roughness
LWR: line width roughness
Mw: weight average molecular weight
Mn: number average molecular weight
Mw/Mn: dispersity or average molecular weight distribution
GPC: gel permeation chromatography The invention provides a positive resist composition comprising as a base resin a polymer or high-molecular-weight compound having carboxyl groups whose hydrogen is substituted by an acid labile group having the general formula (1), (2) or (3).

(1)

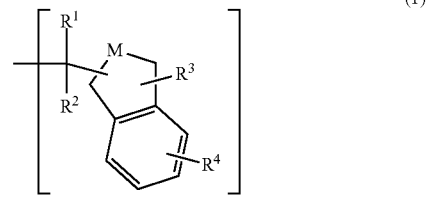

-continued

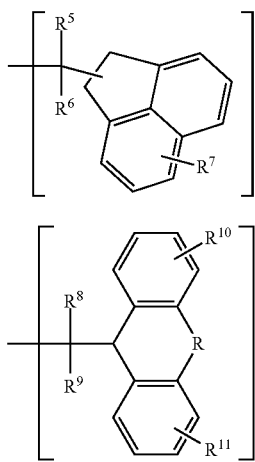

(2)

(3)

Herein $R^1$, $R^2$, $R^5$, $R^6$, $R^8$, and $R^9$ are each independently a straight, branched or cyclic $C_1$-$C_8$ alkyl, $C_6$-$C_{10}$ aryl, or $C_2$-$C_{10}$ alkenyl group, which may contain an oxygen or sulfur atom, $R^3$, $R^4$, $R^7$, $R^{10}$, and $R^{11}$ are each independently hydrogen, a straight, branched or cyclic $C_1$-$C_6$ alkyl, alkoxy, acyloxy, halogen, cyano, nitro, hydroxyl, or trifluoromethyl group, M is methylene or ethylene, R is a single bond or a $C_1$-$C_2$ linking group which may contain a double bond, oxygen atom or sulfur atom.

Examples of $R^4$, $R^2$, $R^5$, $R^6$, $R^8$, and $R^9$ include methyl, ethyl, propyl, butyl, cyclopropyl, cyclobutyl, cyclopentyl, cyclohexyl, norbornyl, oxonorbornyl, vinyl, allyl, propenyl, ethynyl, propynyl, thienyl, and furyl.

Examples of $R^3$, $R^4$, $R^7$, $R^{10}$, and $R^{11}$ include hydrogen, fluorine, methyl, ethyl, propyl, butyl, methoxy, ethoxy, acetoxy, methoxycarbonyl, cyano, and nitro. Inter alia, hydrogen, methyl, methoxy, acetoxy, methoxycarbonyl, cyano and nitro are preferred.

In a preferred embodiment, the acid labile group of formula (1), (2) or (3) substitutes for hydrogen atom of the carboxyl group on (meth)acrylic acid and derivatives thereof, styrenecarboxylic acid, and vinylnaphthalenecarboxylic acid. It is noted that (meth)acrylic acid and derivatives thereof are collectively referred to as (meth)acrylates, hereinafter. Specifically, a polymer comprising recurring units (a1), (a2) or (a3) of the general formula (4) and having a weight average molecular weight (Mw) of 1,000 to 500,000 is used as the base resin.

(4)

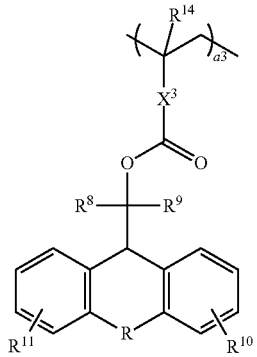

Herein $R^1$ to $R^{11}$, M and R are as defined above. $X^1$ to $X^3$ each are a single bond, —C(=O)—O—$R^{15}$—, phenylene or naphthylene group, wherein $R^{15}$ is a straight, branched or cyclic $C_1$-$C_{10}$ alkylene group which may have an ester (—COO—) radical, ether (—O—) radical or lactone ring. $R^{12}$, $R^{13}$ and $R^{14}$ each are hydrogen or methyl.

It is noted that although the alternative description is used herein for simplicity sake, a mixture of two or more acid labile groups having formulae (1), (2) and (3) is acceptable, and differently stated, a mixture of two or more of recurring units (a1), (a2) and (a3) is encompassed herein. Sometimes, units (a1) to (a3) are collectively referred to as units (a).

Typical of the $C_1$-$C_{10}$ alkylene group having lactone ring is a group of the formula below.

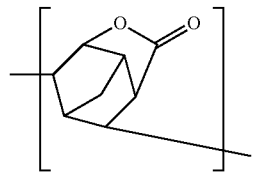

Specifically, the recurring units (a1) of formula (4) include units (a1-1) to (a1-4) represented by the following formula (8).

(8)

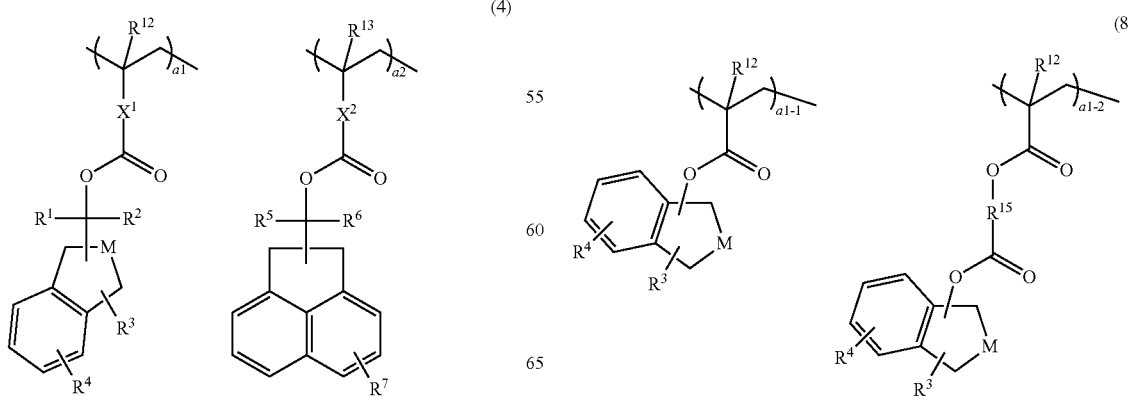

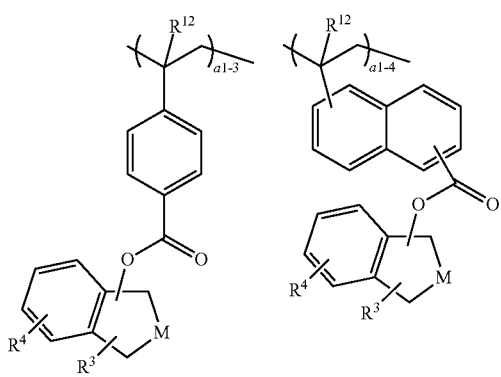
Herein, $R^3$, $R^4$, $R^{12}$, $R^{15}$, and M are as defined above. These structures are equally applicable to the recurring units (a2) and (a3) of formula (4).
In particular, these acid labile groups are applicable to the KrF, EB and EUV lithography.
Examples of suitable monomers from which recurring units (a1-1) to (a1-4) are derived are shown below.
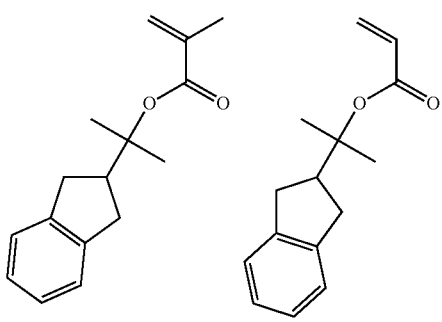
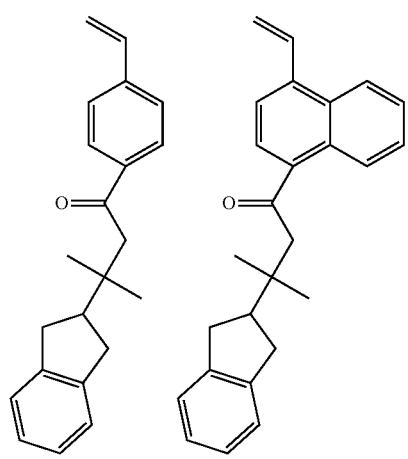
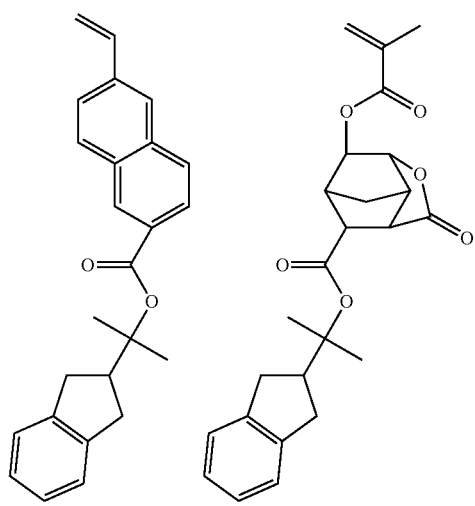
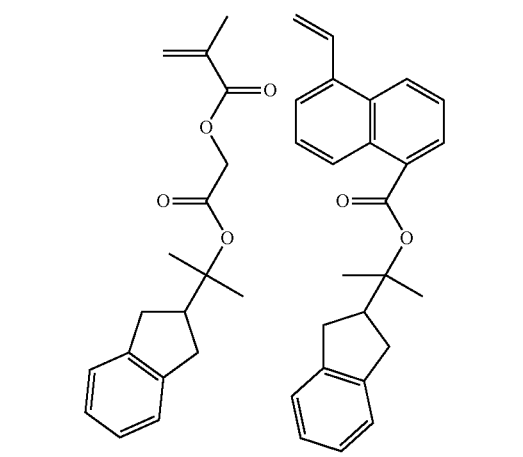
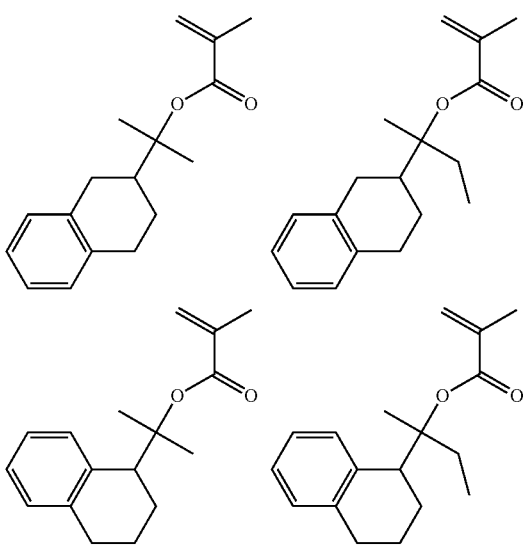

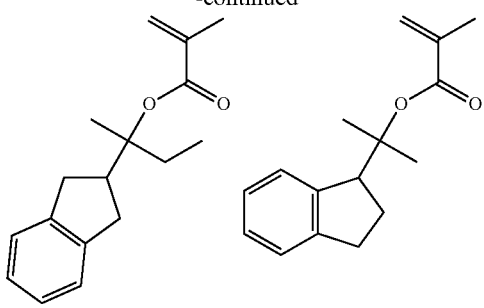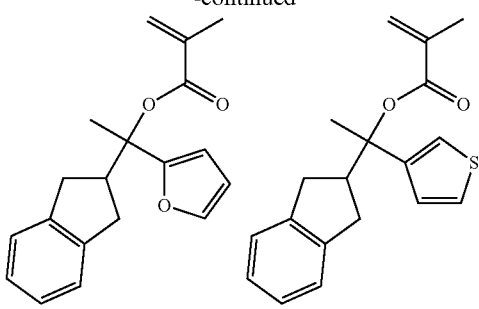
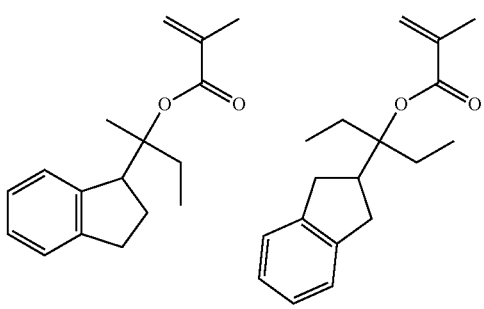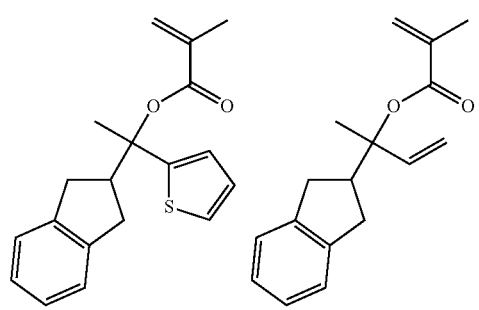
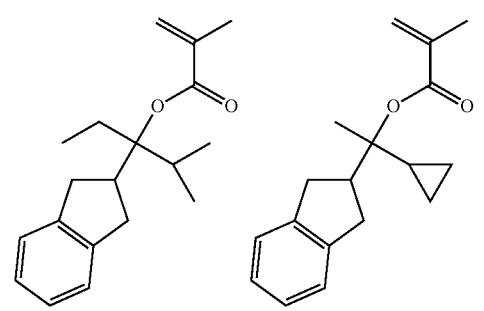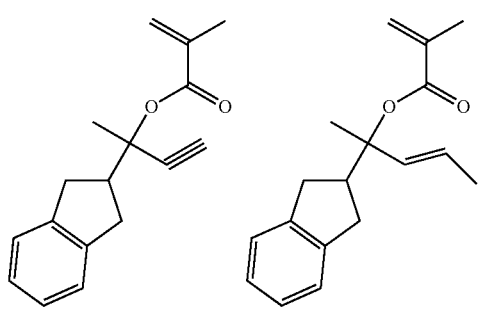
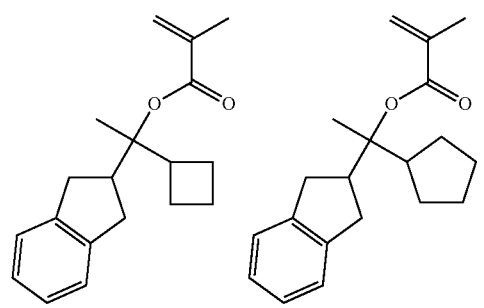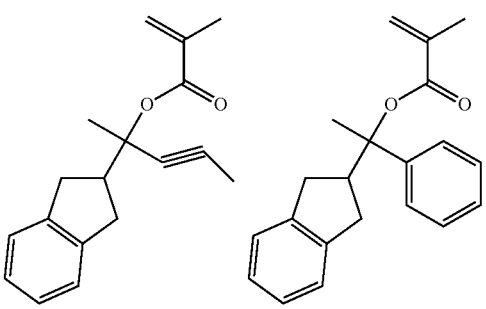
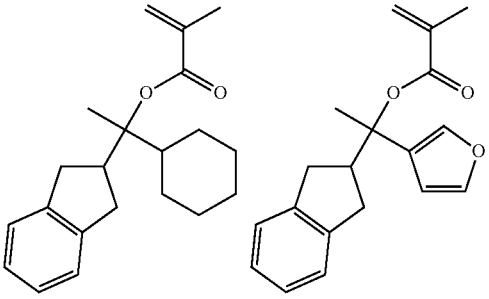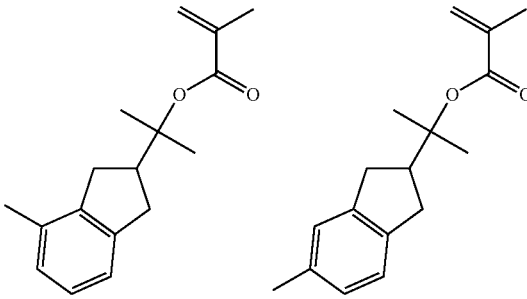

15
-continued
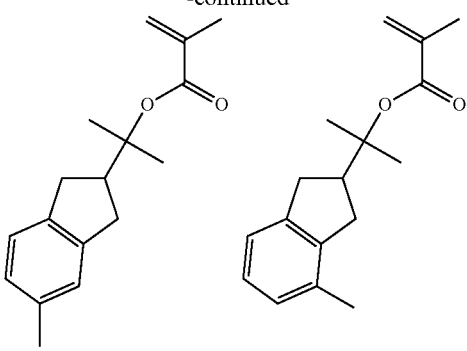
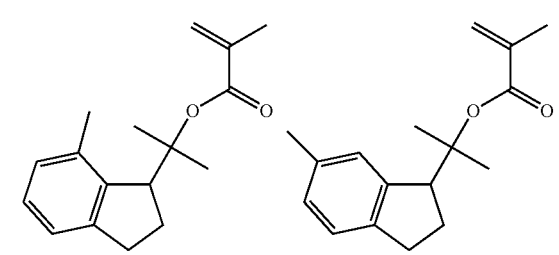
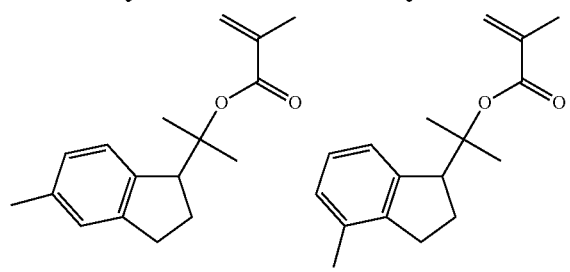
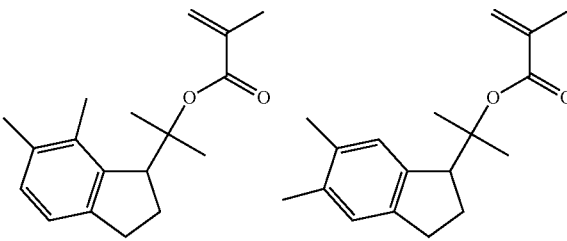
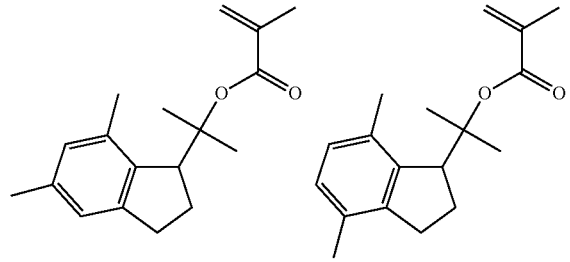
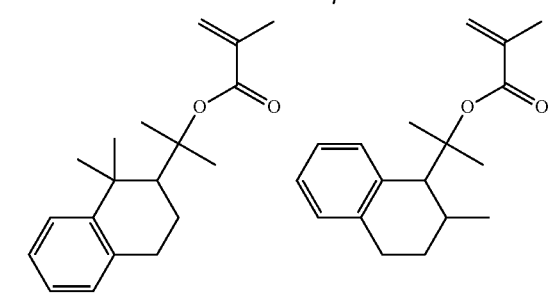
16
-continued
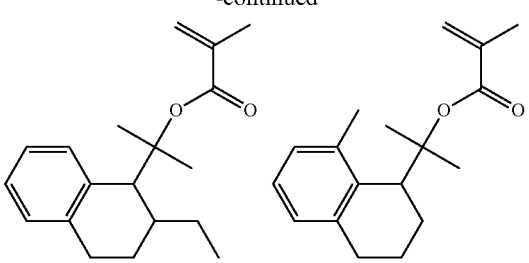
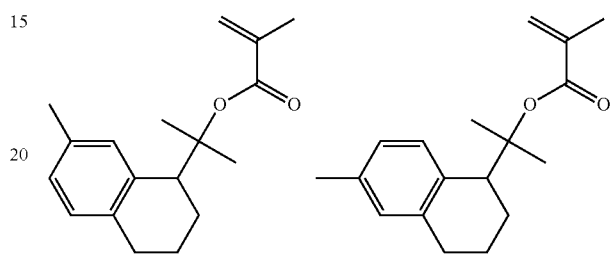
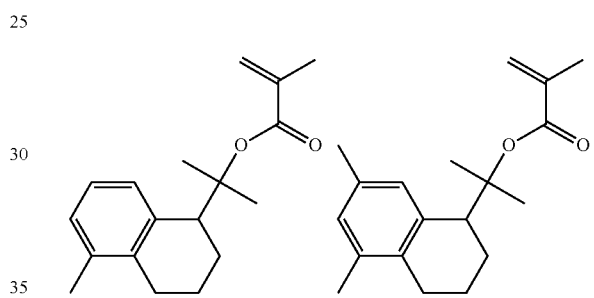
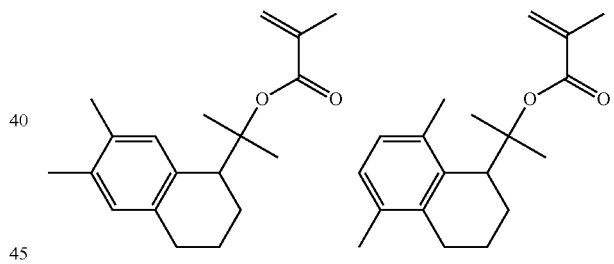
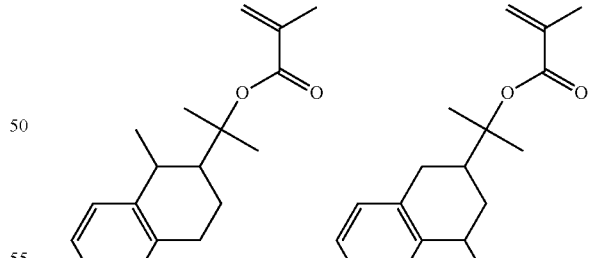
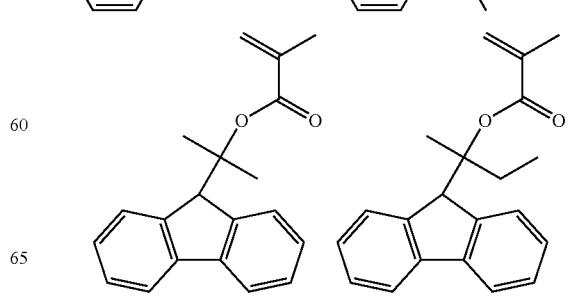

-continued
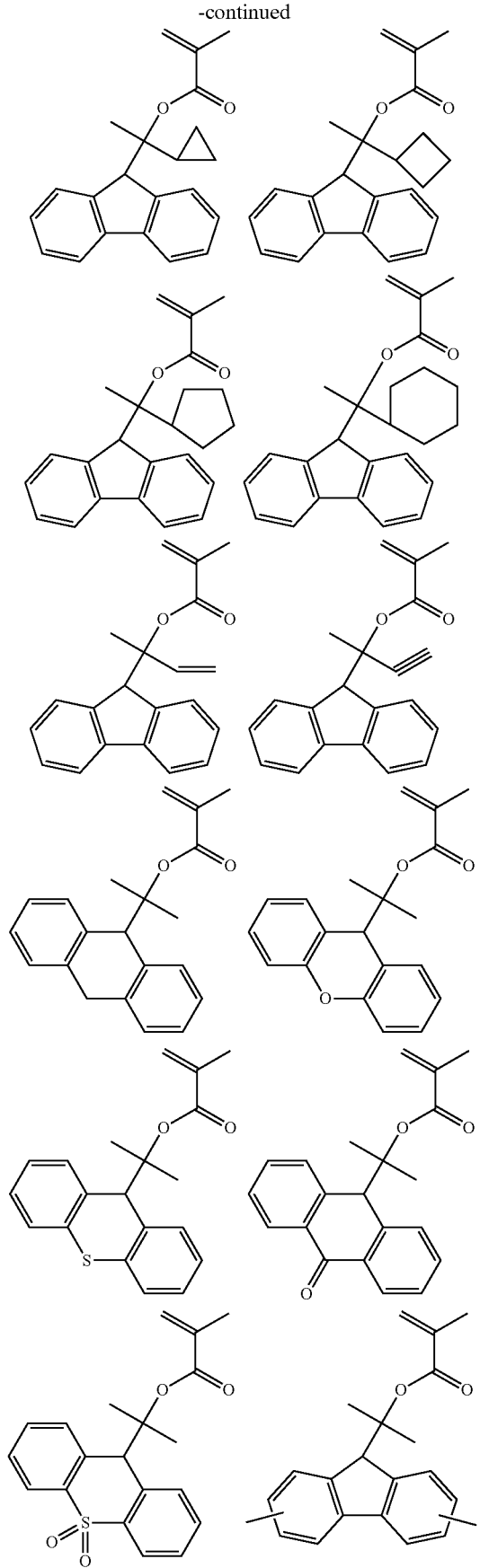
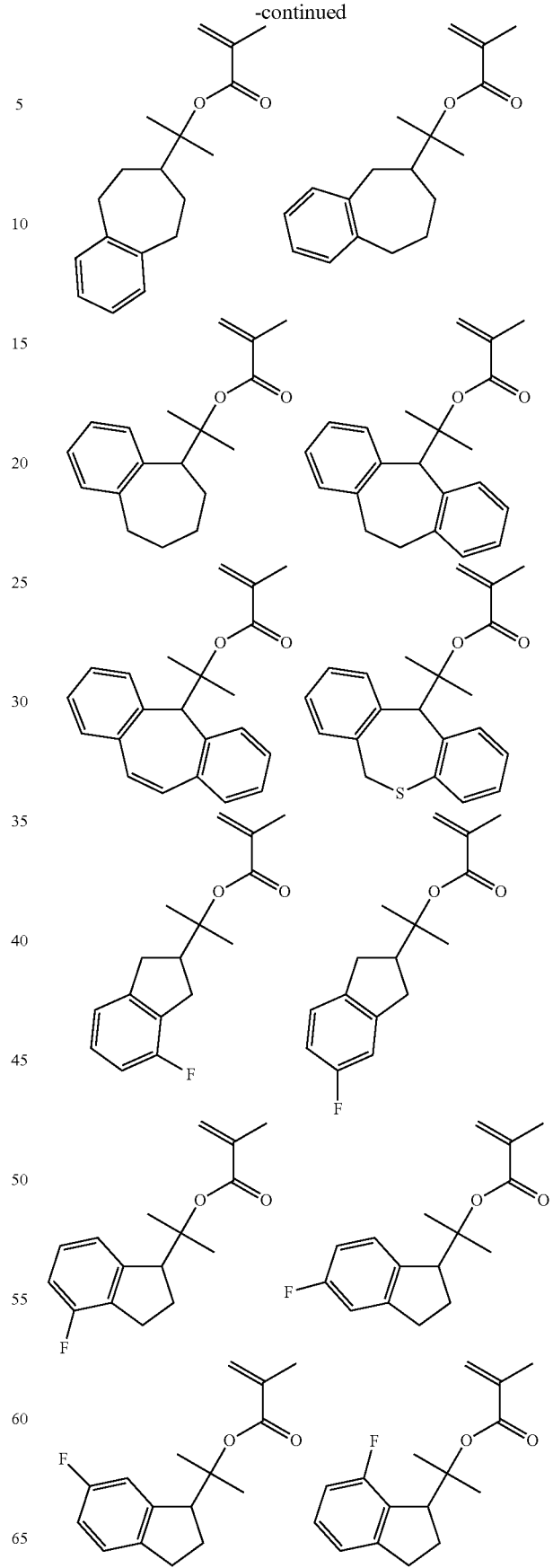

-continued
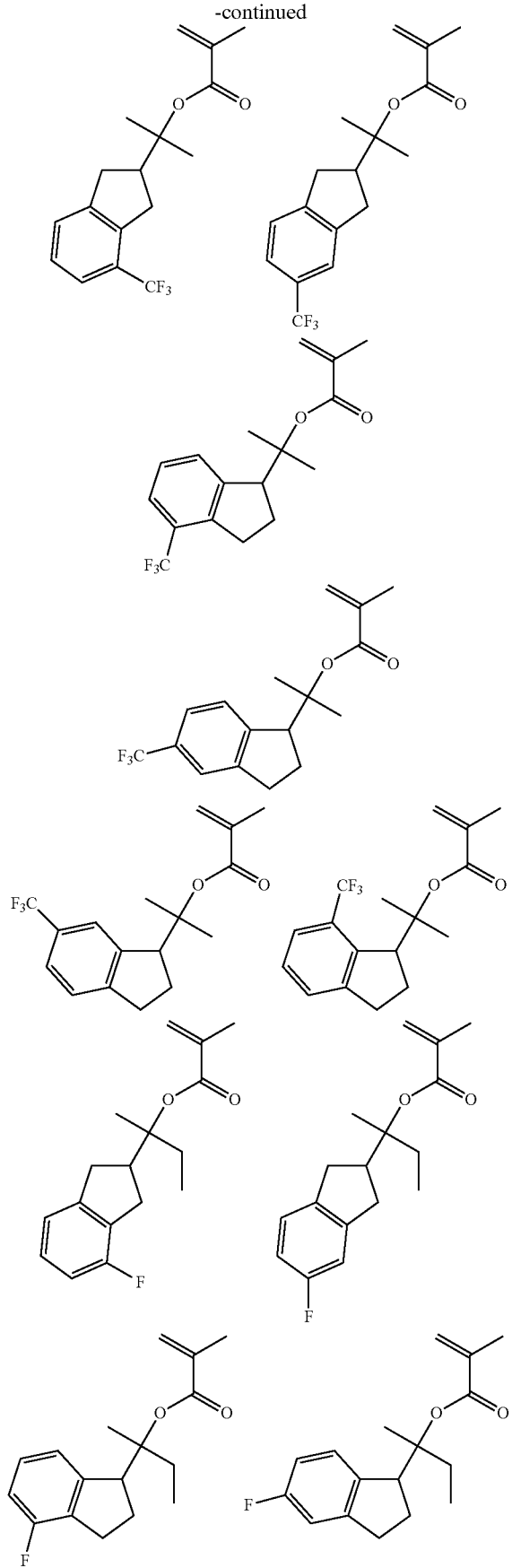
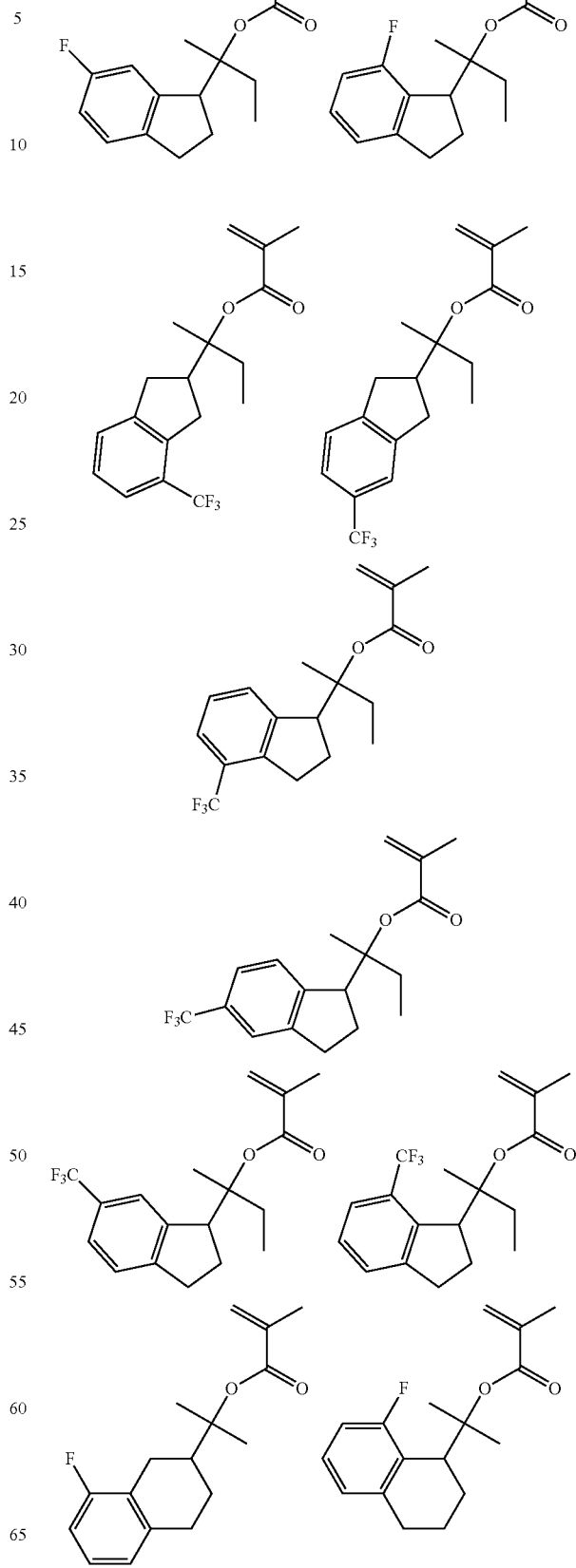

-continued
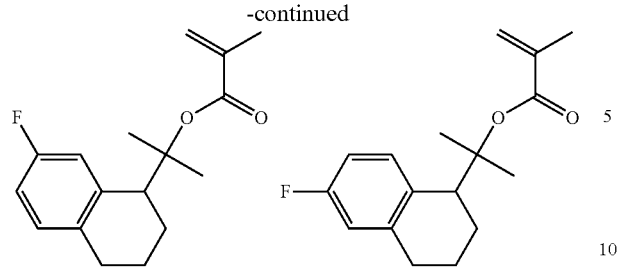
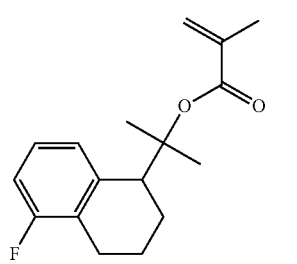
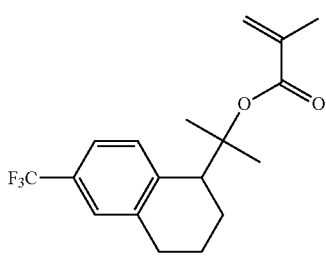
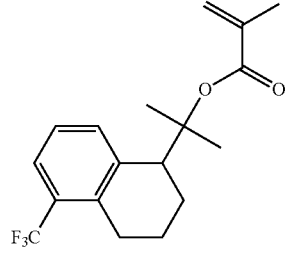
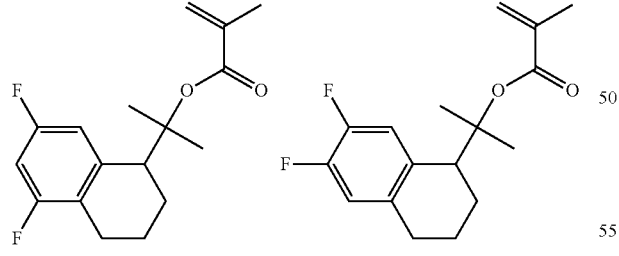
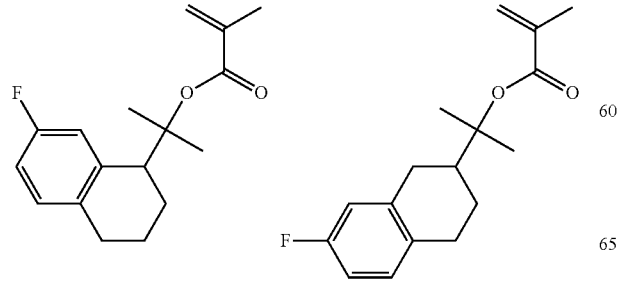
-continued
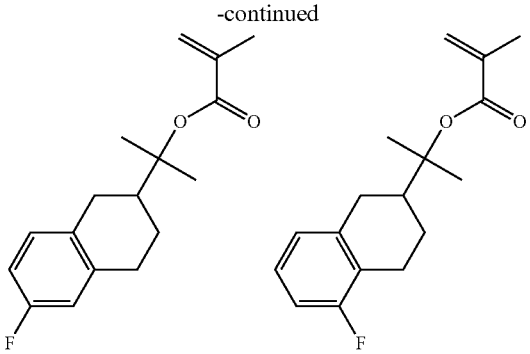
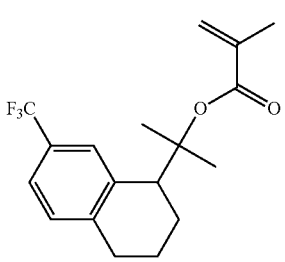
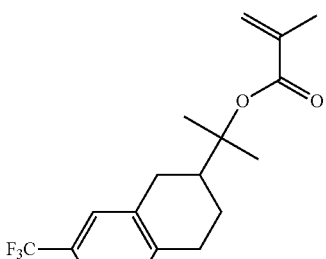
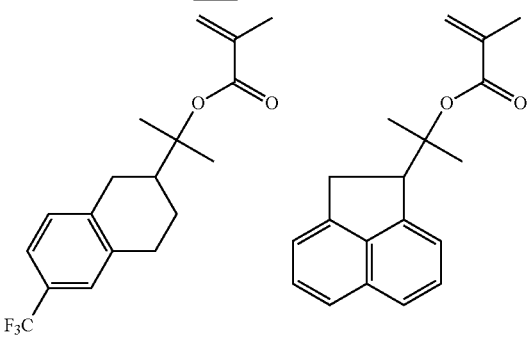
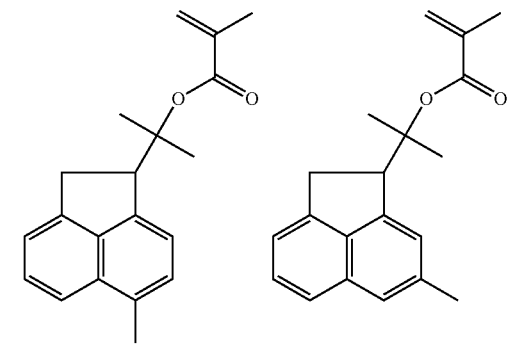

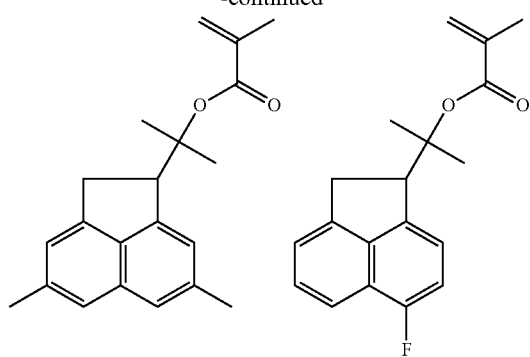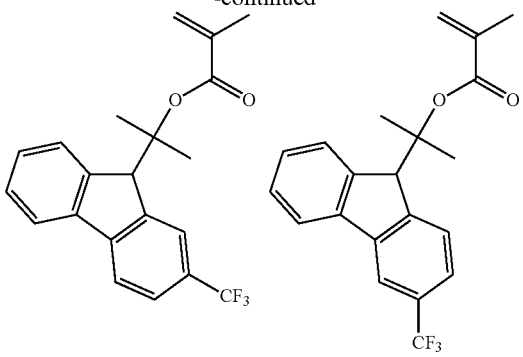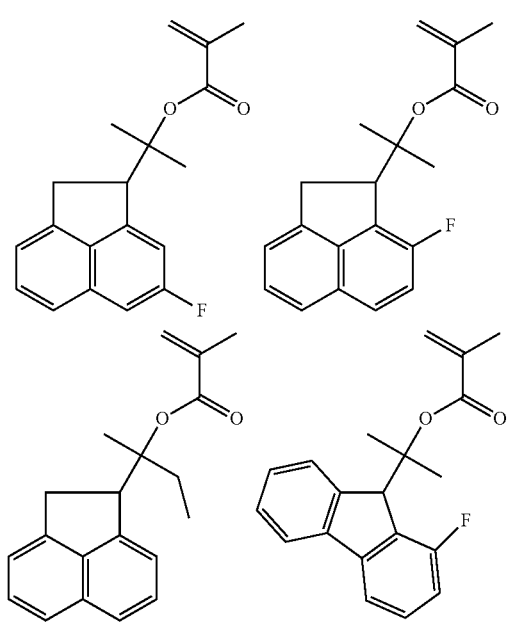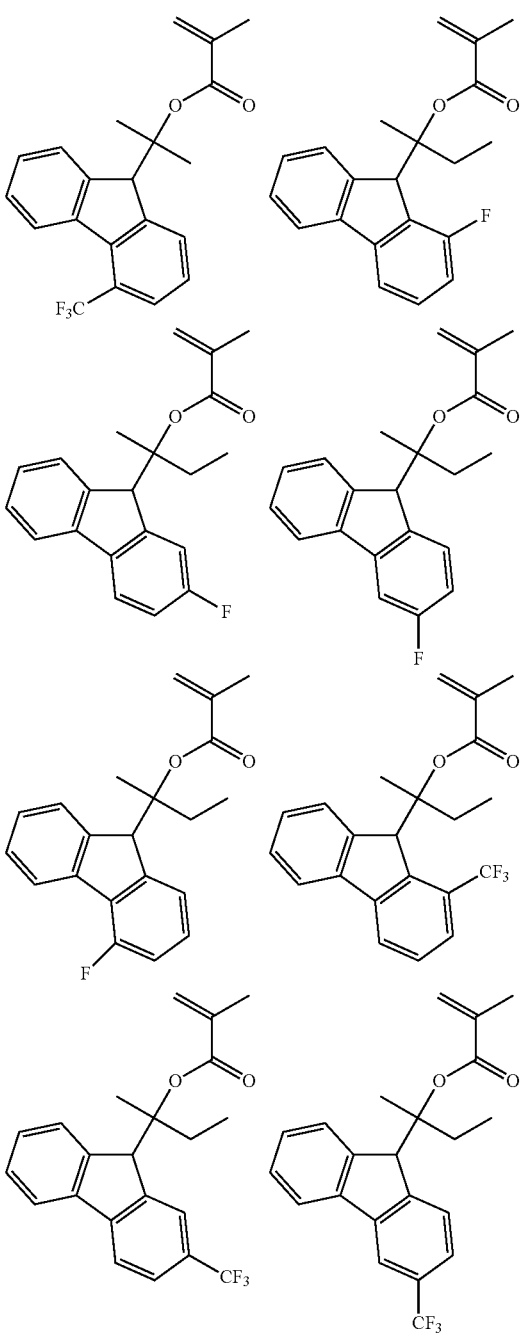

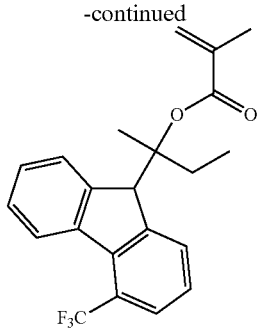

The polymerizable, acid-labile ester compounds from which recurring units (a1) are derived may be prepared, for example, by reaction of dimethylindane carbinol, methylethylindane carbinol, dimethyltetrahydronaphthalene carbinol, dimethylacenaphthene carbinol or dimethylfluorene carbinol with methacrylic acid chloride. The ester compounds from which recurring units (a2) and (a3) are derived may be similarly prepared.

In a preferred embodiment, the polymer having acid labile groups of formula (1), (2) or (3) is a copolymer comprising recurring units (a1), (a2) or (a3) of formula (4), selected from (meth)acrylates, styrenecarboxylic acid, and vinylnaphthalenecarboxylic acid, and recurring units (b) having an adhesive group selected from among hydroxyl, lactone, ether, ester, carbonyl, cyano, sulfonic acid ester, sulfonamide groups, cyclic —O—C(=O)—S— and —O—C(=O)—NH— groups. More preferably, the recurring units (b) are recurring units having a phenolic hydroxyl group because the group has a sensitizing effect in the EB and EUV lithography. The recurring units having a phenolic hydroxyl group are preferably selected from units (b1) to (b9) represented by the following general formula (3).

(5)

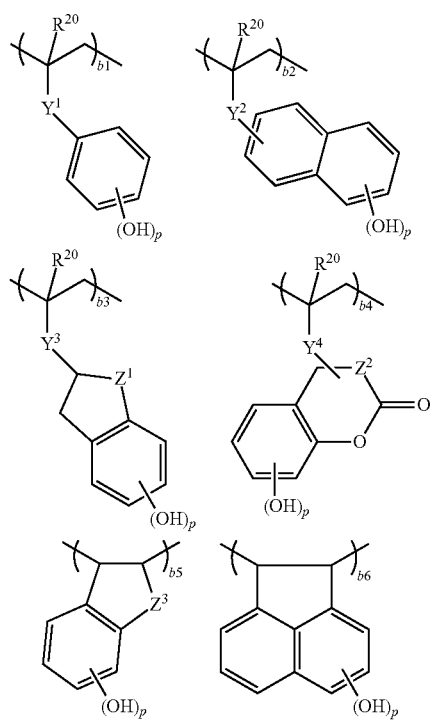

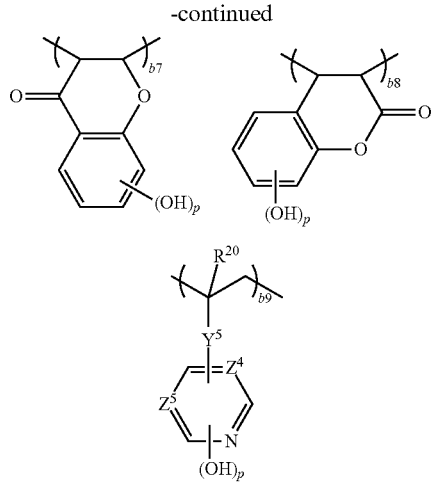

Herein $Y^1$, $Y^2$ and $Y^5$ each are a single bond or —C(=O)—O—$R^{21}$—, $Y^3$ and $Y^4$ each are —C(=O)—O—$R^{22}$—, $R^{21}$ and $R^{22}$ each are a single bond or a straight, branched or cyclic $C_1$-$C_{10}$ alkylene group which may contain an ether or ester radical, $R^{20}$ is each independently hydrogen or methyl, $Z^1$ and $Z^2$ each are methylene or ethylene, $Z^3$ is methylene, oxygen atom or sulfur atom, $Z^4$ and $Z^5$ each are CH or nitrogen atom, and p is 1 or 2.

Examples of suitable monomers from which the recurring units (b1) to (b9) having a phenolic hydroxyl group are derived are given below.

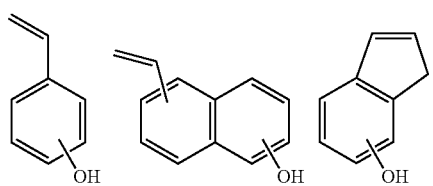

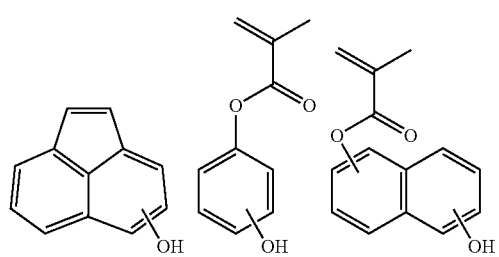

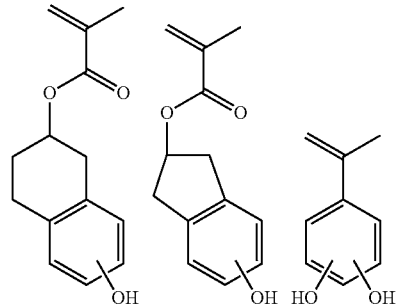

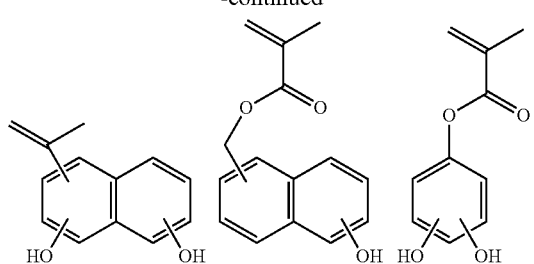
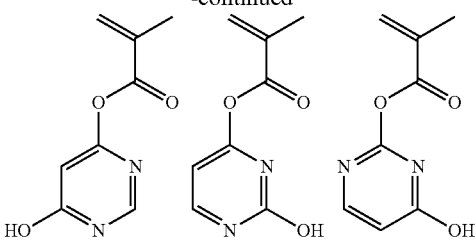

-continued
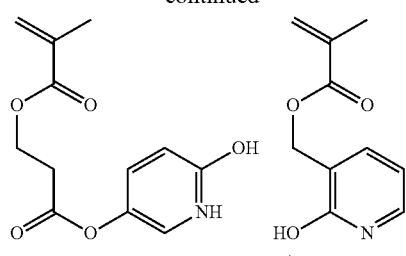
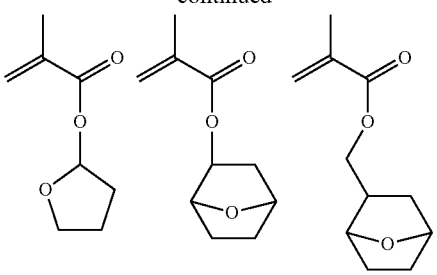
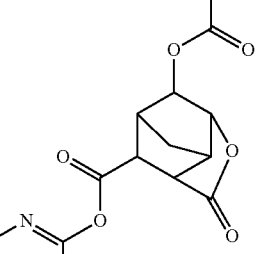
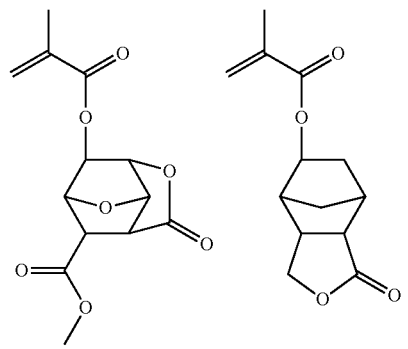
Examples of suitable monomers from which the recurring units (b) having an adhesive group selected from among non-phenolic hydroxyl group, lactone ring, ether group, ester group, carbonyl group, cyano group, sulfonic acid ester group, sulfonamide group, cyclic —O—C(=O)—S— and —O—C(=O)—NH— group are derived are given below.
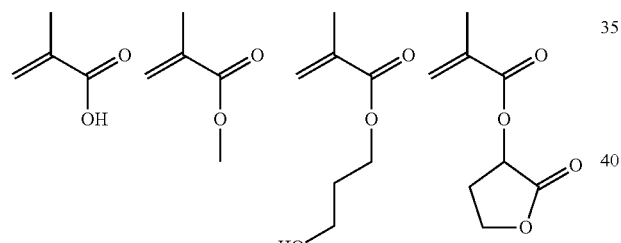
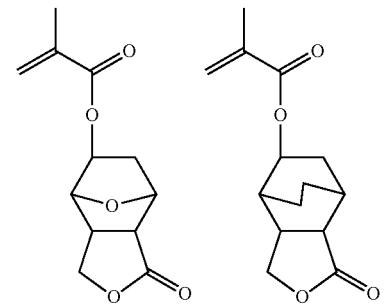
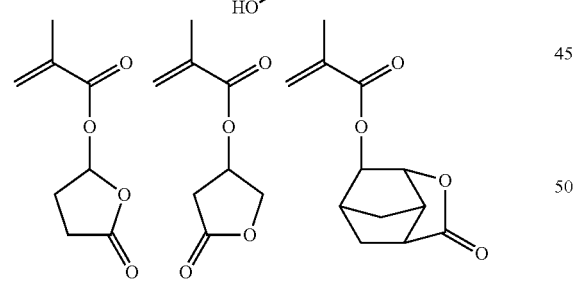
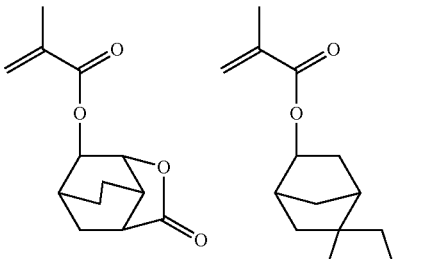
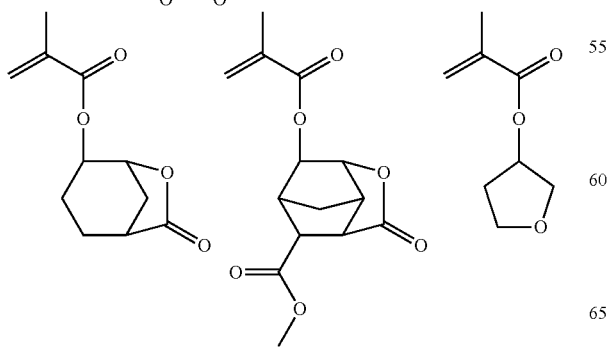
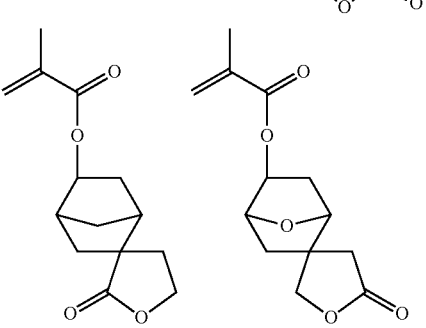

31
-continued
32
-continued
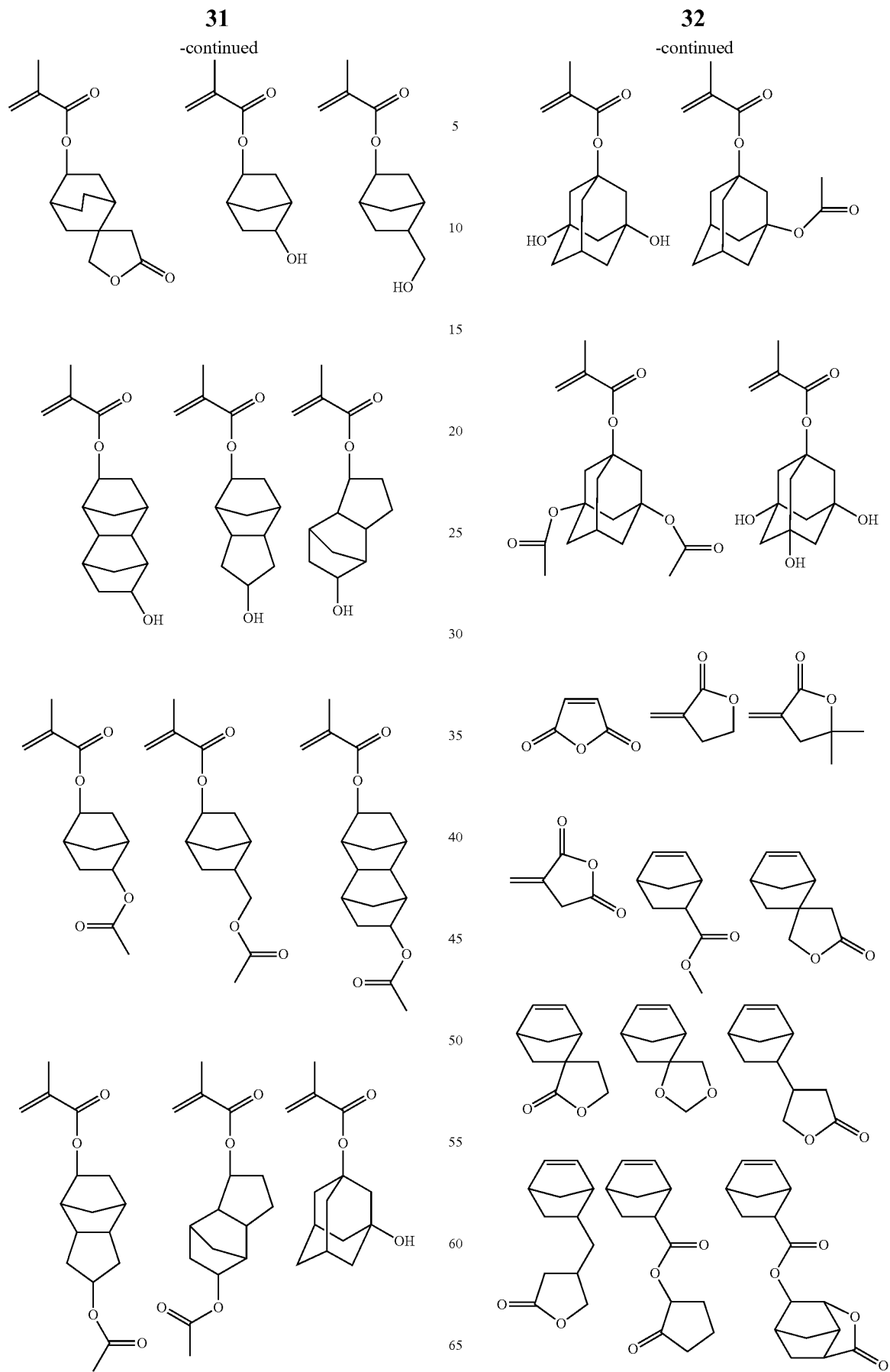

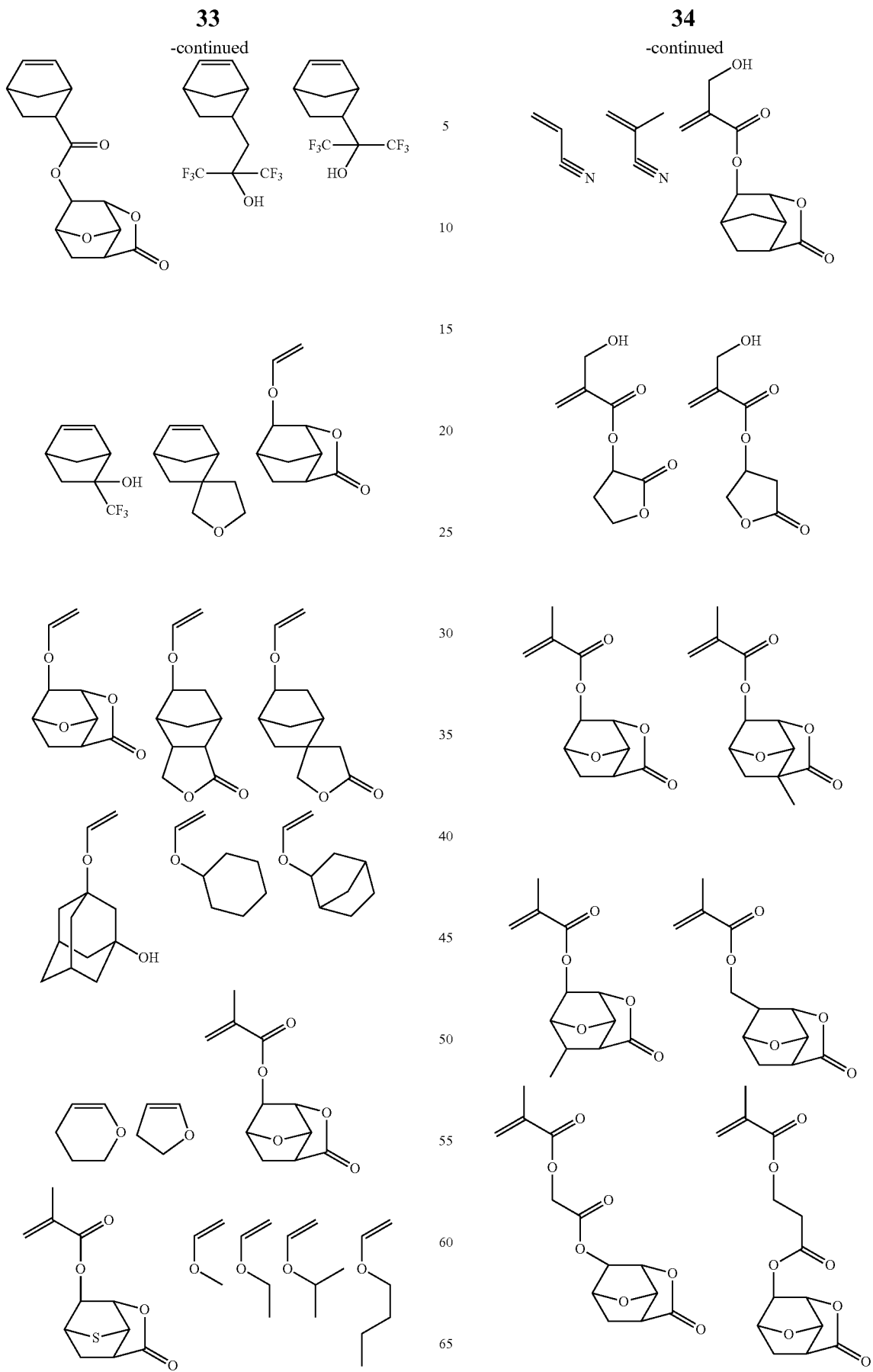

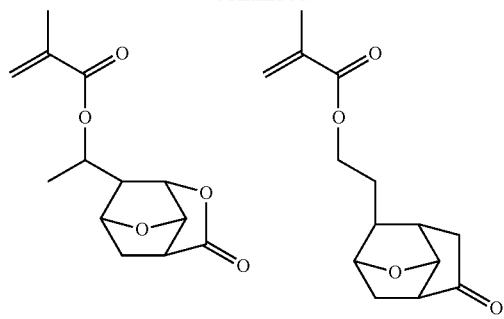
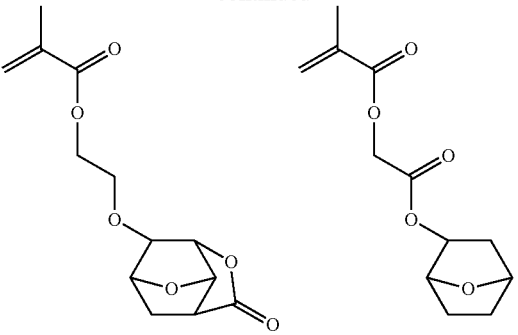
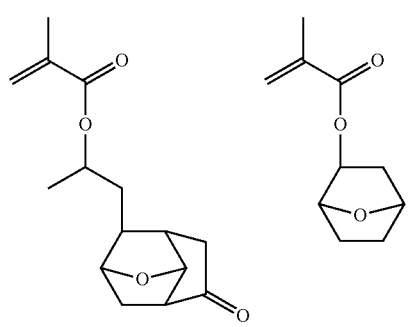
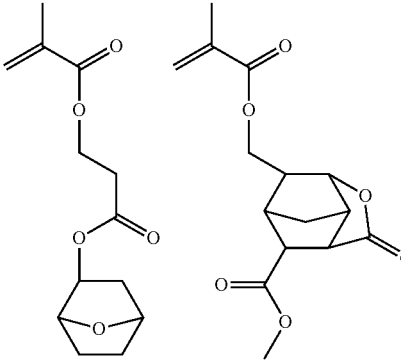
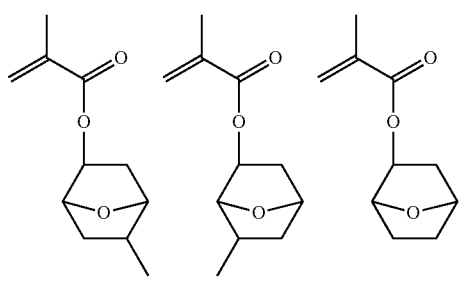
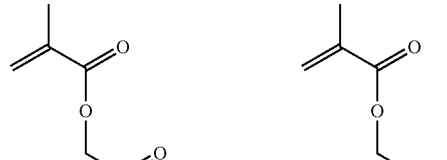
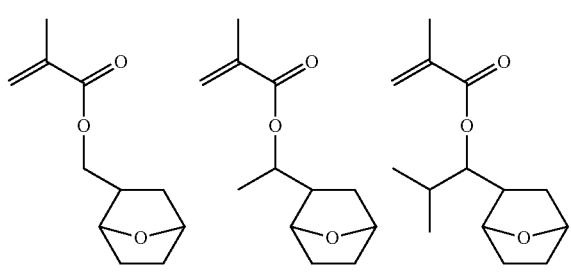
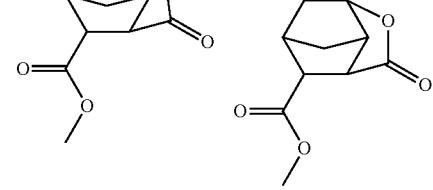
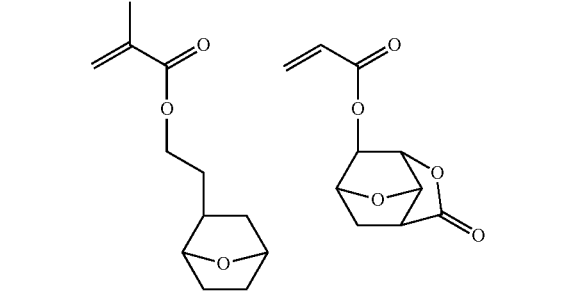
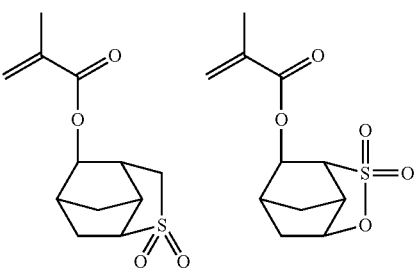

37
-continued
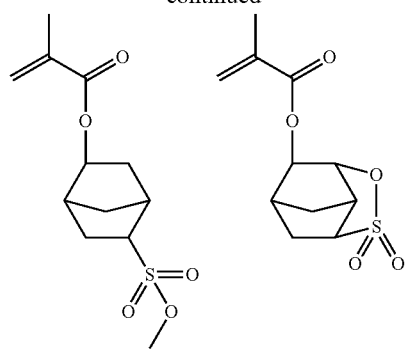
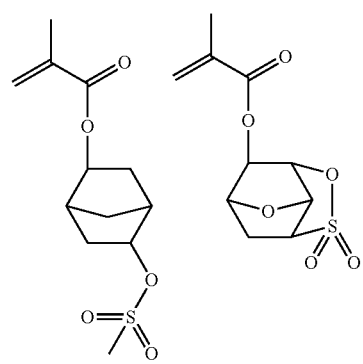
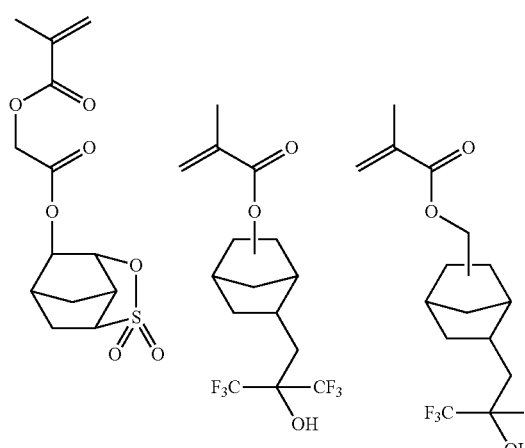
38
-continued
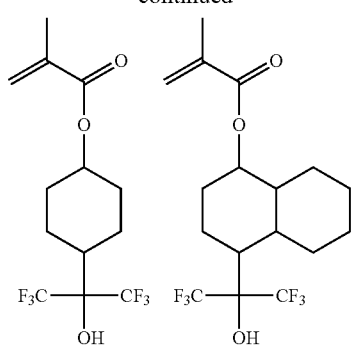
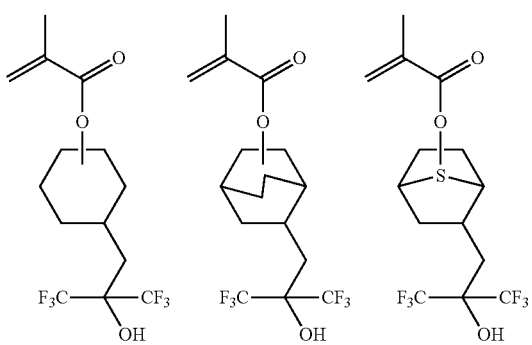
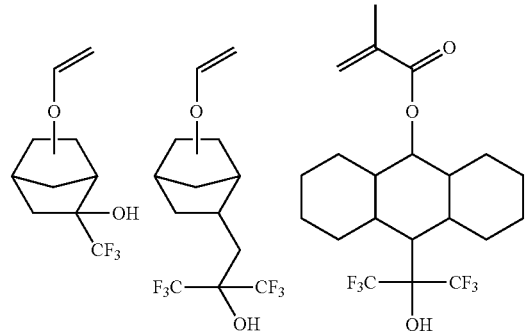
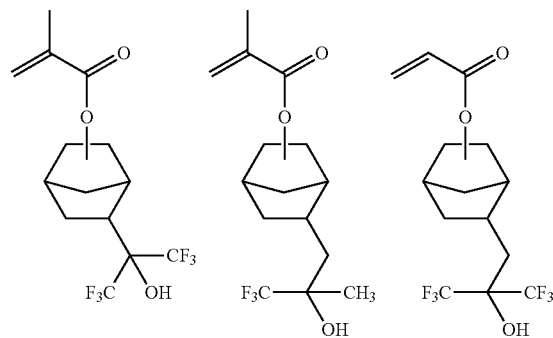
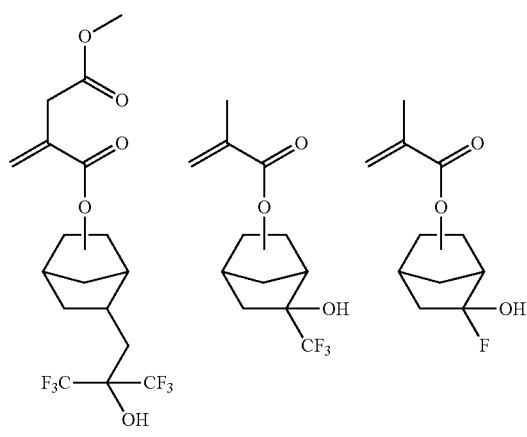

39
-continued
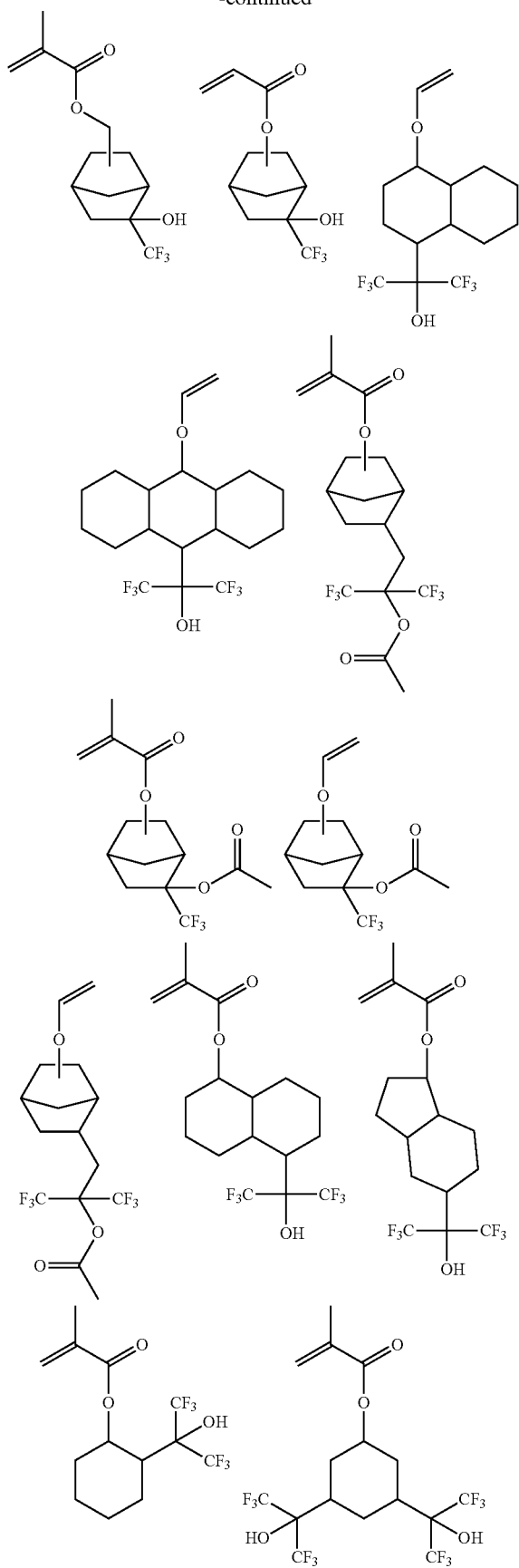
40
-continued
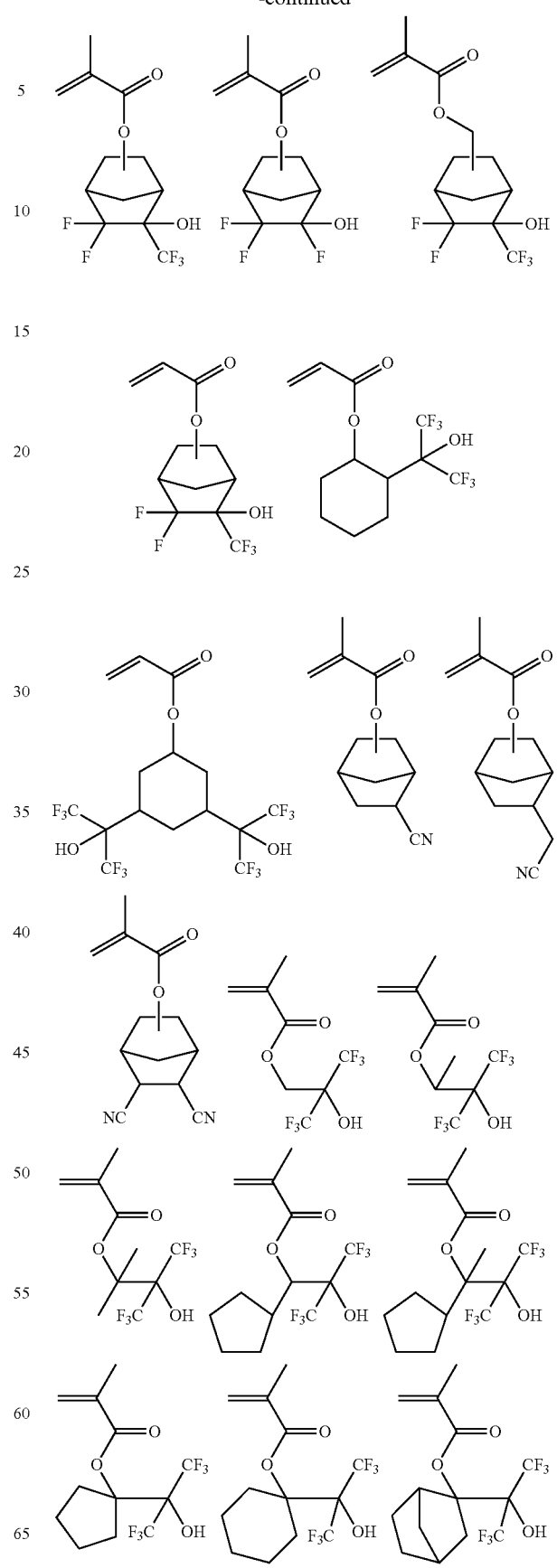

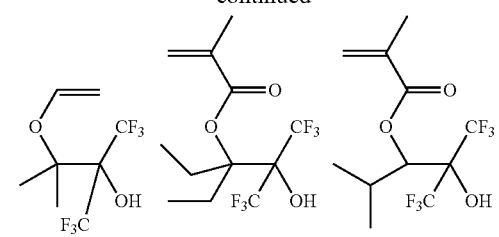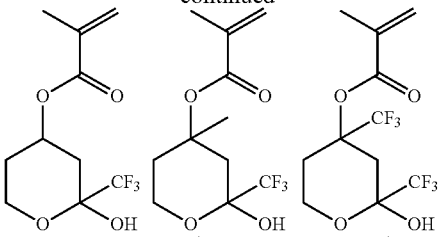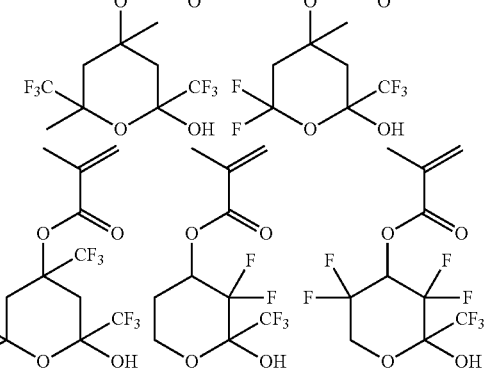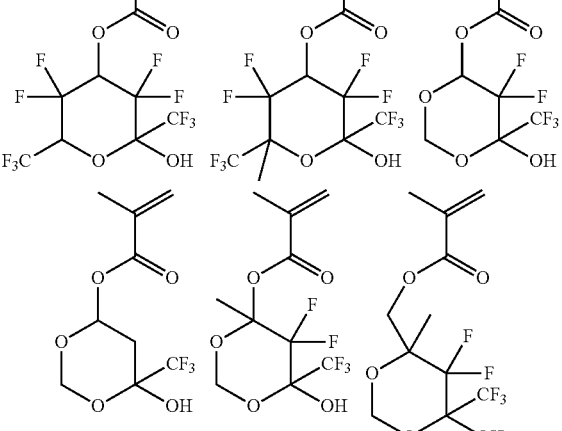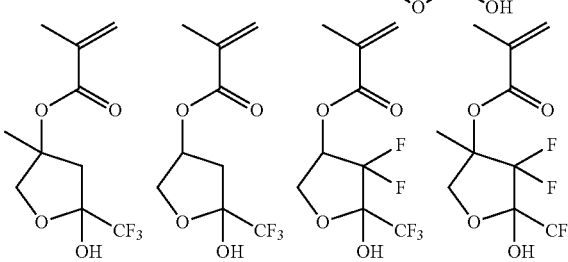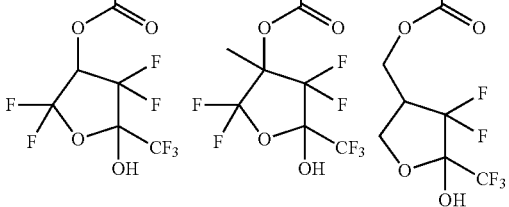

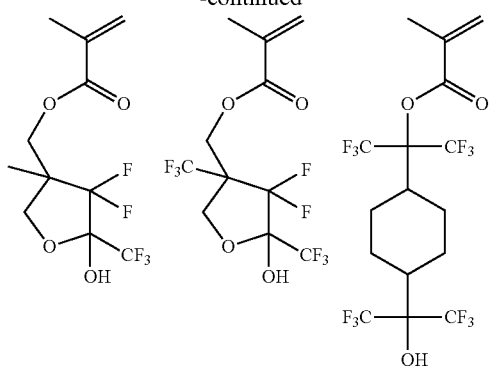
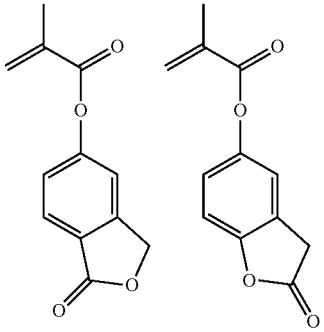
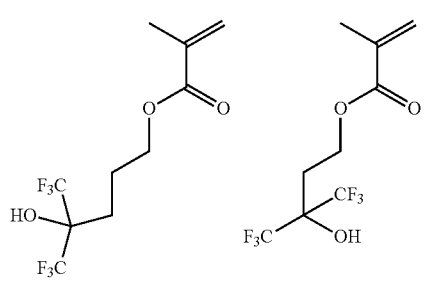
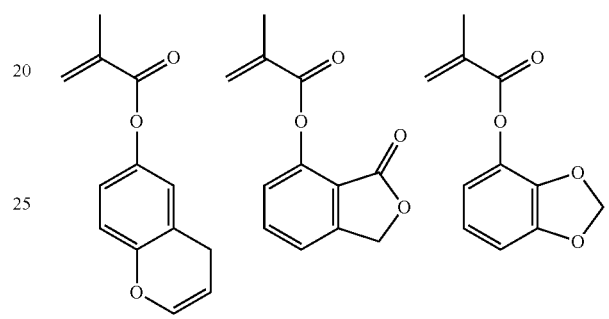
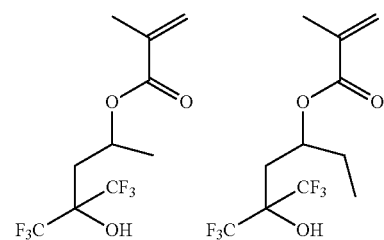
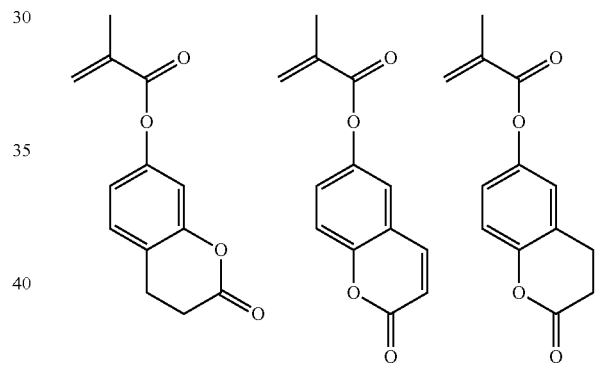
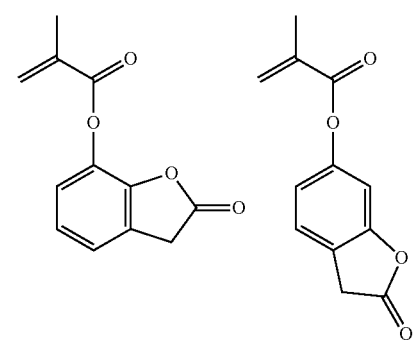
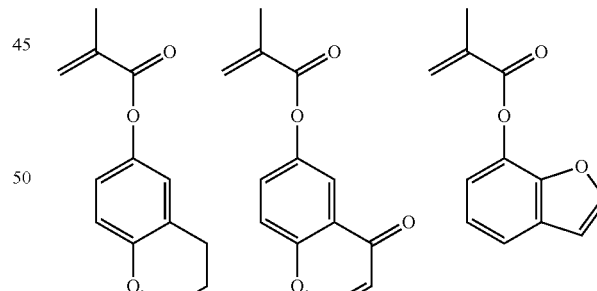
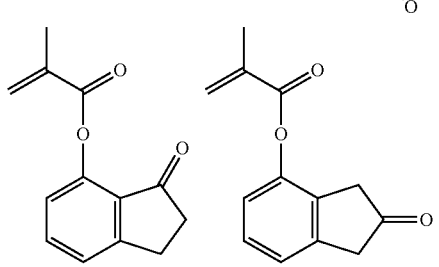
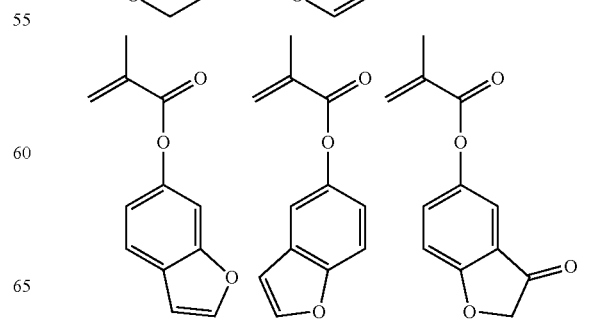

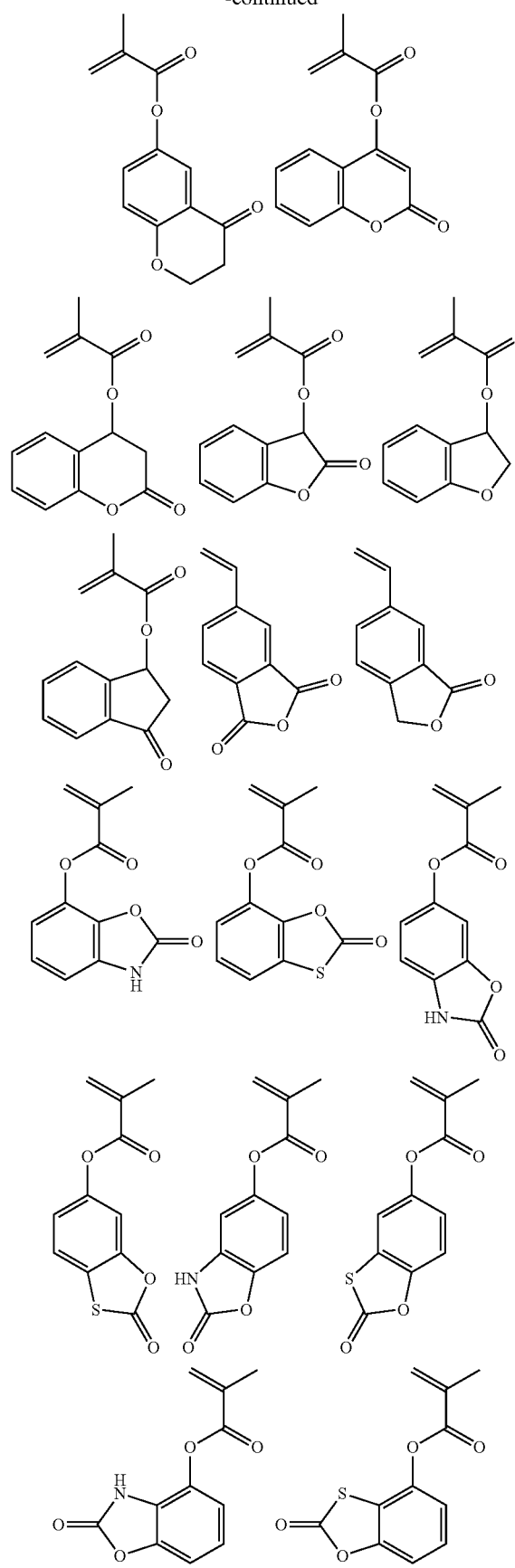
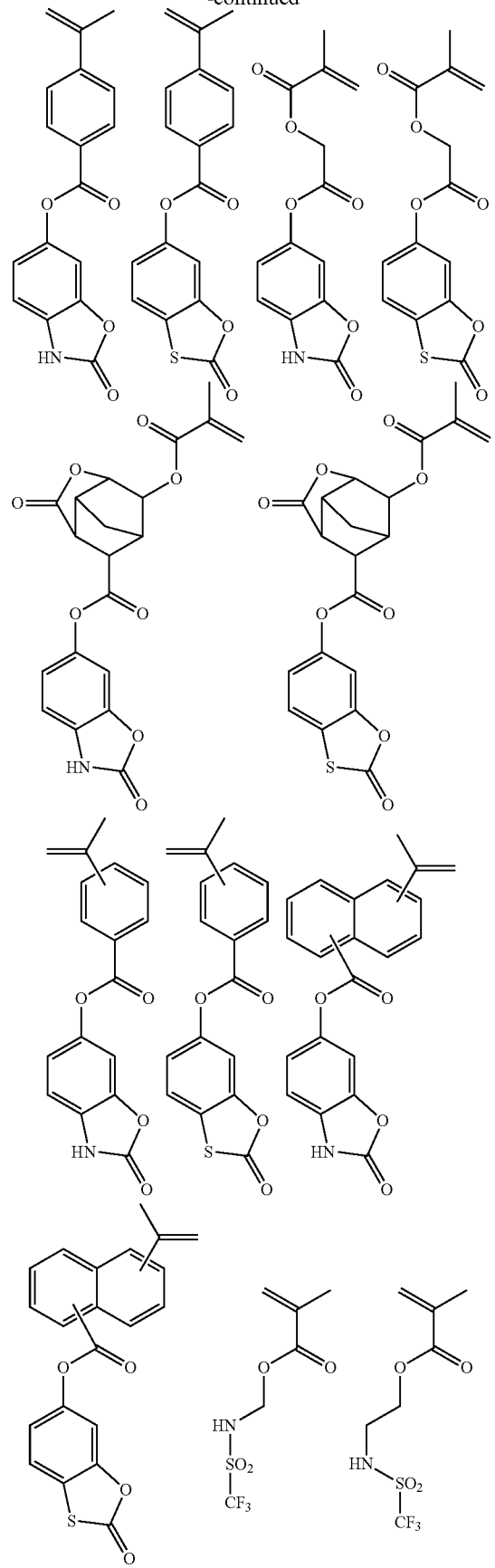

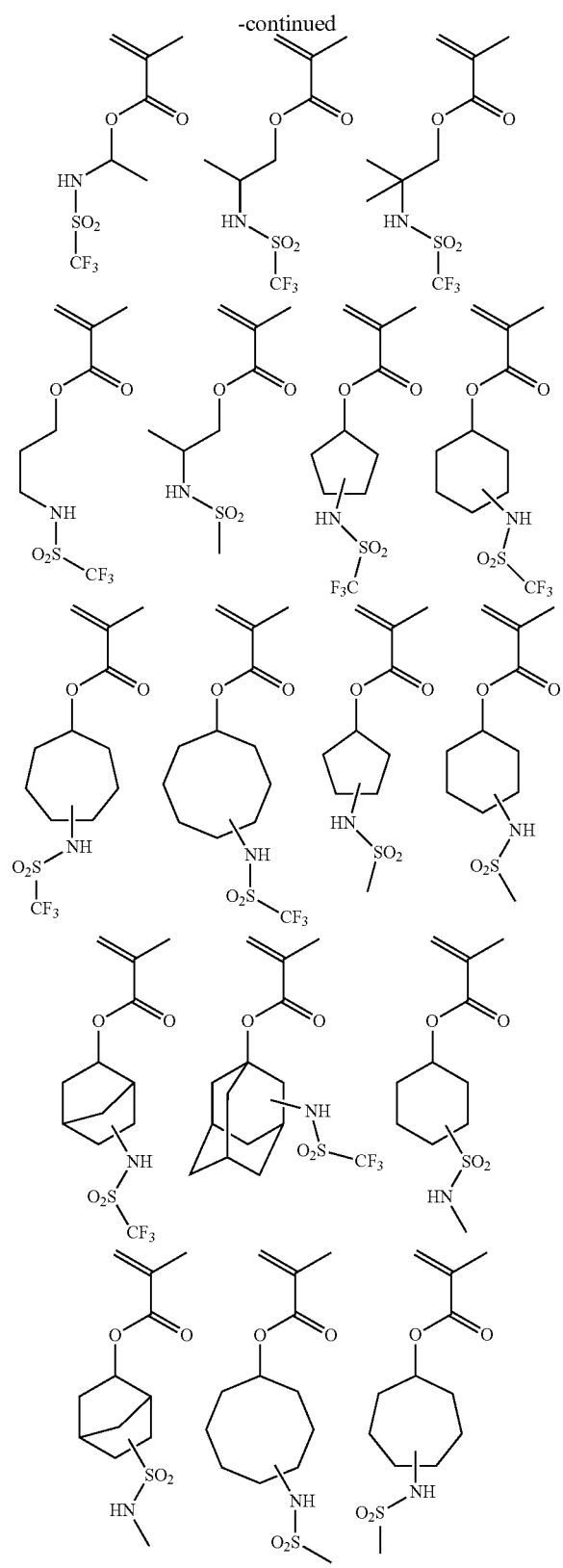

-continued deprotection with weak acid and water. Alternatively, the hydroxy group may be replaced by an acetyl, formyl, pivaloyl or similar group prior to polymerization, and the polymerization be followed by alkaline hydrolysis.

In a more preferred embodiment, the copolymer has further copolymerized therein recurring units (c) selected from units (c1) to (c5) of indene, acenaphthylene, chromone, coumarin, and norbornadiene, or derivatives thereof, represented by the following formula (6).

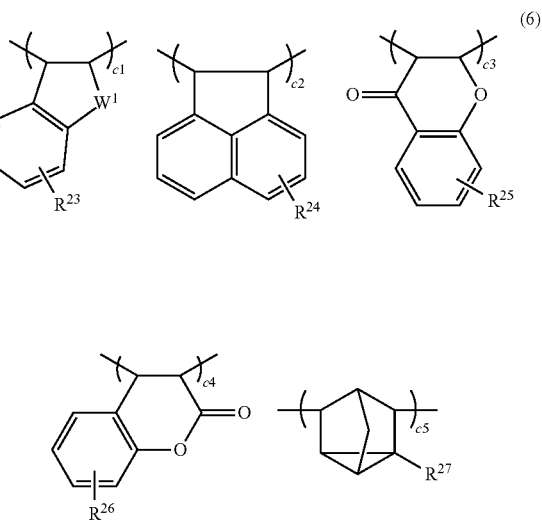

(6)

Herein $R^{23}$ to $R^{27}$ are each independently hydrogen, a $C_1$-$C_{30}$ alkyl, haloalkyl, alkoxy, alkanoyl or alkoxycarbonyl group, $C_6$-$C_{10}$ aryl group, halogen, or 1,1,1,3,3,3-hexafluoro-2-propanol group, and $W^1$ is methylene, oxygen or sulfur. As used herein, the term "haloalkyl" refers to alkyl in which some or all hydrogen atoms are substituted by halogen.

Examples of suitable monomers from which recurring units (c1) to (c5) of indene, acenaphthylene, chromone, coumarin, and norbornadiene derivatives are derived are given below.

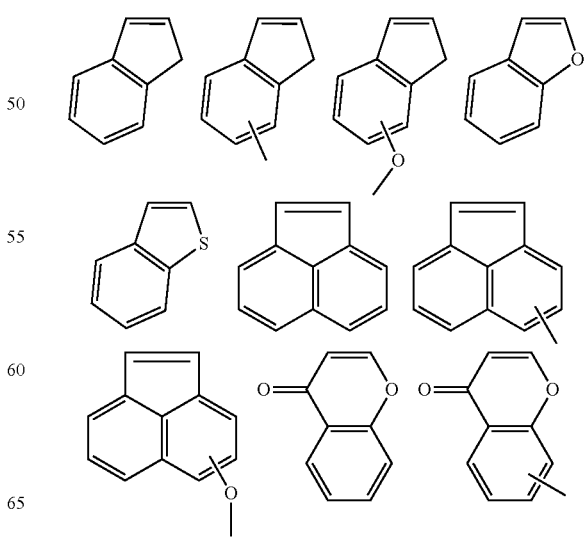

In the case of a monomer having a hydroxyl group, the hydroxyl group may be replaced by an acetal group susceptible to deprotection with acid, typically ethoxyethoxy, prior to polymerization, and the polymerization be followed by

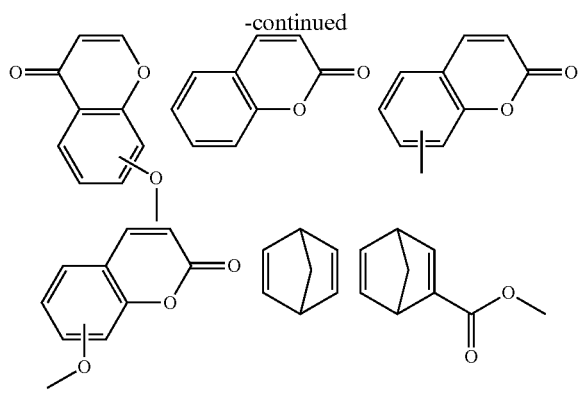

In a further embodiment, an acid generator (d) in the form of an onium salt having polymerizable olefin may be copolymerized with the foregoing monomers. JP-A H04-230645, JP-A 2005-084365, and JP-A 2006-045311 disclose sulfonium salts having polymerizable olefin capable of generating a specific sulfonic acid and similar iodonium salts. JP-A 2006-178317 discloses a sulfonium salt having sulfonic acid directly attached to the main chain.

In this embodiment, the copolymer may have further copolymerized therein recurring units (d1) to (d3) having a sulfonium salt, represented by the following formula (7).

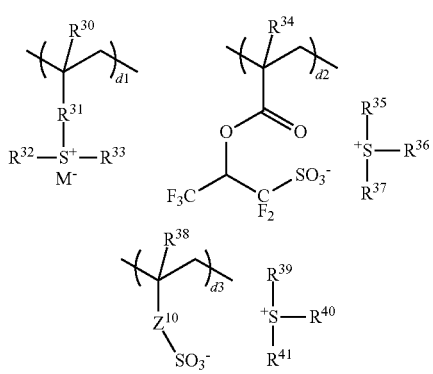

Herein $R^{30}$, $R^{34}$, and $R^{38}$ each are hydrogen or methyl. $R^{31}$ is a single bond, phenylene, —O—$R^{42}$—, or —C(=O)—$Y^{10}$—$R^{42}$—, wherein $Y^{10}$ is oxygen or NH, and $R^{42}$ is a straight, branched or cyclic $C_1$-$C_6$ alkylene group, alkenylene or phenylene group, which may contain a carbonyl (—CO—), ester (—COO—), ether (—O—) or hydroxyl radical. $R^{32}$, $R^{33}$, $R^{35}$, $R^{36}$, $R^{37}$, $R^{39}$, $R^{40}$, and $R^{41}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group. $Z^{10}$ is a single bond, methylene, ethylene, phenylene, fluorophenylene, —O—$R^{43}$—, or —C(=O)—$Z^{11}$—$R^{43}$—, wherein $Z^{11}$ is oxygen or NH, and $R^{43}$ is a straight, branched or cyclic $C_1$-$C_6$ alkylene group, alkenylene or phenylene group, which may contain a carbonyl, ester, ether or hydroxyl radical. $M^-$ is a non-nucleophilic counter ion. Molar fractions d1, d2 and d3 are in the range of $0 \leq d1 \leq 0.3$, $0 \leq d2 \leq 0.3$, $0 \leq d3 \leq 0.3$, and $0 \leq d (=d1+d2+d3) 0.3$.

Examples of the non-nucleophilic counter ion represented by $M^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; methidates such as tris(trifluoromethylsulfonyl)methide and tris(perfluoroethylsulfonyl)methide.

The attachment of an acid generator to the polymer main chain is effective in restraining acid diffusion, thereby preventing a reduction of resolution due to blur by acid diffusion. Also edge roughness (LER or LWR) is improved since the acid generator is uniformly dispersed.

While the polymer according to the invention comprises acid labile group-substituted recurring units (a) as essential units, it may have additionally copolymerized therein recurring units (e) of (meth)acrylate having substituted thereon an acid labile group $R^{17}$ and/or recurring units (f) of hydroxystyrene having substituted thereon an acid labile group $R^{19}$, as represented by the following general formula (9).

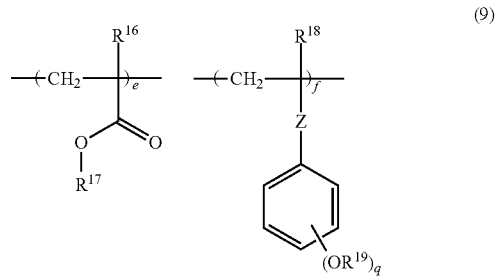

Herein $R^{16}$ and $R^{18}$ each are hydrogen or methyl, $R^{17}$ and $R^{19}$ each are an acid labile group other than formula (4), Z is a single bond, ester or amide group, and q is 1 or 2.

Besides the recurring units (a) to (f), additional recurring units (g) may be copolymerized in the polymer, which include recurring units derived from styrene, vinylnaphthalene, vinylanthracene, vinylpyrene, methyleneindane, and the like.

The acid labile groups represented by $R^{17}$ and $R^{19}$ in formula (9) may be selected from a variety of such groups. The acid labile groups may be the same or different and preferably include groups of the following formulae (A-1) to (A-3).

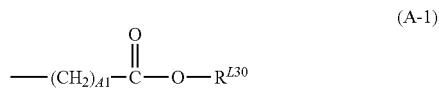

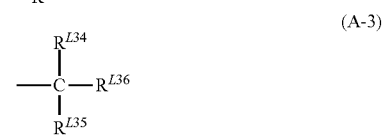

In formula (A-1), $R^{L30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter A1 is an integer of 0 to 6.

In formula (A-2), $R^{L31}$ and $R^{L32}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

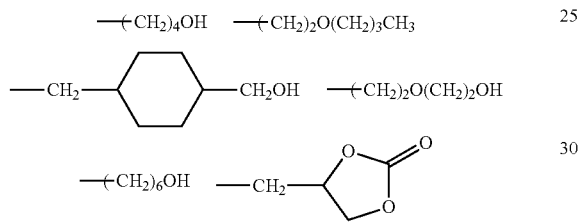

A pair of $R^{L31}$ and $R^{L32}$, $R^{L31}$ and $R^{L33}$, or $R^{L32}$ and $R^{L33}$ may bond together to form a ring with the carbon and oxygen atoms to which they are attached. Each of $R^{L31}$, $R^{L32}$ and $R^{L33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

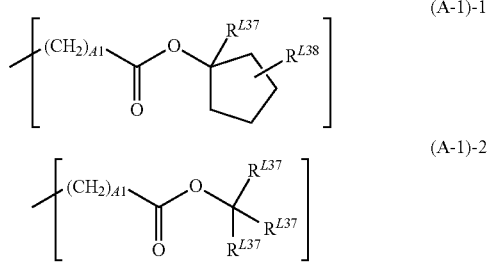

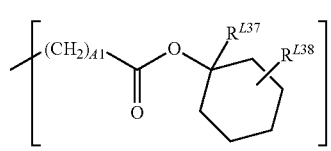

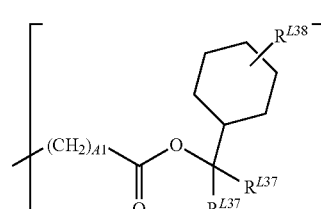

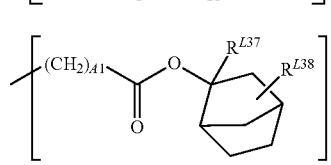

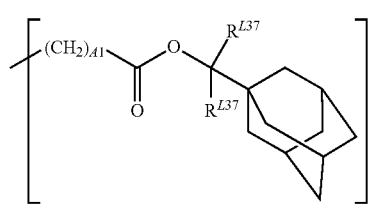

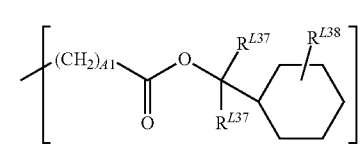

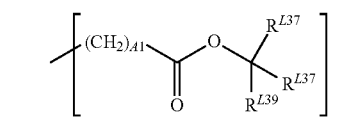

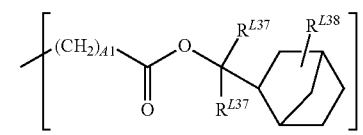

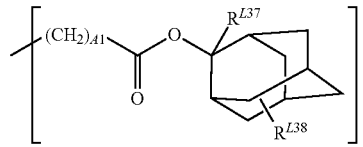

Herein $R^{L37}$ is each independently a straight, branched or cyclic $C_1$-$C_{10}$ alkyl group or $C_6$-$C_{20}$ aryl group. $R^{L38}$ is hydrogen or a straight, branched or cyclic $C_1$-$C_{10}$ alkyl group. $R^{L39}$ is each independently a straight, branched or cyclic $C_2$-$C_{10}$ alkyl group or $C_6$-$C_{20}$ aryl group. A1 is an integer of 0 to 6.

Of the acid labile groups of formula (A-2), the straight and branched ones are exemplified by the following groups having formulae (A-2)-1 to (A-2)-35.

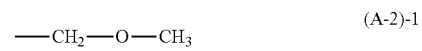

-continued
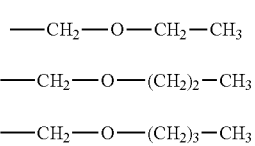 (A-2)-2
—CH₂—O—CH₂—CH₃ (A-2)-3
—CH₂—O—(CH₂)₂—CH₃ (A-2)-4
—CH₂—O—(CH₂)₃—CH₃ (A-2)-5
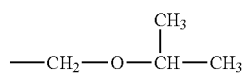 (A-2)-6
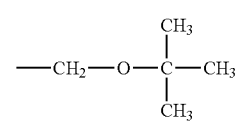 (A-2)-7
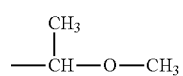 (A-2)-8
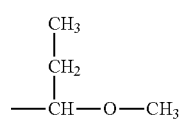 (A-2)-9
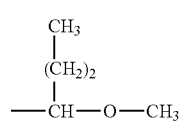 (A-2)-10
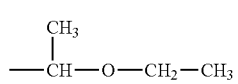 (A-2)-11
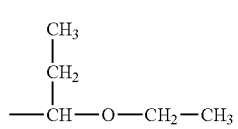 (A-2)-12
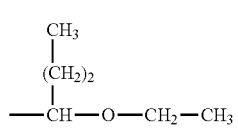 (A-2)-13
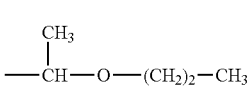 (A-2)-14
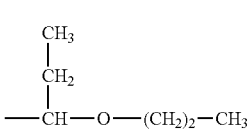 (A-2)-15
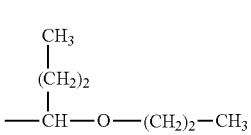 (A-2)-16
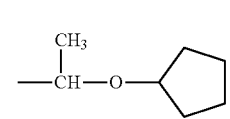 (A-2)-17
-continued
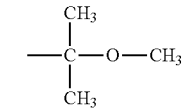 (A-2)-18
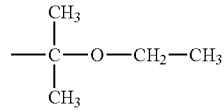 (A-2)-19
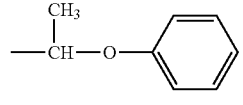 (A-2)-20
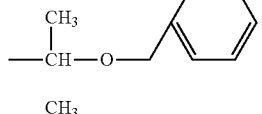 (A-2)-21
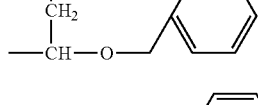 (A-2)-22
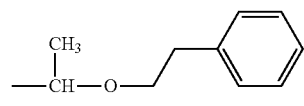 (A-2)-23
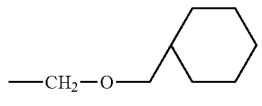 (A-2)-24
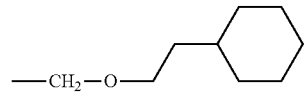 (A-2)-25
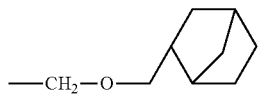 (A-2)-26
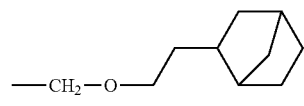 (A-2)-27
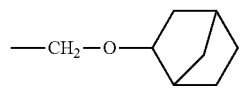 (A-2)-28
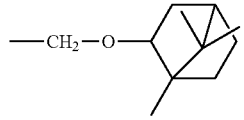 (A-2)-29
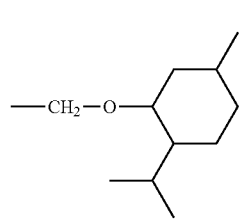 (A-2)-30

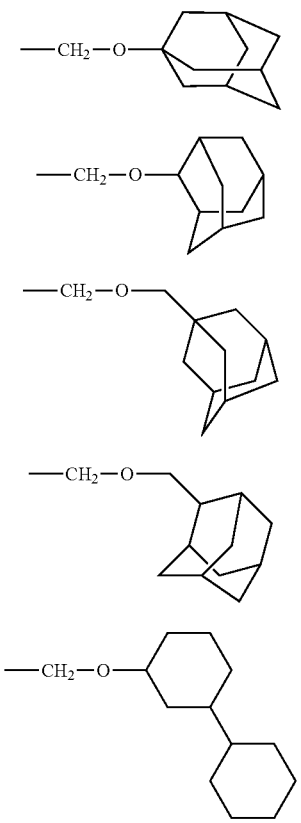

(A-2)-31

(A-2)-32

(A-2)-33

(A-2)-34

(A-2)-35

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the polymer may be crosslinked within the molecule or between molecules with these acid labile groups.

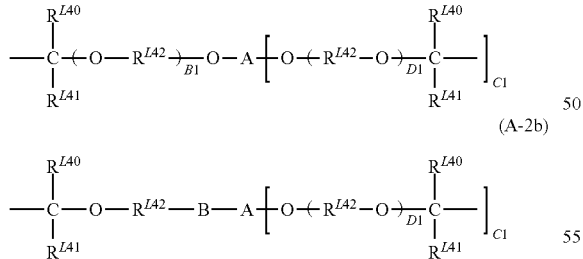

Herein $R^{L40}$ and $R^{L41}$ each are hydrogen or a straight, branched or cyclic $C_1$-$C_8$ alkyl group, or $R^{L40}$ and $R^{L41}$, taken together, may form a ring with the carbon atom to which they are attached, and $R^{L40}$ and $R^{L41}$ are straight or branched $C_1$-$C_8$ alkylene groups when they form a ring. $R^{L42}$ is a straight, branched or cyclic $C_1$-$C_{10}$ alkylene group. Each of B1 and D1 is 0 or an integer of 1 to 10, preferably 0 or an integer of 1 to 5, and C1 is an integer of 1 to 7. "A" is a (C1+1)-valent aliphatic or alicyclic saturated hydrocarbon group, aromatic hydrocarbon group or heterocyclic group having 1 to 50 carbon atoms, which may be separated by a heteroatom or in which some hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may contain a heteroatom or in which some hydrogen atoms attached to carbon atoms may be substituted by hydroxyl, carboxyl, acyl groups or halogen atoms. The subscript C1 is preferably an integer of 1 to 3.

The crosslinking acetal groups of formulae (A-2a) and (A-2b) are exemplified by the following formulae (A-2)-36 through (A-2)-43.

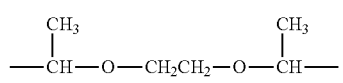

(A-2)-36

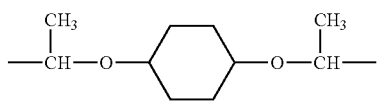

(A-2)-37

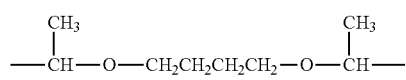

(A-2)-38

(A-2)-39

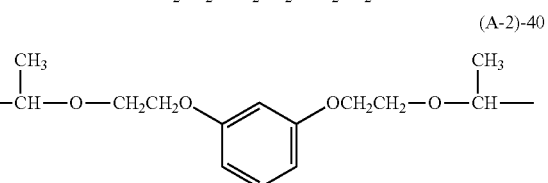

(A-2)-40

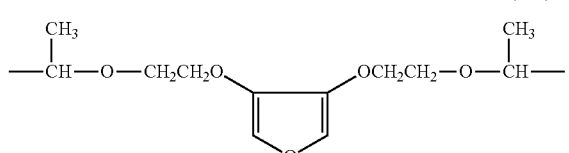

(A-2)-41

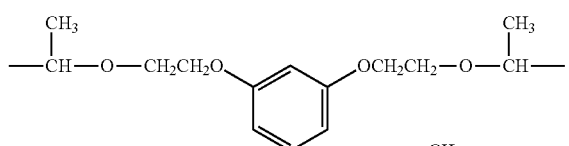

(A-2)-42

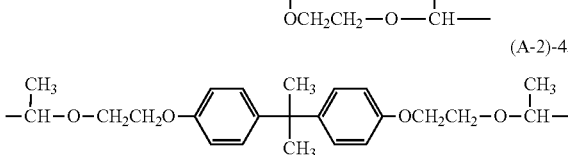

(A-2)-43

In formula (A-3), $R^{L34}$, $R^{L35}$ and $R^{L36}$ each are a monovalent hydrocarbon group, typically a straight, branched or cyclic $C_1$-$C_{20}$ alkyl group, which may contain a heteroatom such as oxygen, sulfur, nitrogen or fluorine. A pair of $R^{L34}$ and $R^{L35}$, $R^{L34}$ and $R^{L36}$, or $R^{L35}$ and $R^{L36}$ may bond together to form a $C_3$-$C_{20}$ ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.

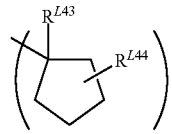 (A-3)-1

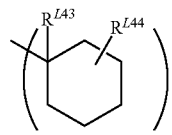 (A-3)-2

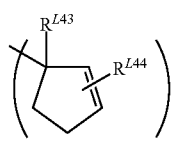 (A-3)-3

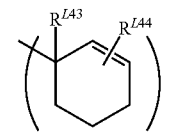 (A-3)-4

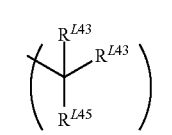 (A-3)-5

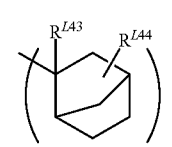 (A-3)-6

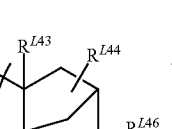 (A-3)-7

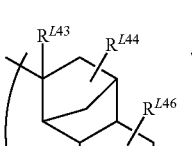 (A-3)-8

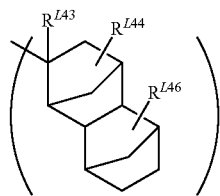 (A-3)-9

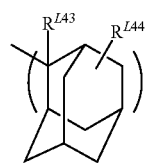 (A-3)-10

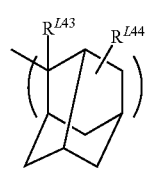 (A-3)-11

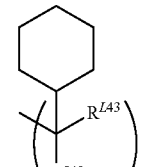 (A-3)-12

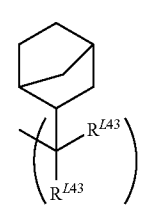 (A-3)-13

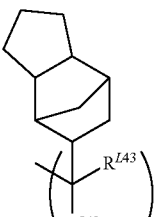 (A-3)-14

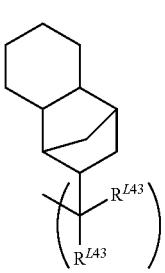 (A-3)-15

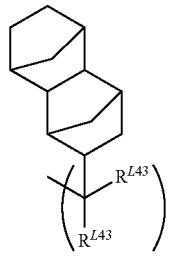
(A-3)-16

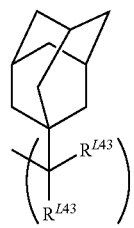
(A-3)-17

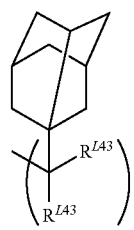
(A-3)-18

Herein $R^{L43}$ is each independently a straight, branched or cyclic $C_1$-$C_8$ alkyl group or $C_6$-$C_{20}$ aryl group, typically phenyl or naphthyl, $R^{L44}$ and $R^{L46}$ each are hydrogen or a straight, branched or cyclic $C_1$-$C_{20}$ alkyl group, and $R^{L45}$ is a $C_6$-$C_{20}$ aryl group, typically phenyl.

The polymer may be crosslinked within the molecule or between molecules with groups having $R^{L47}$ which is a di- or multi-valent alkylene or arylene group, as shown by the following formulae (A-3)-19 and (A-3)-20.

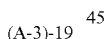
(A-3)-19

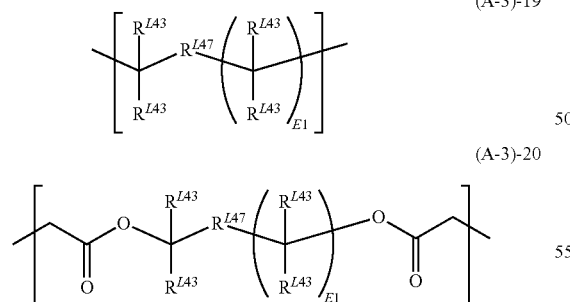
(A-3)-20

Herein $R^{L43}$ is as defined above, $R^{L47}$ is a straight, branched or cyclic $C_1$-$C_{20}$ alkylene group or arylene group, typically phenylene, which may contain a heteroatom such as oxygen, sulfur or nitrogen, and E1 is an integer of 1 to 3.

Of recurring units having acid labile groups of formula (A-3), recurring units of (meth)acrylate having an exo-form structure represented by the formula (A-3)-21 are preferred.

(A-3)-21

Herein, $R^{14}$ is as defined above; $R^{c3}$ is a straight, branched or cyclic $C_1$-$C_8$ alkyl group or an optionally substituted $C_6$-$C_{20}$ aryl group; $R^{c4}$ to $R^{c9}$, $R^{c12}$ and $R^{c13}$ are each independently hydrogen or a monovalent $C_1$-$C_{15}$ hydrocarbon group which may contain a heteroatom; and $R^{c10}$ and $R^{c11}$ are hydrogen or a monovalent $C_1$-$C_{15}$ hydrocarbon group which may contain a heteroatom. Alternatively, a pair of $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{13}$, $R^{c8}$ and $R^{c12}$, $R^{c10}$ and $R^{11}$, or $R^{c11}$ and $R^{c12}$, taken together, may form a ring, and in that event, each ring-forming R is a divalent $C_1$-$C_{15}$ hydrocarbon group which may contain a heteroatom. Also, a pair of $R^{c4}$ and $R^{c13}$, $R^{c10}$ and $R^{13}$, or $R^{c6}$ and $R^{c8}$ which are attached to vicinal carbon atoms may bond together directly to form a double bond. The formula also represents an enantiomer.

The ester form monomers from which recurring units having an exo-form structure represented by formula (A-3)-21 are derived are described in U.S. Pat. No. 6,448,420 (JP-A 2000-327633). Illustrative non-limiting examples of suitable monomers are given below.

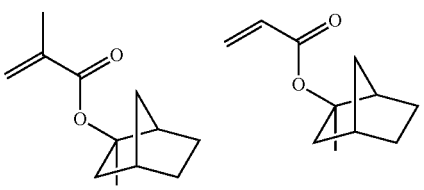

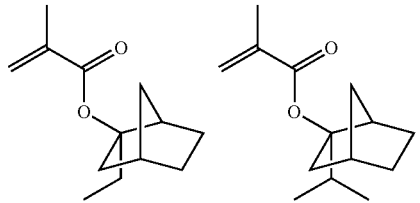

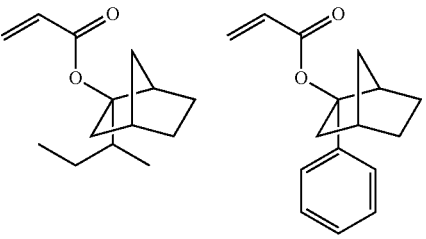

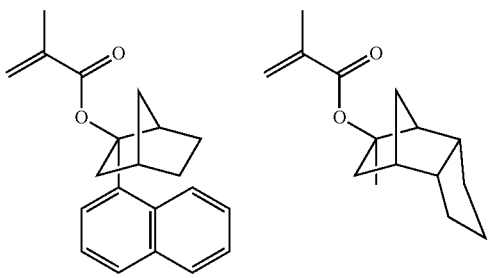
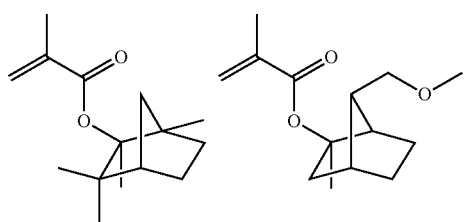
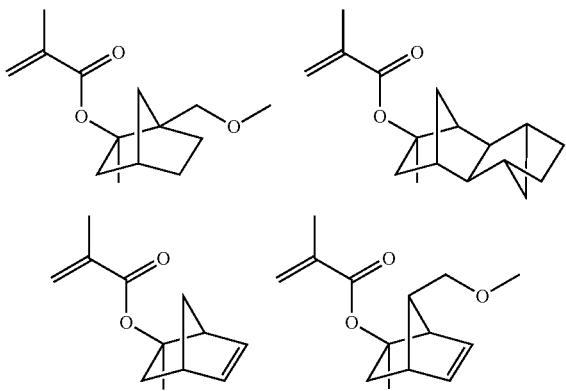
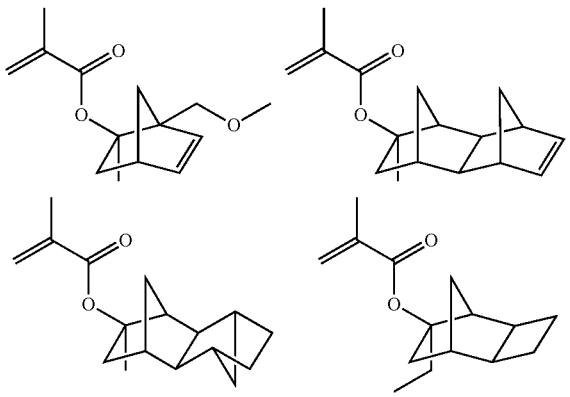
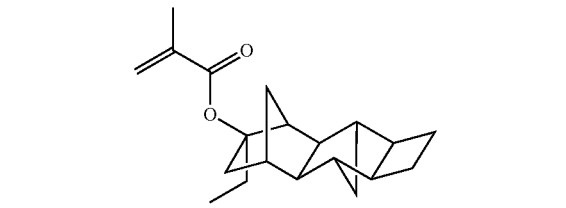

Also included in the acid labile groups of formula (A-3) are acid labile groups of (meth)acrylate having furandiyl, tetrahydrofurandiyl or oxanorbornanediyl as represented by the following formula (A-3)-22.

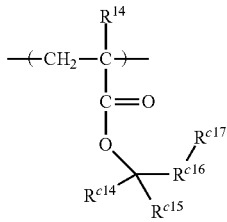

(A-3)-22

Herein, $R^{14}$ is as defined above; $R^{c14}$ and $R^{c15}$ are each independently a monovalent, straight, branched or cyclic $C_1$-$C_{10}$ hydrocarbon group, or $R^{c14}$ and $R^{c15}$, taken together, may form an aliphatic hydrocarbon ring with the carbon atom to which they are attached. $R^{c16}$ is a divalent group selected from furandiyl, tetrahydrofurandiyl and oxanorbornanediyl. $R^{c17}$ is hydrogen or a monovalent, straight, branched or cyclic $C_1$-$C_{10}$ hydrocarbon group which may contain a heteroatom.

Examples of the monomers from which the recurring units substituted with acid labile groups having furandiyl, tetrahydrofurandiyl and oxanorbornanediyl are derived are shown below. Note that Me is methyl and Ac is acetyl.

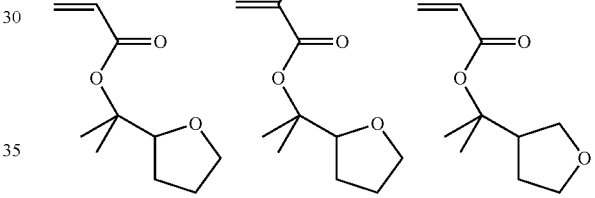
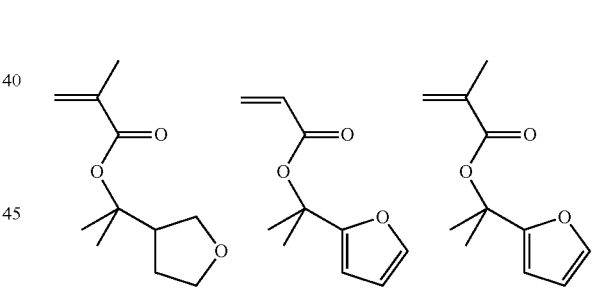
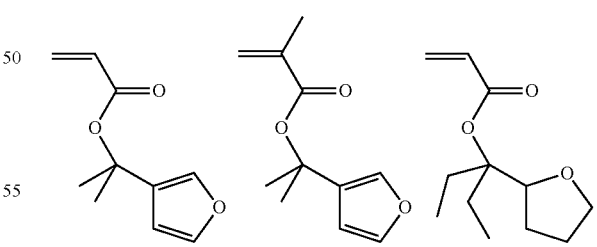
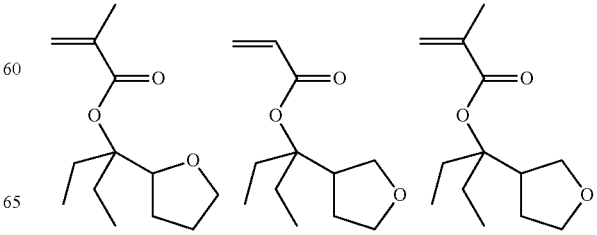

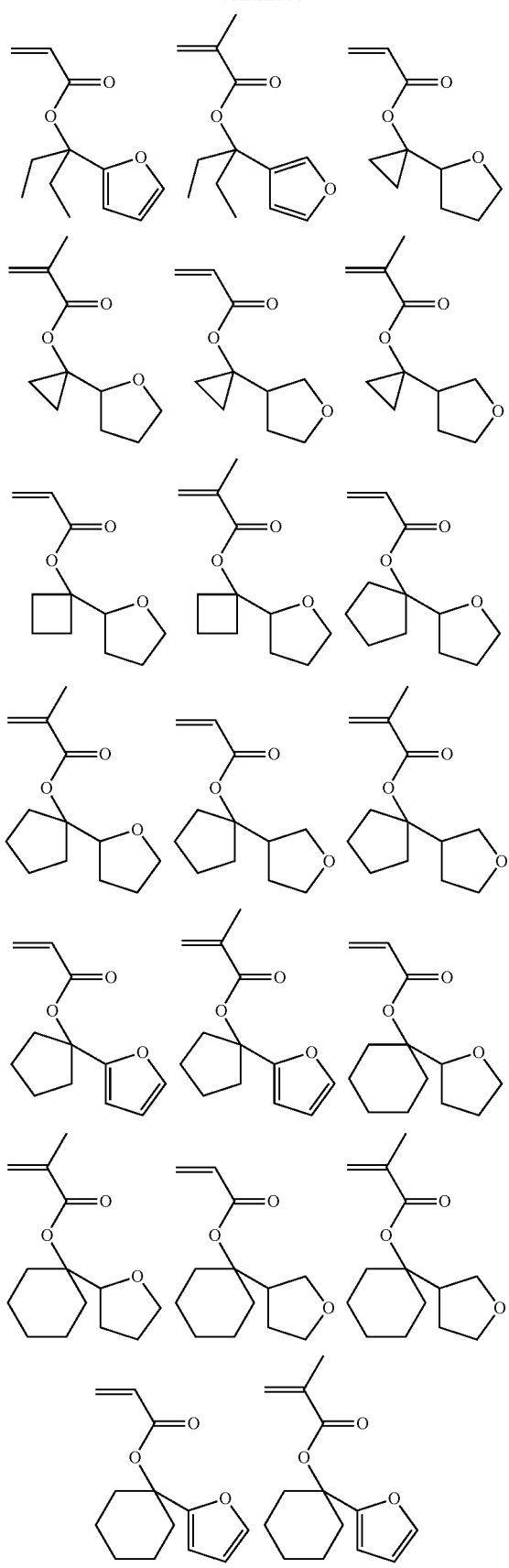
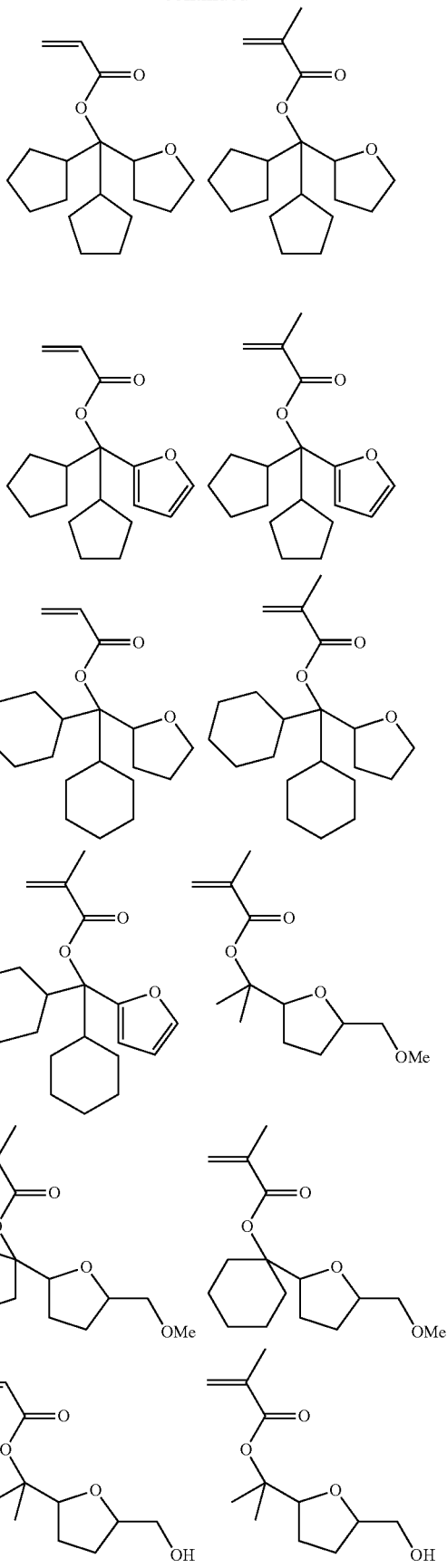

-continued
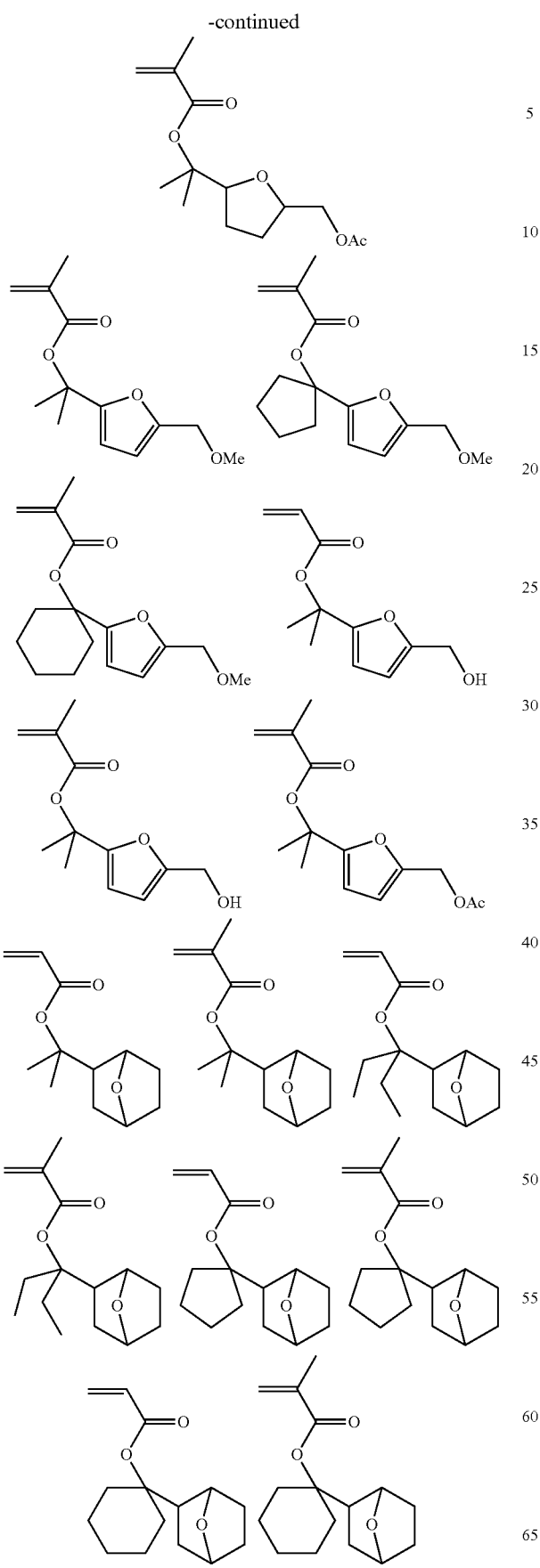
-continued
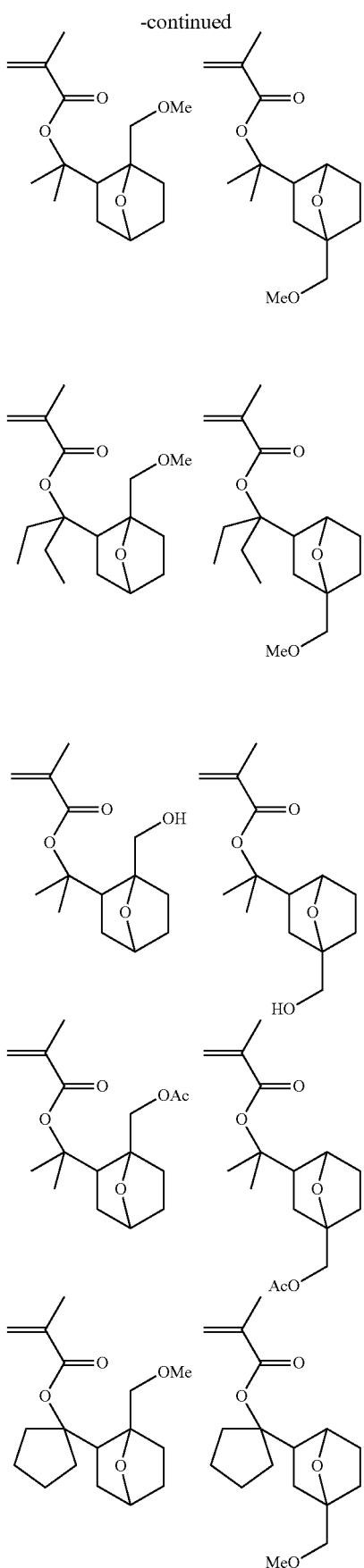

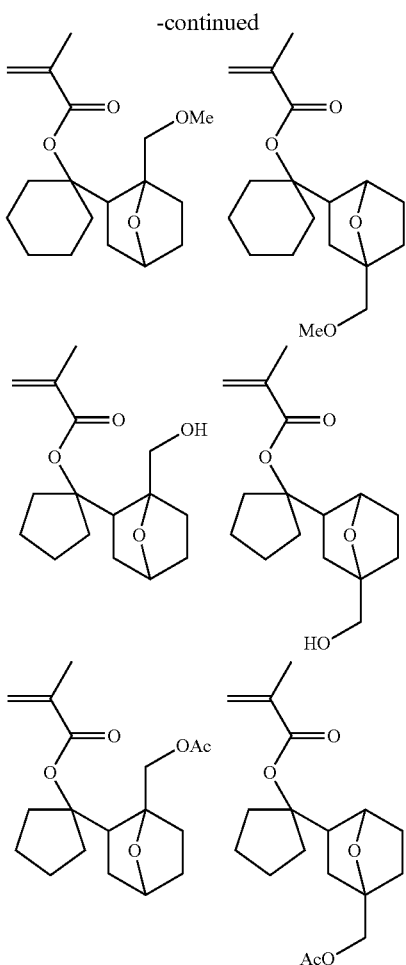

The polymer used herein may be synthesized by any desired methods, for example, by dissolving one or more monomers selected from the monomers to form the recurring units (a) to (g) in an organic solvent, adding a radical polymerization initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis as mentioned above, for thereby converting the polymer product to polyhydroxystyrene or hydroxypolyvinylnaphthalene. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

In the copolymer, recurring units (a) to (g) may be incorporated in the following molar fraction:

$0 \leq a1 < 1.0$, $0 \leq a2 < 1.0$, $0 \leq a3 < 1.0$, and $0 < a1+a2+a3 < 1.0$, preferably $0 \leq a1 \leq 0.9$, $0 \leq a2 \leq 0.9$, $0 \leq a3 \leq 0.9$, and $0.1 \leq a1+a2+a3 \leq 0.9$, and more preferably $0 \leq a1 \leq 0.8$, $0 \leq a2 \leq 0.8$, $0 \leq a3 \leq 0.8$, and $0.2 \leq a1+a2+a3 \leq 0.8$;

$0 < b < 1.0$, preferably $0.1 \leq b \leq 0.9$, and more preferably $0.2 \leq b \leq 0.8$;

$0 \leq c < 1.0$, preferably $0 \leq c \leq 0.9$, and more preferably $0 \leq c \leq 0.8$;

$0 \leq d \leq 0.3$, preferably $0 \leq d \leq 0.2$, and more preferably $0 \leq d \leq 0.15$;

$0 \leq e \leq 0.5$, preferably $0 \leq e \leq 0.4$, and more preferably $0 \leq e \leq 0.3$;

$0 \leq f \leq 0.5$, preferably $0 \leq f \leq 0.4$, and more preferably $0 \leq f \leq 0.3$;

$0 \leq g \leq 0.5$, preferably $0 \leq g \leq 0.4$, and more preferably $0 \leq g \leq 0.3$;

preferably $0.2 \leq a1+a2+a3+b+c \leq 1.0$, more preferably $0.3 \leq a1+a2+a3+b+c \leq 1.0$; and $a1+a2+a3+b+c+d+e+f+g=1$.

The meaning of a+b+c=1, for example, is that in a polymer comprising recurring units (a), (b), and (c), the sum of recurring units (a), (b), and (c) is 100 mol % based on the total amount of entire recurring units. The meaning of a+b+c <1 is that the sum of recurring units (a), (b), and (c) is less than 100 mol % based on the total amount of entire recurring units, indicating the inclusion of other recurring units.

The polymer serving as the base resin in the resist composition should preferably have a weight average molecular weight (Mw) in the range of 1,000 to 500,000, and more preferably 2,000 to 30,000, as measured by GPC versus polystyrene standards. With too low a Mw, the resist composition may become less heat resistant. A polymer with too high a Mw may lose alkaline solubility and give rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymer is advantageously used as a base resin in a positive resist composition, typically chemically amplified positive resist composition. Specifically, the polymer is used as a base resin and combined with any desired components including an organic solvent, acid generator, dissolution regulator, basic compound, surfactant, and acetylene alcohol to formulate a positive resist composition. This positive resist composition has a very high sensitivity in that the dissolution rate in developer of the polymer in exposed areas is accelerated by catalytic reaction. In addition, the resist film has a high dissolution contrast, resolution, exposure latitude, and process adaptability, and provides a good pattern profile after exposure, yet better etch resistance, and minimal proximity bias because of restrained acid diffusion. By virtue of these advantages, the composition is fully useful in commercial application and suited as a pattern-forming material for the fabrication of VLSIs. Particularly when an acid generator is incorporated to formulate a chemically amplified positive resist composition capable of utilizing acid catalyzed reaction, the composition has a higher sensitivity and is further improved in the properties described above.

The positive resist composition may further comprise an organic solvent, basic compound, dissolution regulator, surfactant, and acetylene alcohol, alone or in combination. Inclusion of a dissolution regulator may lead to an increased difference in dissolution rate between exposed and unexposed areas and a further improvement in resolution. Addition of a basic compound may be effective in suppressing the diffusion rate of acid in the resist film, achieving a further improvement in resolution. Addition of a surfactant may improve or control the coating characteristics of the resist composition.

The positive resist composition may include an acid generator in order for the composition to function as a chemically amplified positive resist composition. Typical of the acid generator used herein is a photoacid generator (PAG) capable of generating an acid in response to actinic light or radiation. It is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in U.S. Pat. No. 7,537,880 (JP-A 2008-111103, paragraphs [0122] to [0142]). In the embodiment wherein a polymer having recurring units (d) copolymerized therein is used as the base resin, the PAG may be omitted.

Examples of the organic solvent used herein are described in JP-A 2008-111103, paragraphs [0144] to [0145] (U.S. Pat. No. 7,537,880). Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Exemplary basic compounds are described in JP-A 2008-111103, paragraphs
to [0164], for example, primary, secondary and tertiary amine compounds, specifically amine compounds having a hydroxyl, ether, ester, lactone, cyano or sulfonate group. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. Also useful are quenchers of polymer type as described in JP-A 2008-239918. The polymeric quencher segregates at the resist surface after coating and thus enhances the rectangularity of resist pattern. When a protective film is applied as is often the case in the immersion lithography, the polymeric quencher is also effective for preventing any film thickness loss of resist pattern or rounding of pattern top.

An appropriate amount of the acid generator used is 0.01 to 100 parts, and preferably 0.1 to 80 parts. An appropriate amount of the organic solvent used is 50 to 10,000 parts, especially 100 to 5,000 parts. The dissolution regulator may be blended in an amount of 0 to 50 parts, preferably 0 to 40 parts, the basic compound in an amount of 0 to 100 parts, preferably 0.001 to 50 parts, and the surfactant in an amount of 0 to 10 parts, preferably 0.0001 to 5 parts. All amounts are expressed in parts by weight relative to 100 parts by weight of the base resin.

Process

The positive resist composition, typically chemically amplified positive resist composition comprising a polymer having acid labile groups of formula (1) (2) or (3), an acid generator, and a basic compound in an organic solvent is used in the fabrication of various integrated circuits. Pattern formation using the resist composition may be performed by well-known lithography processes. The process generally involves coating, prebake, exposure, bake (PEB), and development. If necessary, any additional steps may be added.

The positive resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, MoSi, or $SiO_2$) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 µm thick.

The resist film is then exposed to a desired pattern of high-energy radiation such as UV, deep-UV, EB, x-ray, excimer laser light, γ-ray, synchrotron radiation or EUV (soft x-ray), directly or through a mask. The exposure dose is preferably about 1 to 200 $mJ/cm^2$, more preferably about 10 to 100 $mJ/cm^2$, or 0.1 to 100 $\mu C/cm^2$, more preferably 0.5 to 50 $\mu C/cm^2$. The resist film is further baked (PEB) on a hot plate at 60 to 150° C. for 10 seconds to 30 minutes, preferably 80 to 120° C. for 30 seconds to 20 minutes.

Thereafter the resist film is developed in a developer in the form of an aqueous base solution for 3 seconds to 3 minutes, preferably 5 seconds to 2 minutes by conventional techniques such as dip, puddle or spray techniques. Suitable developers are 0.1 to 10 wt %, preferably 2 to 10 wt %, more preferably 2 to 8 wt % aqueous solutions of tetramethylammonium hydroxide (TMAH), tetraethylammonium hydroxide (TEAH), tetrapropylammonium hydroxide (TPAH) and tetrabutylammonium hydroxide (TBAH). The resist film in the exposed area is dissolved in the developer whereas the resist film in the unexposed area is not dissolved. In this way, the desired positive pattern is formed on the substrate. It is appreciated that the resist composition of the invention is best suited for micro-patterning using such high-energy radiation as EB, EUV (soft x-ray), x-ray, γ-ray and synchrotron radiation among others.

Although TMAH aqueous solution is generally used as the developer, TEAH, TPAH and TBAH having a longer alkyl chain are effective in inhibiting the resist film from being swollen during development and thus preventing pattern collapse. JP 3429592 describes an example using an aqueous TBAH solution for the development of a polymer comprising recurring units having an alicyclic structure such as adamantane methacrylate and recurring units having an acid labile group such as t-butyl methacrylate, the polymer being water repellent due to the absence of hydrophilic groups.

The TMAH developer is most often used as 2.38 wt % aqueous solution, which corresponds to 0.26N. The TEAH, TPAH, and TBAH aqueous solutions should preferably have an equivalent normality. The concentration of TEAH, TPAH, and TBAH that corresponds to 0.26N is 3.84 wt %, 5.31 wt %, and 6.78 wt %, respectively.

When a pattern with a line size of 32 nm or less is resolved by the EB and EUV lithography, there arises a phenomenon that lines become wavy, lines merge together, and merged lines collapse. It is believed that this phenomenon occurs because lines are swollen in the developer and the thus expanded lines merge together. Since the swollen lines containing liquid developer are as soft as sponge, they readily collapse under the stress of rinsing. For this reason, the developer using a long-chain alkyl developing agent is effective for preventing film swell and hence, pattern collapse.

Alternatively, a negative tone pattern may be formed by organic solvent development. The organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

At the end of organic solvent development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. The solvents may be used alone or in admixture. Besides the foregoing solvents, aromatic solvents may be used, for example, toluene, xylene, ethylbenzene, isopropylbenzene, tert-butylbenzene and mesitylene.

EXAMPLE

Synthesis Examples, Comparative Synthesis Examples, Examples and Comparative Examples are given below for further illustrating the invention, but they should not be construed as limiting the invention thereto. Mw is a weight average molecular weight as measured by GPC versus polystyrene standards, and Mw/Mn designates molecular weight distribution or dispersity. All parts (pbw) are by weight.

Monomer Synthesis

Polymerizable acid-labile compounds within the scope of the invention were synthesized as follows.

Monomer Synthesis Example 1

Synthesis of Monomer 1

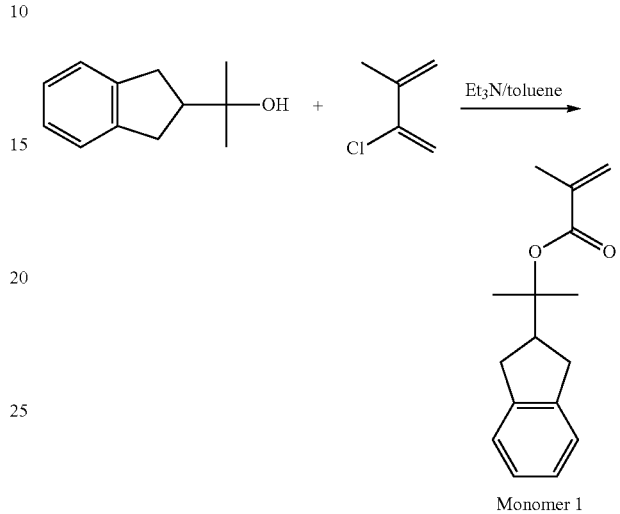

Monomer 1

With stirring and ice cooling, 111 g of triethylamine was added to a mixture of 120 g of methacrylic acid chloride, 200 g of 2-(indan-2-yl)propan-2-ol, and 1500 g of toluene. The mixture was stirred at room temperature for 16 hours. By standard aqueous work-up and solvent distillation, a crude product was obtained. It was purified by column chromatography, yielding the target compound, designated Monomer 1.

By the same procedure, Monomers 2 to 13 were synthesized. In the synthesis of Monomers 5 to 13, the reactant 2-(indan-2-yl)propan-2-ol was replaced by 2-(indan-2-yl)butan-2-ol for Monomer 5, 2-(1,2,3,4-tetrahydronaphthalen-2-yl)propan-2-ol for Monomer 6, 2-(1,2,3,4-tetrahydronaphthalen-1-yl)propan-2-ol for Monomer 7, 2-(6,7,8,9-tetrahydro-5H-benz[annulen]-7-yl)propan-2-ol for Monomer 8, 2-(acenaphthen-2-yl)propan-2-ol for Monomer 9, 2-(fluoren-9-yl)propan-2-ol for Monomer 10, 2-(9,10-dihydroanthracen-9-yl)propan-2-ol for Monomer 11, 2-(dibenzosuberan-9-yl)propan-2-ol for Monomer 12, and 2-(5H-dibenzo(A,D)cyclohepten-9-yl)propan-2-ol for Monomer 13.

In the synthesis of Monomers 2 to 4, the reaction was replaced by reaction of 2-(indan-2-yl)propan-2-ol with 5-carboxylic acid-4-oxatricyclo[4.2.1.0$^{3,7}$]nonan-5-on-2-yl methacrylate for Monomer 2, reaction of 2-(indan-2-yl)propan-2-ol with 4-vinylbenzoic acid for Monomer 3, and reaction of 2-(indan-2-yl)propan-2-ol with 5-vinyl-1-naphthoic acid for Monomer 4.

73 74
-continued
Monomer 1
Monomer 5
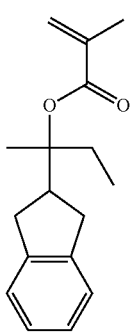
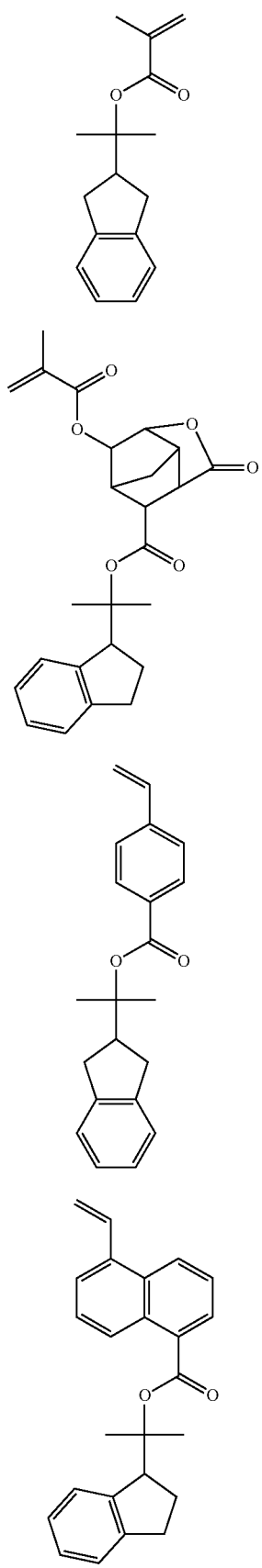
Monomer 2
Monomer 6
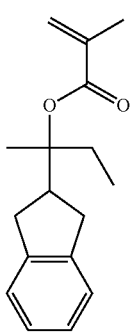
Monomer 3
Monomer 7
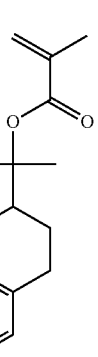
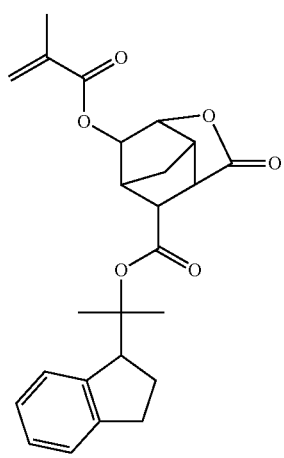
Monomer 8
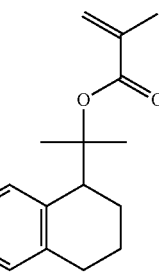
Monomer 4
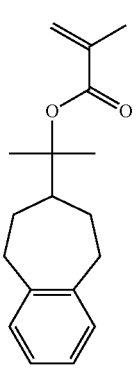
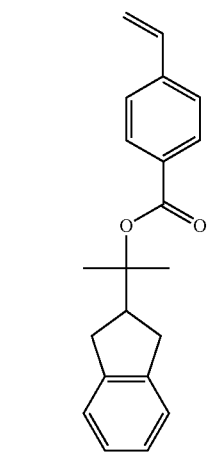
Monomer 9
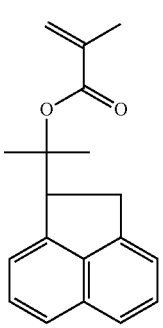

Monomer 10
Monomer 11
Monomer 12
Monomer 13
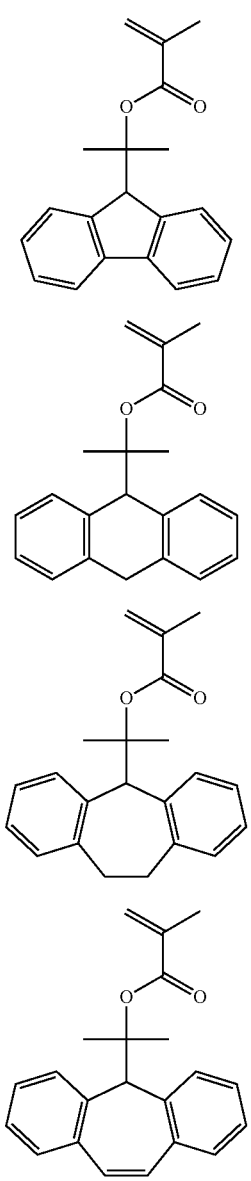
PAG monomers 1 to 7 and Adhesive monomers 1 and 2 used herein are shown below.
PAG monomer 1
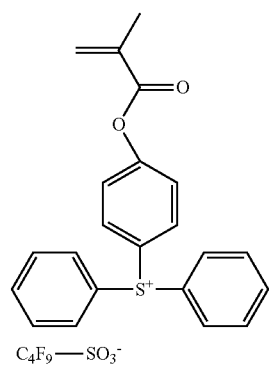
PAG monomer 2
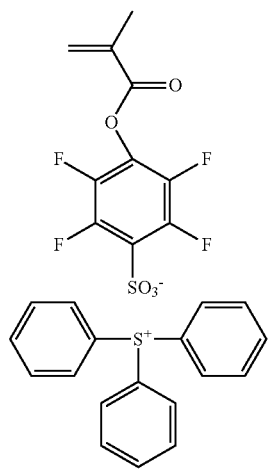
PAG monomer 3
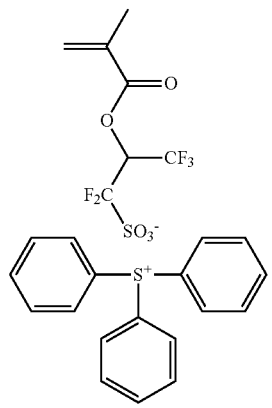
PAG monomer 4
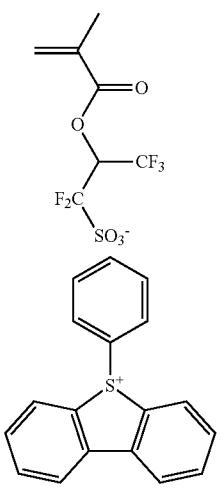

PAG monomer 5

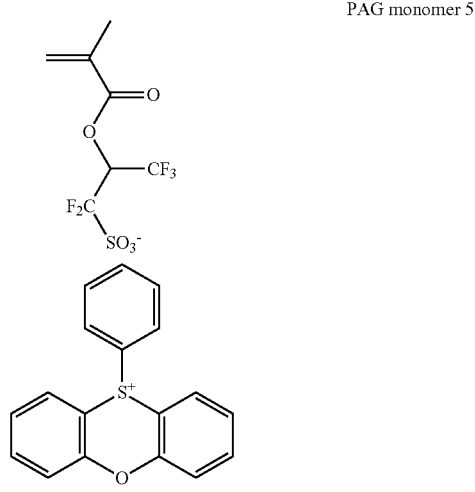

PAG monomer 6

PAG monomer 7

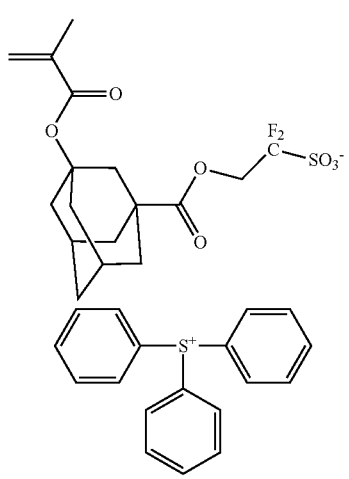

Adhesive monomer 1

Adhesive monomer 2

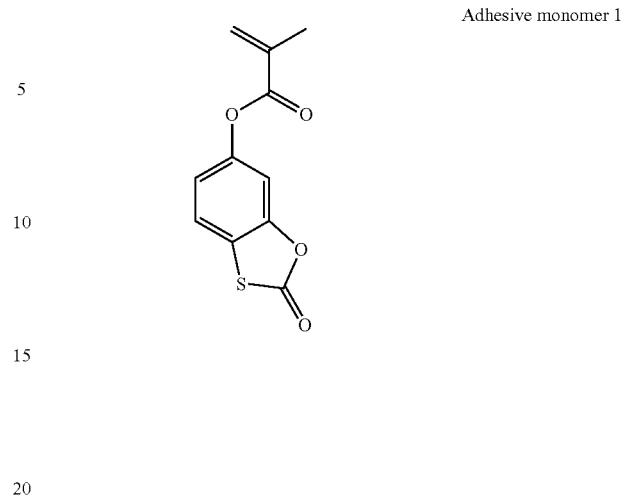

Polymer Synthesis

Polymer Synthesis Example 1

A 2-L flask was charged with 7.3 g of Monomer 1, 11.3 g of 4-acetoxystyrene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of azobisisobutyronitrile (AIBN) was added as a polymerization initiator. The reactor was heated at 60° C. and reaction run for 15 hours. The reaction solution was precipitated from 1 L of isopropyl alcohol. The white solid was collected by filtration and dissolved again in a mixture of 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^1$H-NMR, and GPC, with the analytical data shown below.

Copolymer composition (molar ratio)

Monomer 1:4-hydroxystyrene=0.30:0.70

Mw=8,100

Mw/Mn=1.81

This is designated Polymer 1.

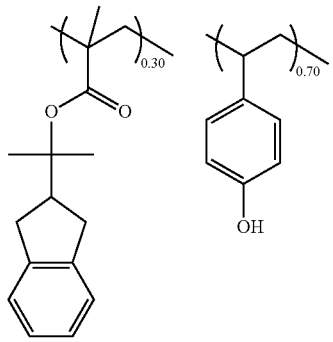

Polymer 1

Polymer Synthesis Example 2

A 2-L flask was charged with 5.8 g of Monomer 1, 13.7 g of 3-hydroxyphenyl methacrylate, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.
Copolymer composition (molar ratio)
Monomer 1:3-hydroxyphenyl methacrylate=0.23:0.77
Mw=8,100
Mw/Mn=1.93

This is designated Polymer 2.

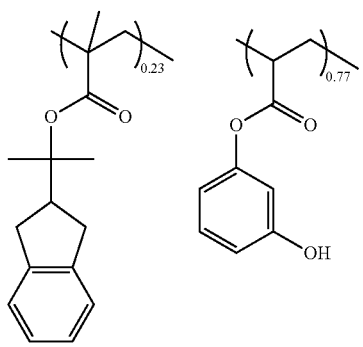

Polymer 2

Polymer Synthesis Example 3

A 2-L flask was charged with 5.8 g of Monomer 1, 16.8 g of 5-hydroxyindan-2-yl methacrylate, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.
Copolymer composition (molar ratio)
Monomer 1:5-hydroxyindan-2-yl methacrylate=0.23:0.77
Mw=8,600
Mw/Mn=1.89

This is designated Polymer 3.

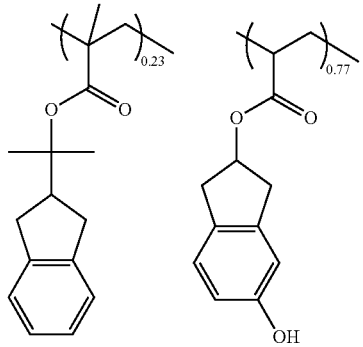

Polymer 3

Polymer Synthesis Example 4

A 2-L flask was charged with 7.3 g of Monomer 1, 8.7 g of 5-hydroxyindan-2-yl methacrylate, 6.7 g of 3-oxo-2,7-dioxatricyclo[4.2.1.0$^{4,8}$]nonan-9-yl methacrylate, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.
Copolymer composition (molar ratio)
Monomer 1:5-hydroxyindan-2-yl methacrylate:3-oxo-2,7-dioxatricyclo[4.2.1.0$^{4,8}$]nonan-9-yl methacrylate=0.30:0.40:0.30
Mw=9,300
Mw/Mn=1.83

This is designated Polymer 4.

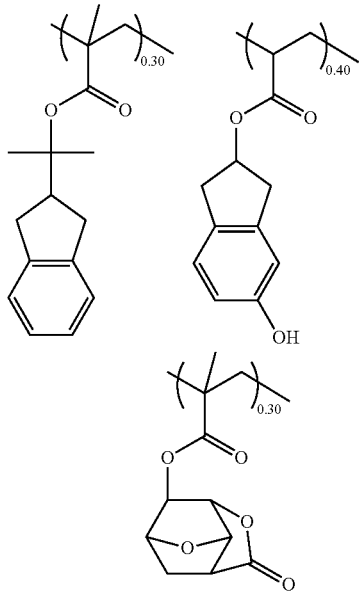

Polymer 4

Polymer Synthesis Example 5

A 2-L flask was charged with 5.8 g of Monomer 1, 1.7 g of indene, 10.8 g of 4-acetoxystyrene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in a mixture of 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^{1}$H-NMR, and GPC, with the analytical data shown below.
Copolymer composition (molar ratio)
Monomer 1: indene:4-hydroxystyrene=0.23:0.10:0.67
Mw=7,600
Mw/Mn=1.93

This is designated Polymer 5.

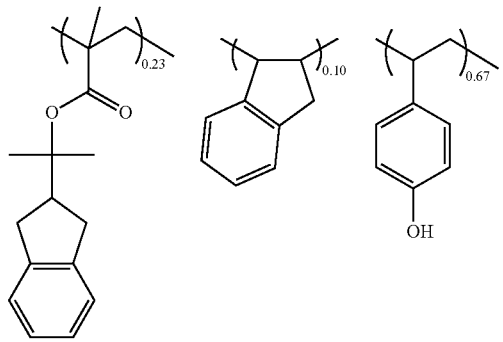

Polymer 5

Polymer Synthesis Example 6

A 2-L flask was charged with 6.8 g of Monomer 1, 5.3 g of 4-hydroxyphenyl methacrylate, 6.8 g of 4-acetoxystyrene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in a mixture of 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^{1}$H-NMR, and GPC, with the analytical data shown below.
Copolymer composition (molar ratio)
Monomer 1:4-hydroxyphenyl methacrylate:4-hydroxystyrene=0.28:0.30:0.42
Mw=7,700
Mw/Mn=1.75

This is designated Polymer 6.

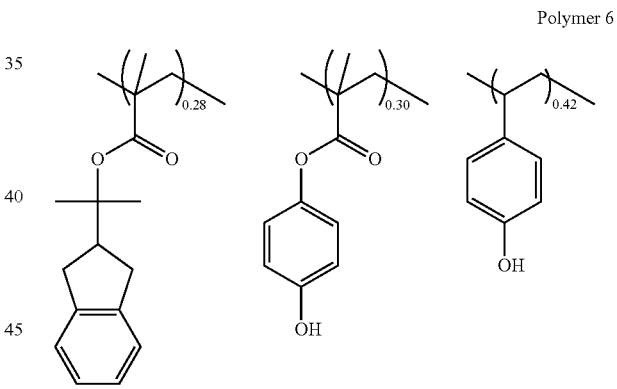

Polymer 6

Polymer Synthesis Example 7

A 2-L flask was charged with 6.3 g of Monomer 1, 6.8 g of 1-hydroxynaphthalen-5-yl methacrylate, 7.5 g of tetrahydro-2-oxofuran-3-yl methacrylate, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.
Copolymer composition (molar ratio)
Monomer 1:1-hydroxynaphthalen-5-yl methacrylate:tetrahydro-2-oxofuran-3-yl methacrylate=0.26:0.30:0.44
Mw=8,200
Mw/Mn=1.88
This is designated Polymer 7.

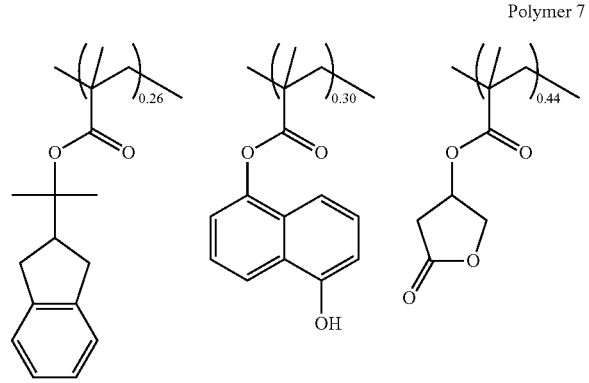

Polymer 7

Polymer Synthesis Example 8

A 2-L flask was charged with 5.6 g of Monomer 1, 10.7 g of 4-acetoxystyrene, 1.7 g of acenaphthylene, and 20 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in a mixture of 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^1$H-NMR, and GPC, with the analytical data shown below.
Copolymer composition (molar ratio)
Monomer 1:4-hydroxystyrene:acenaphthylene=0.23:0.67:0.10
Mw=6,300
Mw/Mn=1.82
This is designated Polymer 8.

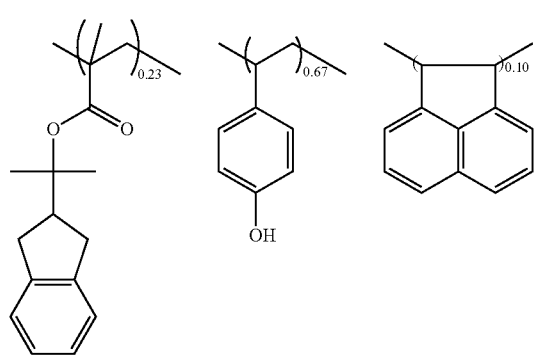

Polymer 8

Polymer Synthesis Example 9

A 2-L flask was charged with 5.8 g of Monomer 1, 2.0 g of 7-acetoxyindene, 10.6 g of 4-acetoxystyrene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in a mixture of 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^1$H-NMR, and GPC, with the analytical data shown below.
Copolymer composition (molar ratio)
Monomer 1:7-hydroxyindene:4-hydroxystyrene=0.24:0.10:0.66
Mw=6,200
Mw/Mn=1.81
This is designated Polymer 9.

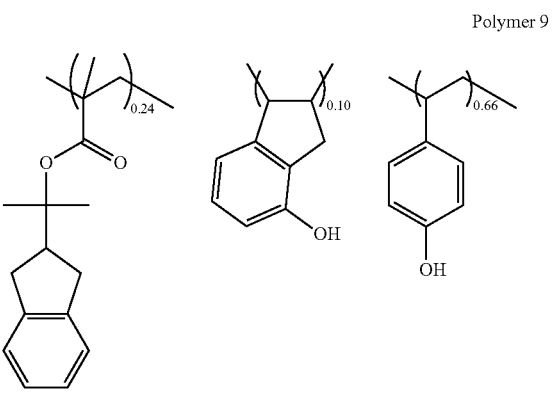

Polymer 9

Polymer Synthesis Example 10

A 2-L flask was charged with 5.6 g of Monomer 1, 8.3 g of 4-acetoxystyrene, 2.7 g of 6-hydroxycoumarin, 1.5 g of coumarin, and 20 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in a mixture of 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^{1}$H-NMR, and GPC, with the analytical data shown below.
Copolymer composition (molar ratio)
Monomer 1:4-hydroxystyrene:6-hydroxycoumarin:coumarin=0.23:0.52:0.15:0.10
Mw=6,600
Mw/Mn=1.93
This is designated Polymer 10.

Polymer 10

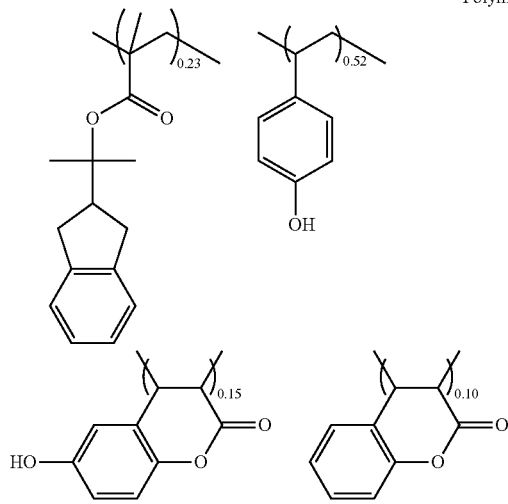

Polymer Synthesis Example 11

A 2-L flask was charged with 5.6 g of Monomer 1, 15.5 g of 5-hydroxy-1,2,3,4-tetrahydronaphthalen-2-yl methacrylate, 1.6 g of chromone, and 20 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.
Copolymer composition (molar ratio)
Monomer 1:5-hydroxy-1,2,3,4-tetrahydronaphthalen-2-yl methacrylate:chromone=0.23:0.67:0.10
Mw=6,300
Mw/Mn=1.99
This is designated Polymer 11.

Polymer 11

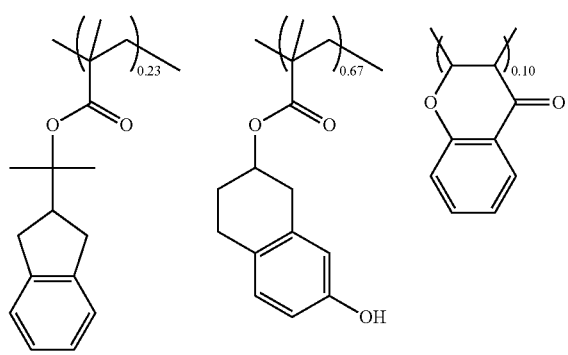

Polymer Synthesis Example 12

A 2-L flask was charged with 7.0 g of Monomer 3, 10.7 g of 4-acetoxystyrene, 1.6 g of chromone, and 20 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in a mixture of 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^{1}$H-NMR, and GPC, with the analytical data shown below.
Copolymer composition (molar ratio)
Monomer 3:4-hydroxystyrene:chromone=0.23:0.67:0.10
Mw=8,300
Mw/Mn=1.73
This is designated Polymer 12.

Polymer 12

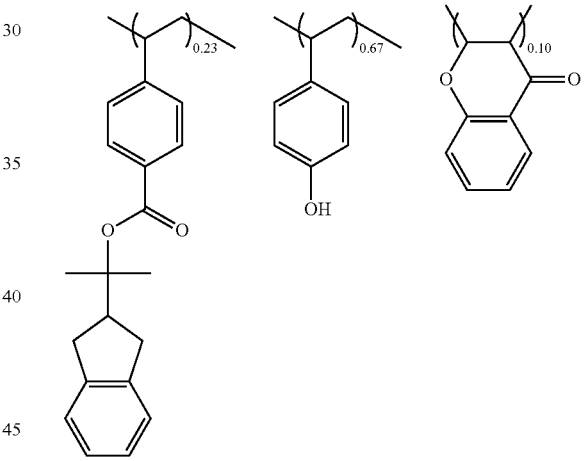

Polymer Synthesis Example 13

A 2-L flask was charged with 8.2 g of Monomer 4, 10.4 g of 4-acetoxystyrene, 1.8 g of coumarin, and 20 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in a mixture of 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^1$H-NMR, and GPC, with the analytical data shown below.
Copolymer composition (molar ratio)
Monomer 4:4-hydroxystyrene:coumarin=0.23:0.65:0.12
Mw=7,300
Mw/Mn=1.93
This is designated Polymer 13.

Polymer 13

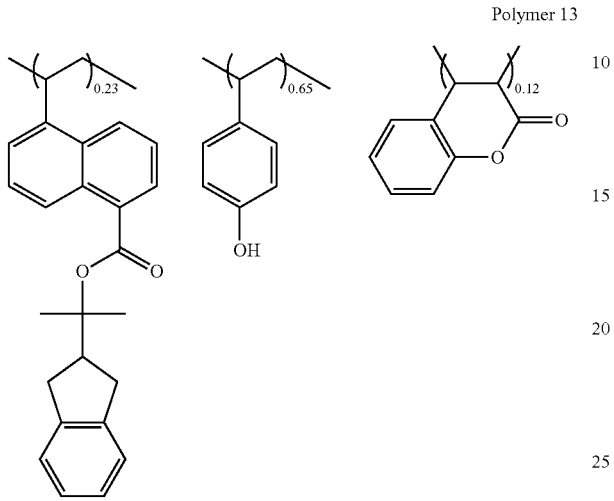

Polymer Synthesis Example 14

A 2-L flask was charged with 7.3 g of Monomer 1, 5.3 g of 4-hydroxyphenyl methacrylate, 6.7 g of 3-oxo-2,7-dioxatricyclo[4.2.1.0$^{4,8}$]nonan-9-yl methacrylate, 6.5 g of PAG monomer 1, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.
Copolymer composition (molar ratio)
Monomer 1:4-hydroxyphenyl methacrylate:3-oxo-2,7-dioxatricyclo[4.2.1.0$^{4,8}$]nonan-9-yl methacrylate:PAG monomer 1=0.30:0.30:0.30:0.10
Mw=8,300
Mw/Mn=1.93
This is designated Polymer 14.

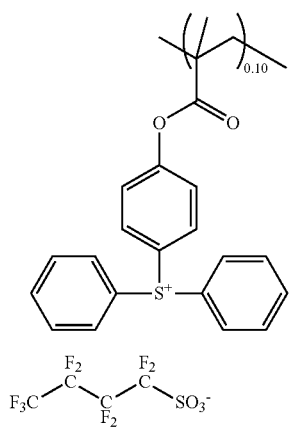

Polymer Synthesis Example 15

A 2-L flask was charged with 7.3 g of Monomer 1, 5.3 g of 4-hydroxyphenyl methacrylate, 6.7 g of 3-oxo-2,7-dioxatricyclo[4.2.1.0$^{4,8}$]nonan-9-yl methacrylate, 5.7 g of PAG monomer 2, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.
Copolymer composition (molar ratio)
Monomer 1:4-hydroxyphenyl methacrylate:3-oxo-2,7-dioxatricyclo[4.2.1.0$^{4,8}$]nonan-9-yl methacrylate:PAG monomer 2=0.30:0.30:0.30:0.10
Mw=8,300
Mw/Mn=1.63
This is designated Polymer 15.

Polymer 14

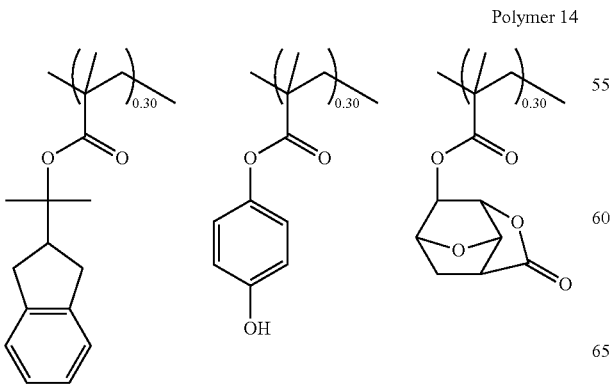

Polymer 15

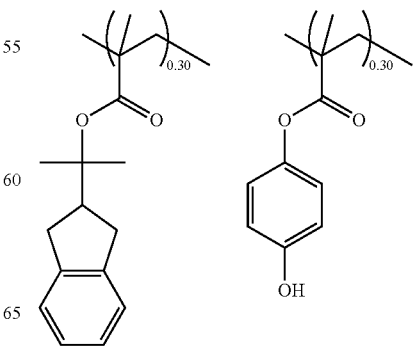

-continued

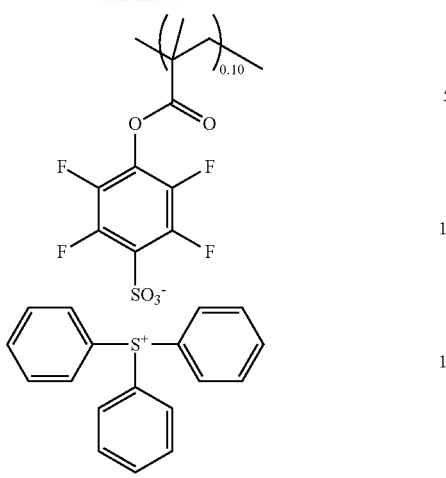

Polymer Synthesis Example 16

A 2-L flask was charged with 7.3 g of Monomer 1, 5.3 g of 4-hydroxyphenyl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.

Copolymer composition (molar ratio)

Monomer 1:4-hydroxyphenyl methacrylate:3-oxo-2,7-dioxatricyclo[4.2.1.0$^{4,8}$]nonan-9-yl methacrylate:PAG monomer 3=0.30:0.30:0.30:0.10

Mw=7,300

Mw/Mn=1.72

This is designated Polymer 16.

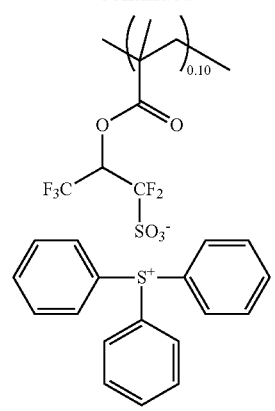

Polymer Synthesis Example 17

A 2-L flask was charged with 3.7 g of Monomer 1, 4.1 g of 3-ethyl-3-exo-tetracyclo[4.4.0.1$^{2,5}$.1$^{7,10}$]dodecanyl methacrylate, 5.4 g of 3-hydroxyphenyl methacrylamide, 6.5 g of 2,7-dihydro-2-oxobenzo[C]furan-5-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.

Copolymer composition (molar ratio)

Monomer 1:3-ethyl-3-exo-tetracyclo[4.4.0.1$^{2,5}$0.1$^{7,10}$]dodecanyl methacrylate:3-hydroxyphenyl methacrylamide:2,7-dihydro-2-oxobenzo[C]furan-5-yl methacrylate:PAG monomer 3=0.15:0.15:0.30:0.30:0.10

Mw=7,100

Mw/Mn=1.72

This is designated Polymer 17.

Polymer 16

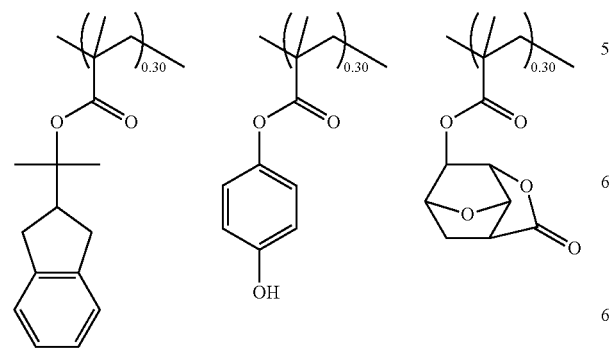

Polymer 17

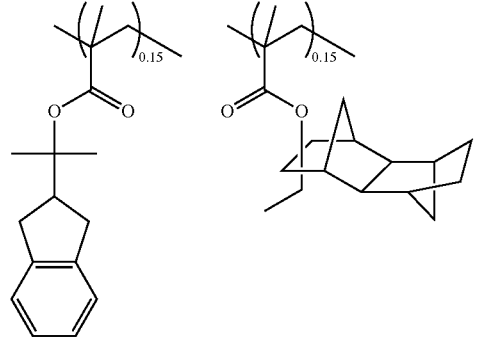

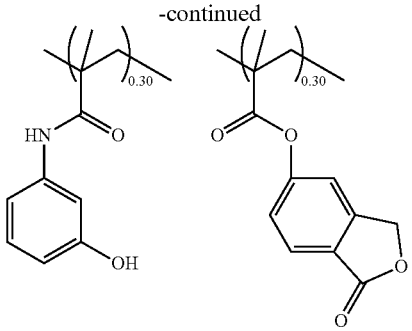

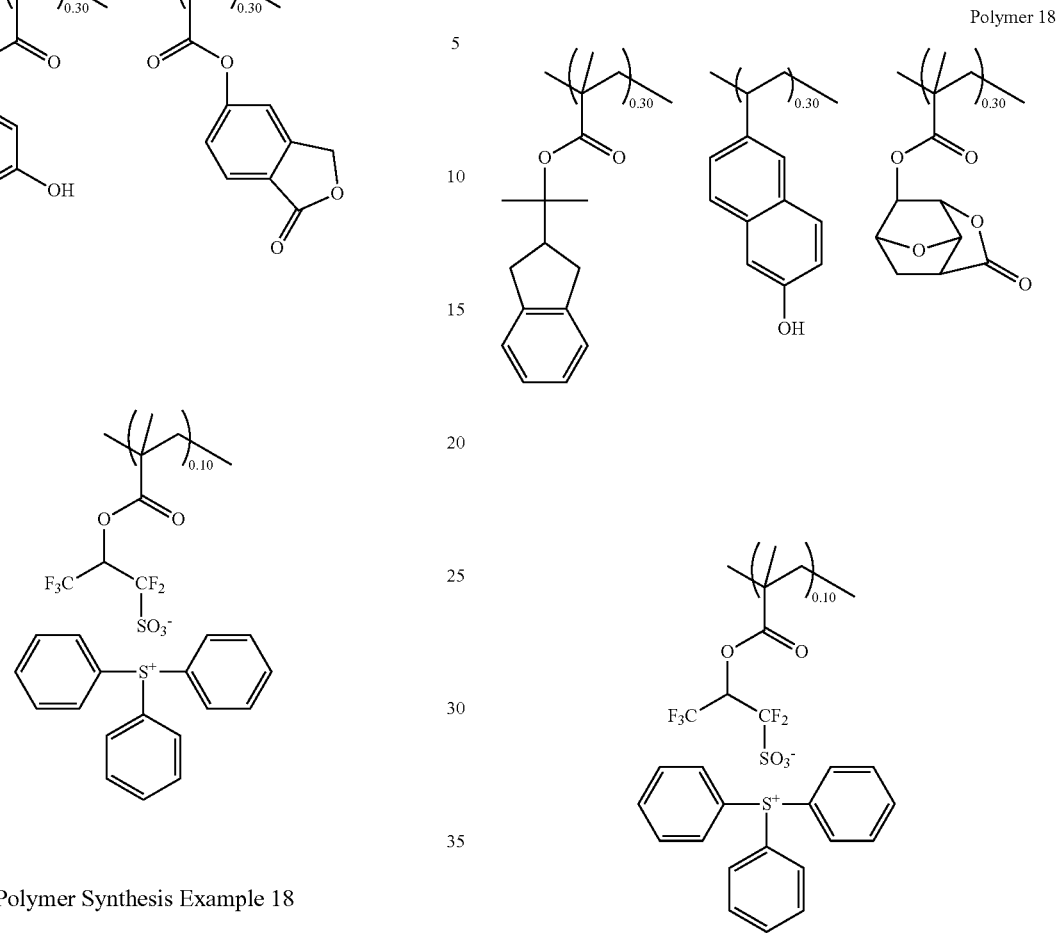

This is designated Polymer 18.

Polymer Synthesis Example 18

A 2-L flask was charged with 7.3 g of Monomer 1, 6.4 g of 6-acetoxy-2-vinylnaphthalene, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in a mixture of 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^{1}$H-NMR, and GPC, with the analytical data shown below.

Copolymer composition (molar ratio)

Monomer 1:6-hydroxy-2-vinylnaphthalene:3-oxo-2,7-dioxatricyclo[4.2.1.0$^{4,8}$]nonan-9-yl methacrylate:PAG monomer 3=0.30:0.30:0.30:0.10

Mw=8,100

Mw/Mn=1.81

Polymer Synthesis Example 19

A 2-L flask was charged with 7.3 g of Monomer 1, 6.5 g of 5-hydroxyindan-2-yl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer composition (molar ratio)

Monomer 1:5-hydroxyindan-2-yl methacrylate:3-oxo-2,7-dioxatricyclo[4.2.1.0$^{4,8}$]nonan-9-yl methacrylate:PAG monomer 3=0.30:0.30:0.30:0.10

Mw=8,600

Mw/Mn=1.72

This is designated Polymer 19.

This is designated Polymer 20.

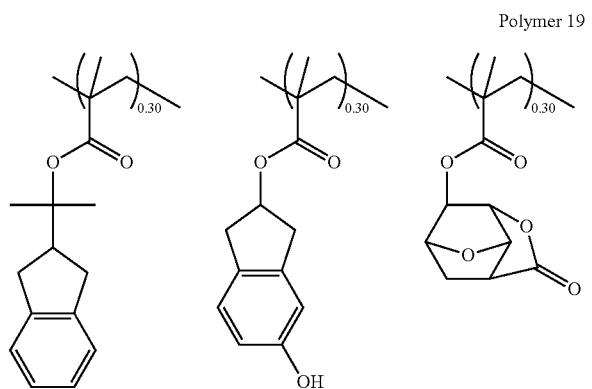

Polymer 19

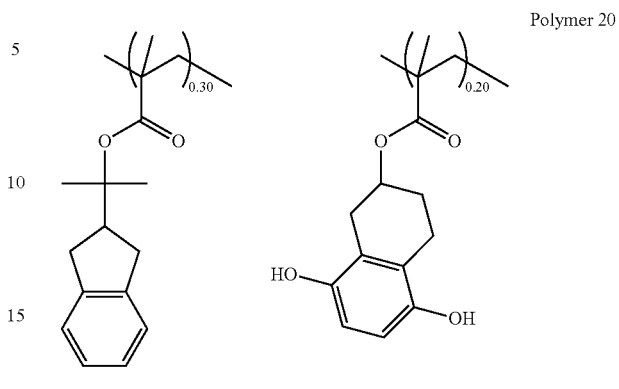

Polymer 20

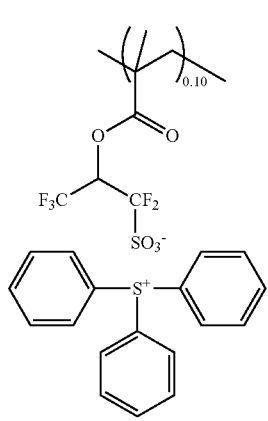

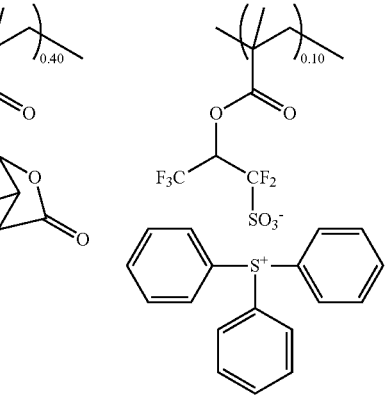

Polymer Synthesis Example 20

A 2-L flask was charged with 7.3 g of Monomer 1, 7.4 g of 5,8-dihydroxy-1,2,3,4-tetrahydronaphthalen-2-yl methacrylate, 6.7 g of 3-oxo-2,7-dioxatricyclo[4.2.1.0$^{4,8}$]-nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer composition (molar ratio)

Monomer 1:5,8-dihydroxy-1,2,3,4-tetrahydronaphthalen-2-yl methacrylate:3-oxo-2,7-dioxatricyclo[4.2.1.0$^{4,8}$] nonan-9-yl methacrylate:PAG monomer 3=0.30:0.20:0.40:0.10

Mw=8,300

Mw/Mn=1.81

Polymer Synthesis Example 21

A 2-L flask was charged with 7.3 g of Monomer 1, 7.4 g of 6-hydroxycoumarin-3-yl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer composition (molar ratio)

Monomer 1:6-hydroxycoumarin-3-yl methacrylate:3-oxo-2,7-dioxatricyclo[4.2.1.0$^{4,8}$]nonan-9-yl methacrylate:PAG monomer 3=0.30:0.20:0.40:0.10

Mw=8,100

Mw/Mn=1.86

This is designated Polymer 21.

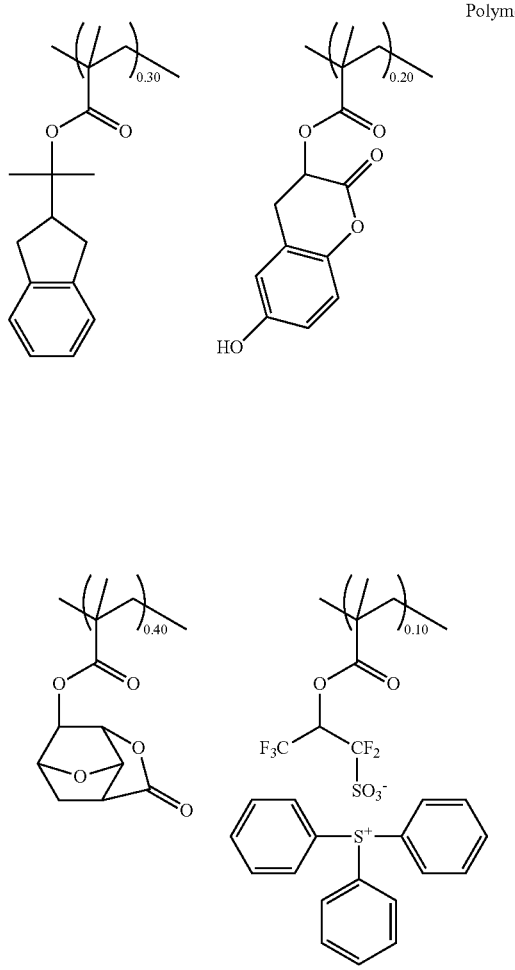

Polymer 21

This is designated Polymer 22.

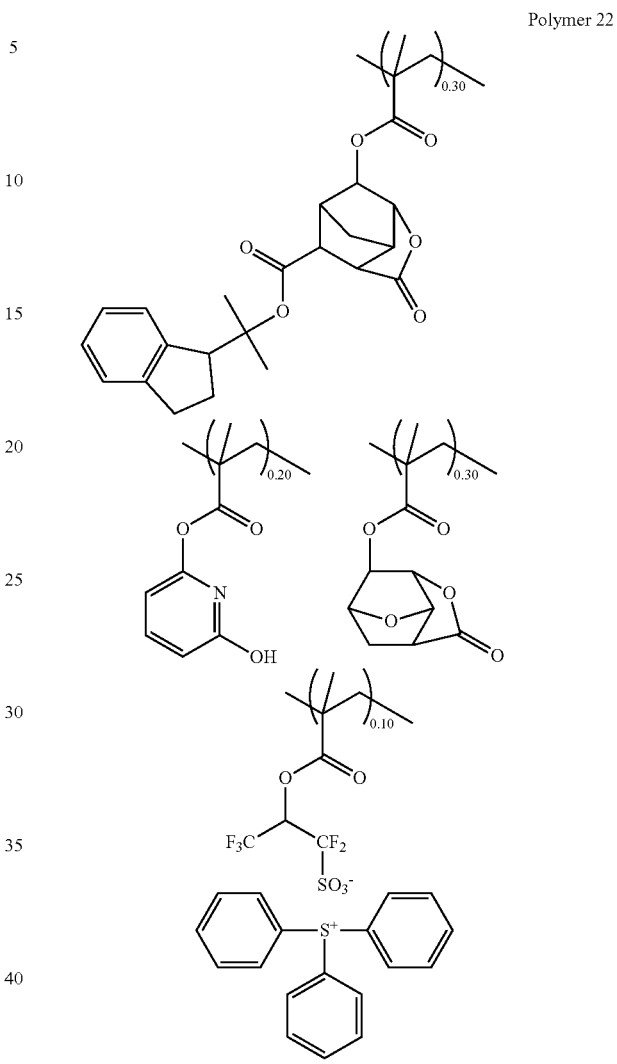

Polymer 22

Polymer Synthesis Example 22

A 2-L flask was charged with 12.7 g of Monomer 2, 5.4 g of 2-hydroxypyridin-6-yl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer composition (molar ratio)

Monomer 2:2-hydroxypyridin-6-yl methacrylate:3-oxo-2,7-dioxatricyclo[4.2.1.0$^{4,8}$]nonan-9-yl methacrylate:PAG monomer 3=0.30:0.30:0.30:0.10

Mw=8,900

Mw/Mn=1.63

Polymer Synthesis Example 23

A 2-L flask was charged with 7.7 g of Monomer 5, 4.5 g of 4-hydroxy-1-naphthalene methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer composition (molar ratio)

Monomer 5:4-hydroxy-1-naphthalene methacrylate:3-oxo-2,7-dioxatricyclo[4.2.1.0$^{4,8}$]nonan-9-yl methacrylate: PAG monomer 3=0.30:0.20:0.40:0.10

Mw=7,300
Mw/Mn=1.72
This is designated Polymer 23.

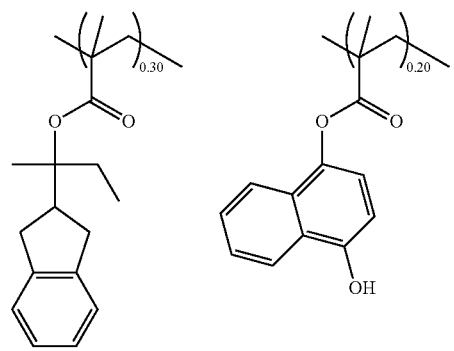
Polymer 23

This is designated Polymer 24.

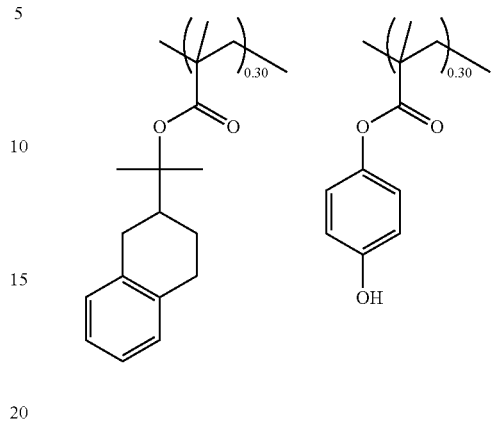
Polymer 24

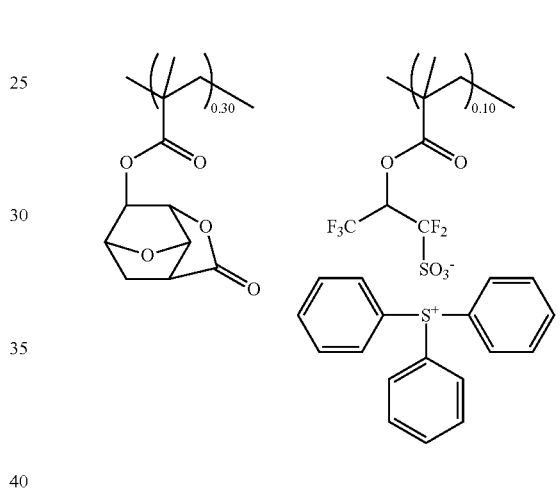

Polymer Synthesis Example 24

A 2-L flask was charged with 7.7 g of Monomer 6, 5.3 g of 4-hydroxyphenyl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer composition (molar ratio)

Monomer 6:4-hydroxyphenyl methacrylate:3-oxo-2,7-dioxatricyclo[4.2.1.0$^{4,8}$]nonan-9-yl methacrylate:PAG monomer 3=0.30:0.30:0.30:0.10

Mw=7,100
Mw/Mn=1.91

Polymer Synthesis Example 25

A 2-L flask was charged with 7.7 g of Monomer 7, 5.3 g of 4-hydroxyphenyl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer composition (molar ratio)

Monomer 7:4-hydroxyphenyl methacrylate:3-oxo-2,7-dioxatricyclo[4.2.1.0$^{4,8}$]nonan-9-yl methacrylate:PAG monomer 3=0.30:0.30:0.30:0.10

Mw=7,900
Mw/Mn=1.89

This is designated Polymer 25.

This is designated Polymer 26.

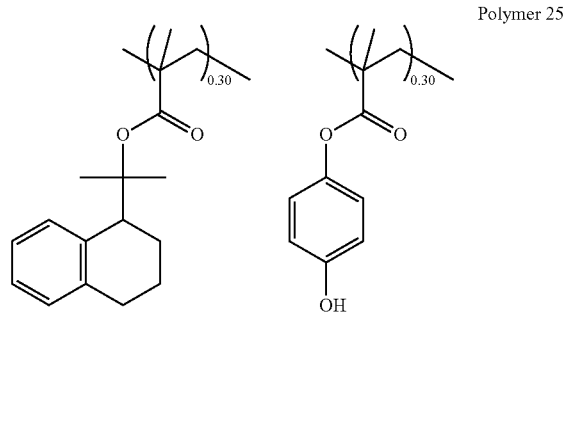

Polymer 25

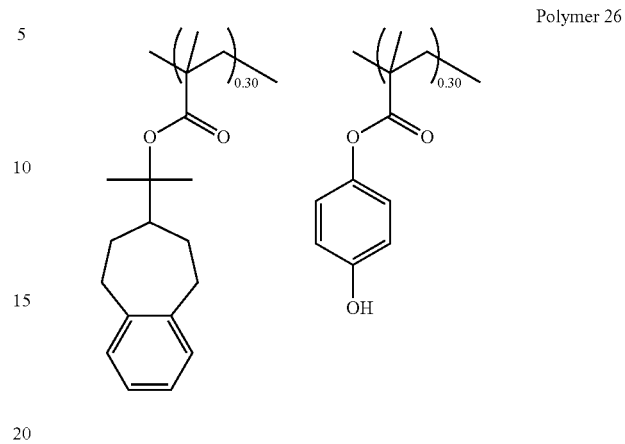

Polymer 26

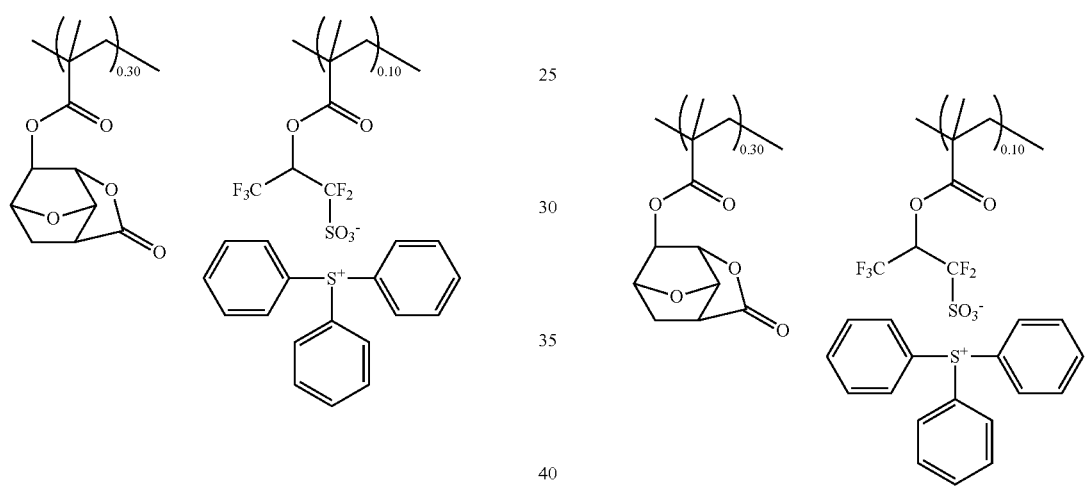

Polymer Synthesis Example 26

A 2-L flask was charged with 8.2 g of Monomer 8, 5.3 g of 4-hydroxyphenyl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer composition (molar ratio)

Monomer 8:4-hydroxyphenyl methacrylate:3-oxo-2,7-dioxatricyclo[4.2.1.0$^{4,8}$]nonan-9-yl methacrylate:PAG monomer 3=0.30:0.30:0.30:0.10

Mw=7,900

Mw/Mn=1.83

Polymer Synthesis Example 27

A 2-L flask was charged with 8.4 g of Monomer 9, 5.3 g of 4-hydroxyphenyl methacrylate, 6.7 g of Adhesive monomer 1, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer composition (molar ratio)

Monomer 9:4-hydroxyphenyl methacrylate:Adhesive monomer 1:PAG monomer 3=0.30:0.30:0.30:0.10

Mw=7,600

Mw/Mn=1.69

101

This is designated Polymer 27.

102

This is designated Polymer 28.

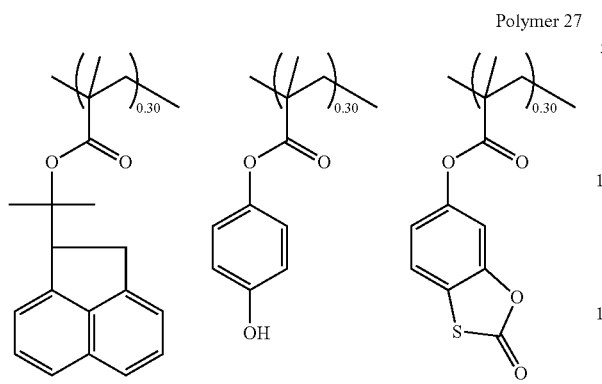

Polymer 27

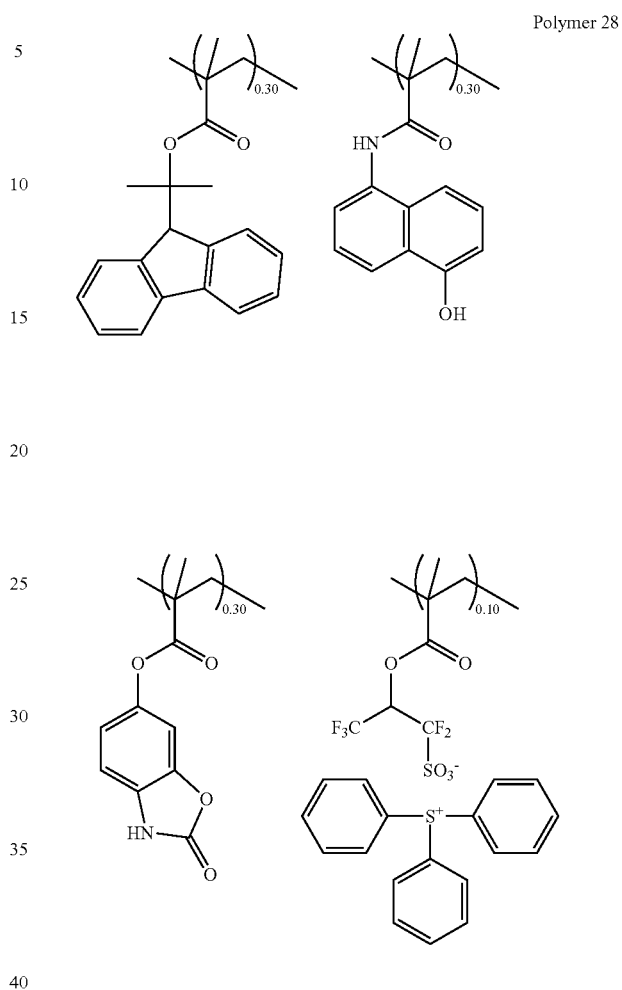

Polymer 28

Polymer Synthesis Example 28

A 2-L flask was charged with 8.7 g of Monomer 10, 6.8 g of 5-(methacryloylamino)-1-naphthol, 7.4 g of Adhesive monomer 2, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer composition (molar ratio)

Monomer 10:5-(methacryloylamino)-1-naphthol:Adhesive monomer 2: PAG monomer 3=0.30:0.30:0.30:0.10

Mw=7,600

Mw/Mn=1.74

Polymer Synthesis Example 29

A 2-L flask was charged with 7.2 g of Monomer 11, 5.3 g of 4-hydroxyphenyl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer composition (molar ratio)

Monomer 11:4-hydroxyphenyl methacrylate:3-oxo-2,7-dioxatricyclo[4.2.1.0$^{4,8}$]nonan-9-yl methacrylate:PAG monomer 3=0.30:0.30:0.30:0.10

Mw=7,600

Mw/Mn=1.87

This is designated Polymer 29.

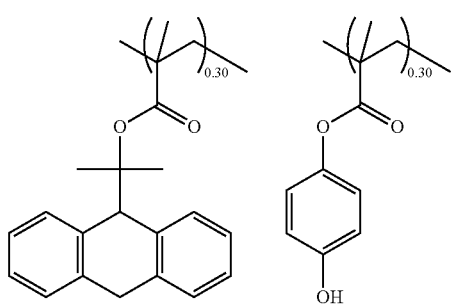

Polymer 29

This is designated Polymer 30.

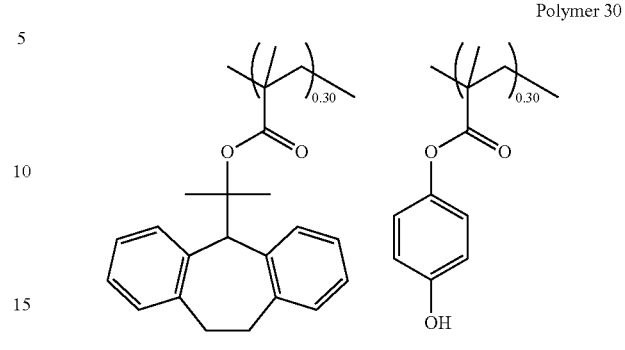

Polymer 30

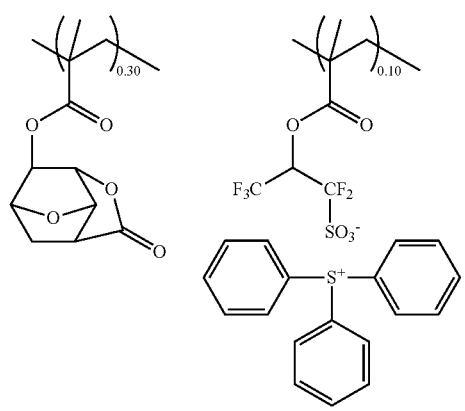

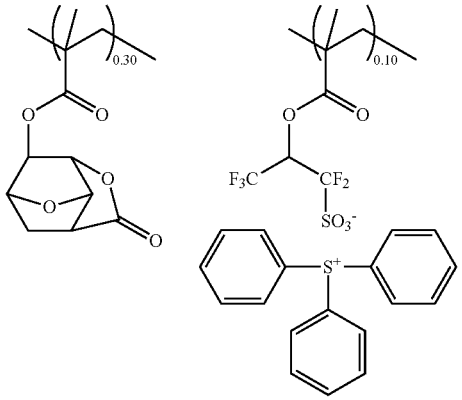

Polymer Synthesis Example 30

A 2-L flask was charged with 9.6 g of Monomer 12, 5.3 g of 4-hydroxyphenyl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer composition (molar ratio)

Monomer 12:4-hydroxyphenyl methacrylate:3-oxo-2,7-dioxatricyclo[4.2.1.0$^{4,8}$]nonan-9-yl methacrylate:PAG monomer 3=0.30:0.30:0.30:0.10

Mw=7,300

Mw/Mn=1.69

Polymer Synthesis Example 31

A 2-L flask was charged with 4.8 g of Monomer 13, 3.4 g of 3-ethyl-3-cyclooctane methacrylate, 5.3 g of 4-hydroxyphenyl methacrylate, 6.5 g of 2,7-dihydro-2-oxobenzo[C]furan-5-yl methacrylate, 5.6 g of PAG monomer 4, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer composition (molar ratio)

Monomer 13:3-ethyl-3-cyclooctane methacrylate:4-hydroxyphenyl methacrylate:2,7-dihydro-2-oxobenzo[C]furan-5-yl methacrylate:PAG monomer 4=0.15:0.15:0.30:0.30:0.10

Mw=7,300

Mw/Mn=1.71

This is designated Polymer 31.

This is designated Polymer 32.

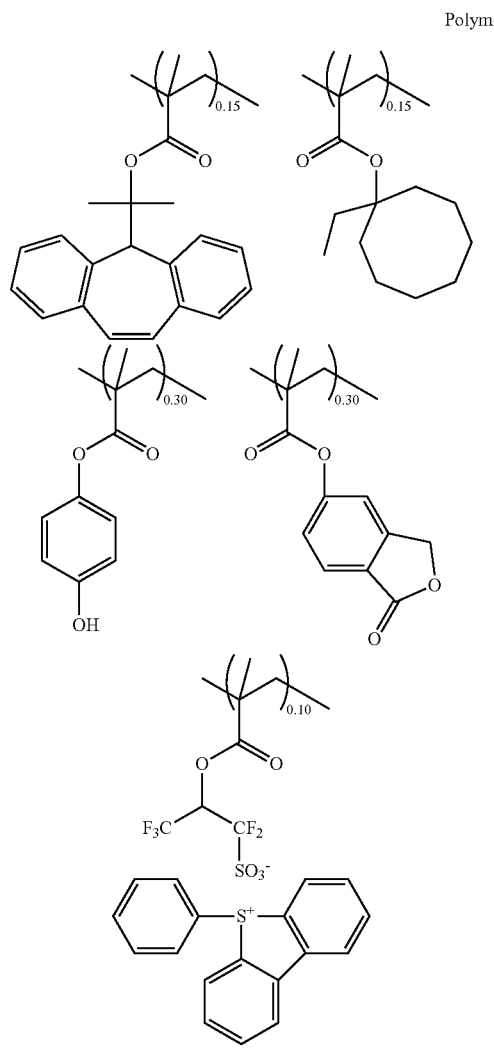

Polymer 31

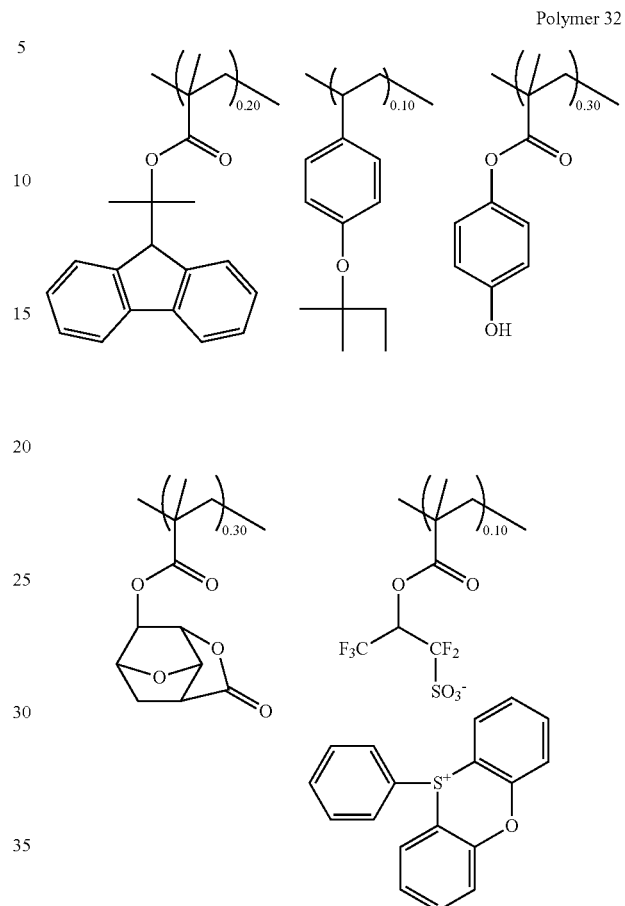

Polymer 32

Polymer Synthesis Example 32

A 2-L flask was charged with 7.3 g of Monomer 10, 2.0 g of 4-amyloxystyrene, 5.3 g of 4-hydroxyphenyl methacrylate, 6.7 g of 3-oxo-2,7-dioxatricyclo[4.2.1.0$^{4,8}$]nonan-9-yl methacrylate, 5.7 g of PAG monomer 5, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.
Copolymer composition (molar ratio)
Monomer 10:4-amyloxystyrene:4-hydroxyphenyl methacrylate:3-oxo-2,7-dioxatricyclo[4.2.1.0$^{4,8}$]nonan-9-yl methacrylate:PAG monomer 5=0.20:0.10:0.30:0.30:0.10
Mw=7,300
Mw/Mn=1.91

Polymer Synthesis Example 33

A 2-L flask was charged with 7.3 g of Monomer 10, 2.3 g of 4-t-butoxyphenyl methacrylate, 5.3 g of 4-hydroxyphenyl methacrylate, 6.7 g of 3-oxo-2,7-dioxatricyclo[4.2.1.0$^{4,8}$]-nonan-9-yl methacrylate, 7.4 g of PAG monomer 6, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.
Copolymer composition (molar ratio)
Monomer 10:4-t-butoxyphenyl methacrylate:4-hydroxyphenyl methacrylate:3-oxo-2,7-dioxatricyclo[4.2.1.0$^{4,8}$]nonan-9-yl methacrylate:PAG monomer 6=0.20:0.10:0.30:0.30:0.10
Mw=7,500
Mw/Mn=1.91

This is designated Polymer 33.

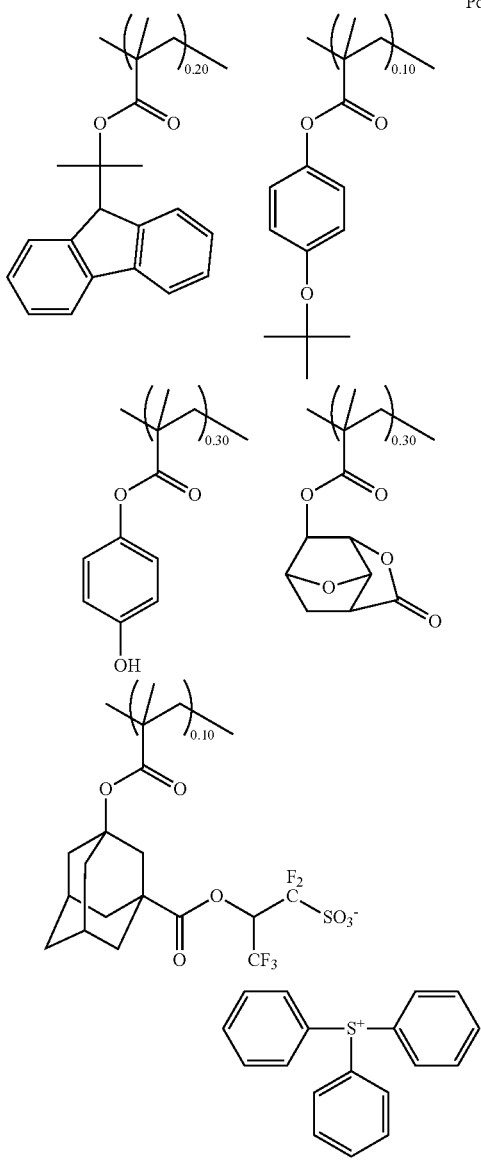

Polymer 33

Polymer Synthesis Example 34

A 2-L flask was charged with 4.9 g of Monomer 1, 3.5 g of 3-cyclohexyl-3-cyclopentane methacrylate, 4.3 g of 4-hydroxyphenyl methacrylate, 6.7 g of 3-oxo-2,7-dioxatricyclo[4.2.1.0$^{4,8}$]nonan-9-yl methacrylate, 6.7 g of PAG monomer 7, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.

Copolymer composition (molar ratio)

Monomer 1:3-cyclohexyl-3-cyclopentane methacrylate:4-hydroxyphenyl methacrylate:3-oxo-2,7-dioxatricyclo[4.2.1.0$^{4,8}$]nonan-9-yl methacrylate:PAG monomer 7=0.20:0.15:0.25:0.30:0.10

Mw=7,200

Mw/Mn=1.71

This is designated Polymer 34.

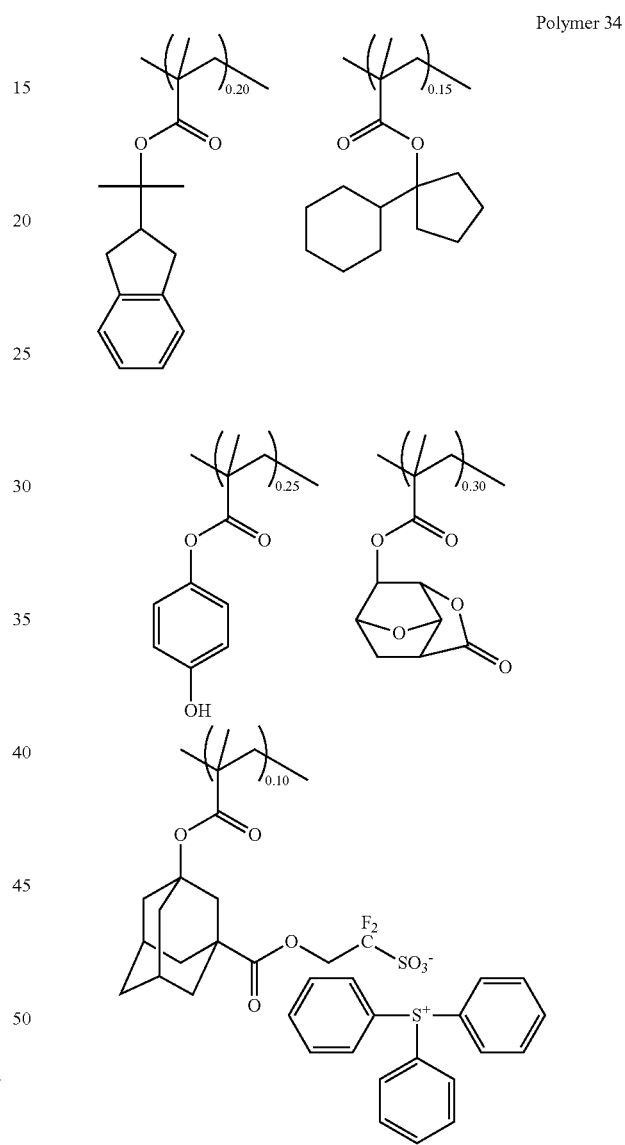

Polymer 34

Comparative Synthesis Example 1

A polymer was synthesized by the same procedure as above.

Copolymer composition (molar ratio) hydroxystyrene:1-ethylcyclopentyl methacrylate=0.70:0.30

Mw=9,300

Mw/Mn=1.86

This is designated Comparative Polymer 1.

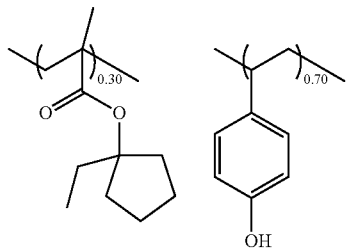

Comparative Polymer 1

Comparative Synthesis Example 2

A polymer was synthesized by the same procedure as above.
Copolymer composition (molar ratio) hydroxystyrene:1-dimethylphenyl methacrylate=0.67:0.33
Mw=8,300
Mw/Mn=1.97
This is designated Comparative Polymer 2.

Comparative Polymer 2

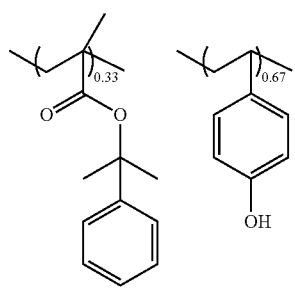

Comparative Synthesis Example 3

A polymer was synthesized by the same procedure as above.
Copolymer composition (molar ratio) hydroxystyrene:1-dimethyl-2-naphthalene methacrylate=0.72:0.28
Mw=8,600
Mw/Mn=1.91
This is designated Comparative Polymer 3.

Comparative Polymer 3

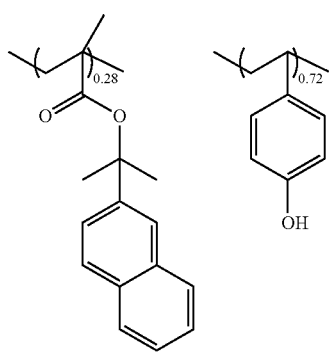

Comparative Synthesis Example 4

A polymer was synthesized by the same procedure as above.
Copolymer composition (molar ratio) hydroxystyrene:1-phenylethyl methacrylate=0.65:0.35
Mw=8,300
Mw/Mn=1.97
This is designated Comparative Polymer 4.

Comparative Polymer 4

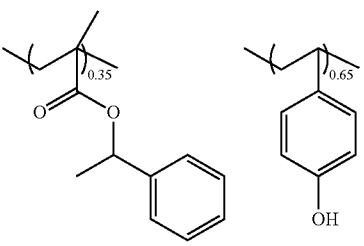

Comparative Synthesis Example 5

A polymer was synthesized by the same procedure as above.
Copolymer composition (molar ratio) hydroxystyrene:tetrahydronaphthalen-1-yl methacrylate=0.70:0.30
Mw=7,200
Mw/Mn=1.71
This is designated Comparative Polymer 5.

Comparative Polymer 5

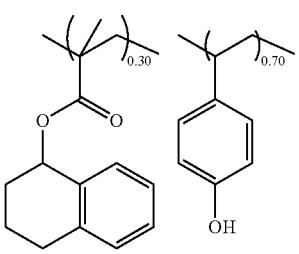

Comparative Synthesis Example 6

A polymer was synthesized by the same procedure as above.
Copolymer composition (molar ratio) hydroxystyrene:indan-1-yl methacrylate=0.70:0.30
Mw=7,300
Mw/Mn=1.79

This is designated Comparative Polymer 6.

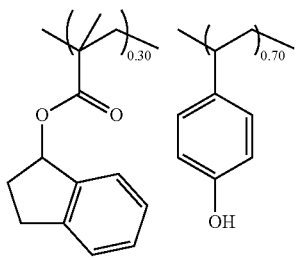
Comparative Polymer 6

Comparative Synthesis Example 7

A polymer was synthesized by the same procedure as above.
Copolymer composition (molar ratio) hydroxystyrene:1-methylindan-1-yl methacrylate=0.70:0.30
Mw=7,600
Mw/Mn=1.73

This is designated Comparative Polymer 7.

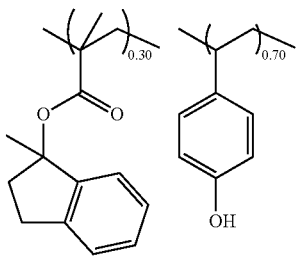
Comparative Polymer 7

Comparative Synthesis Example 8

A polymer was synthesized by the same procedure as above.
Copolymer composition (molar ratio) 1-ethylcyclopentyl methacrylate:4-hydroxyphenyl methacrylate:3-oxo-2,7-dioxatricyclo[4.2.1.0$^{4,8}$]nonan-9-yl methacrylate: PAG monomer 3=0.30:0.30:0.30:0.10
Mw=7,900
Mw/Mn=1.89

This is designated Comparative Polymer 8.

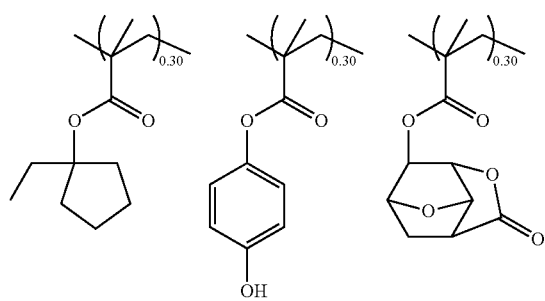
Comparative Polymer 8

Examples and Comparative Examples

Positive resist compositions were prepared by dissolving each of the polymers synthesized above and selected components in a solvent in accordance with the recipe shown in Tables 1 and 2, and filtering through a filter having a pore size of 0.2 µm. The solvent contained 100 ppm of a surfactant FC-4430 (3M Sumitomo Co., Ltd.).

The components in Tables 1 and 2 are as identified below.

Polymers 1 to 34: Polymers Synthesized in Polymer Synthesis Examples 1 to 34

Comparative Polymers 1 to 8:

Polymers Synthesized in Comparative Synthesis Examples 1 to 8

Organic Solvents:
   propylene glycol monomethyl ether acetate (PGMEA)
   cyclohexanone (CyH)

Acid generators: PAG1 and PAG2 of the following structural formulae

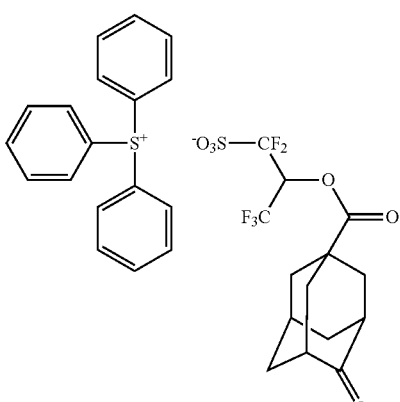
PAG 1

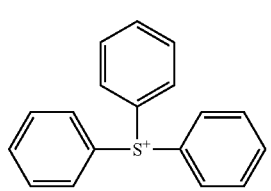
PAG 2

-continued

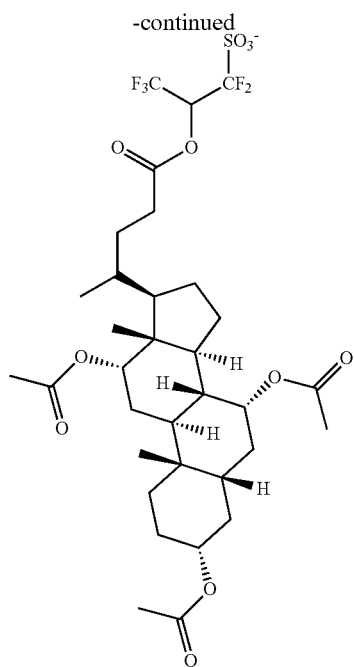

Basic compounds: Amine 1, Amine 2, and Amine 3 of the following structural formulae Amine 1

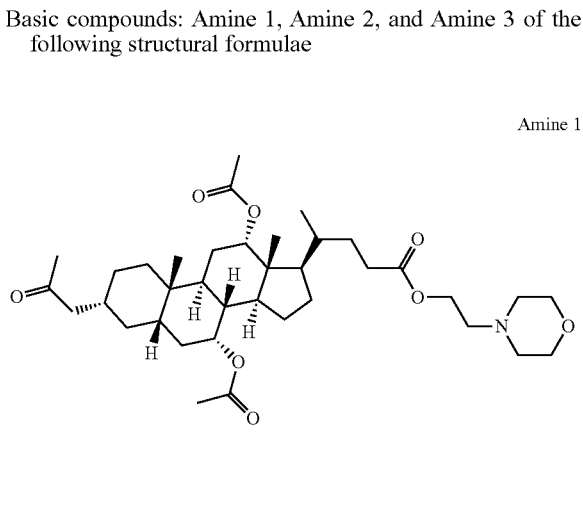

Amine 2

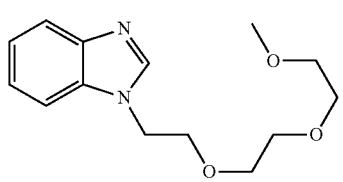

Amine 3

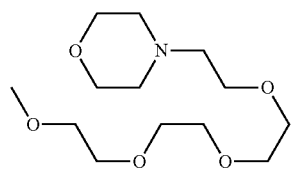

Dissolution Regulators:
DRI1 and DRI2 of the following structural formulae

DRI 1

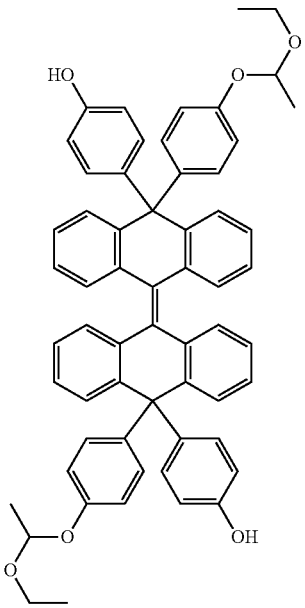

DRI 2

EB Writing Test

Using a coater/developer system Clean Track Mark 5 (Tokyo Electron Ltd.), the positive resist composition prepared above was spin coated onto a silicon substrate (diameter 6 inches, vapor primed with hexamethyldisilazane (HMDS)) and pre-baked on a hot plate at 110° C. for 60 seconds to form a resist film of 100 nm thick. Using a system HL-800D (Hitachi Ltd.) at a HV voltage of 50 keV, the resist film was exposed imagewise to EB in a vacuum chamber.

Using Clean Track Mark 5, immediately after the imagewise exposure, the wafer was baked (PEB) on a hot plate for 60 seconds and puddle developed in a 2.38 wt % TMAH aqueous solution for 30 seconds to form a positive pattern.

Resolution is a minimum size at the exposure dose (sensitivity) that provides a 1:1 resolution of a 120-nm line-and-space pattern. The 120-nm line-and-space pattern was measured for line width roughness (LWR) under SEM.

The resist composition is shown in Tables 1 and 2 together with the sensitivity and resolution of EB lithography.

TABLE 1

| Polymer (pbw) | Acid generator (pbw) | Base (pbw) | Dissolution regulator (pbw) | Organic solvent (pbw) | PEB temp. (° C.) | Sensitivity ($\mu C/cm^2$) | Resolution (nm) | LWR (nm) |
|---|---|---|---|---|---|---|---|---|
| Polymer 1 (100) | PAG 2 (10) | Amine 1 (1.5) | — | PGMEA (2,000) | 95 | 30 | 85 | 7.2 |
| Polymer 2 (100) | PAG 2 (10) | Amine 1 (1.5) | — | PGMEA (2,000) | 95 | 36 | 85 | 6.9 |
| Polymer 3 (100) | PAG 2 (10) | Amine 1 (1.5) | — | PGMEA (2,000) | 95 | 38 | 85 | 7.0 |
| Polymer 4 (100) | PAG 2 (10) | Amine 1 (1.5) | — | PGMEA (2,000) | 95 | 42 | 85 | 7.1 |
| Polymer 5 (100) | PAG 1 (10) | Amine 1 (1.5) | — | PGMEA (2,000) | 95 | 36 | 85 | 6.9 |
| Polymer 6 (100) | PAG 1 (10) | Amine 1 (1.5) | — | PGMEA (2,000) | 95 | 39 | 85 | 6.9 |
| Polymer 7 (100) | PAG 1 (10) | Amine 1 (1.5) | — | PGMEA (2,000) | 95 | 38 | 85 | 6.9 |
| Polymer 8 (100) | PAG 1 (10) | Amine 1 (1.5) | — | PGMEA (2,000) | 95 | 36 | 85 | 7.0 |
| Polymer 9 (100) | PAG 1 (10) | Amine 1 (1.5) | — | PGMEA (2,000) | 95 | 35 | 85 | 6.9 |
| Polymer 10 (100) | PAG 1 (10) | Amine 1 (1.5) | — | PGMEA (2,000) | 95 | 38 | 85 | 6.2 |
| Polymer 11 (100) | PAG 1 (10) | Amine 1 (1.5) | — | PGMEA (2,000) | 95 | 40 | 85 | 6.0 |
| Polymer 12 (100) | PAG 2 (10) | Amine 1 (1.5) | — | PGMEA (2,000) | 95 | 40 | 90 | 7.0 |
| Polymer 13 (100) | PAG 1 (10) | Amine 1 (1.5) | — | PGMEA (2,000) | 95 | 42 | 90 | 7.5 |
| Polymer 14 (100) | — | Amine 1 (1.5) | — | PGMEA (500) CyH (1,500) | 90 | 42 | 80 | 5.6 |
| Polymer 15 (100) | — | Amine 1 (1.5) | — | PGMEA (500) CyH (1,500) | 95 | 46 | 82 | 5.2 |
| Polymer 16 (100) | — | Amine 1 (1.5) | — | PGMEA (500) CyH (1,500) | 95 | 40 | 75 | 4.2 |
| Polymer 17 (100) | — | Amine 1 (1.5) | — | PGMEA (500) CyH (1,500) | 95 | 39 | 75 | 5.0 |
| Polymer 18 (100) | — | Amine 1 (1.5) | — | PGMEA (500) CyH (1,500) | 100 | 39 | 70 | 5.2 |
| Polymer 19 (100) | — | Amine 1 (1.5) | — | PGMEA (500) CyH (1,500) | 100 | 39 | 65 | 5.3 |
| Polymer 20 (100) | — | Amine 1 (1.5) | — | PGMEA (500) CyH (1,500) | 95 | 38 | 70 | 4.6 |
| Polymer 21 (100) | — | Amine 1 (1.5) | — | PGMEA (500) CyH (1,500) | 95 | 42 | 70 | 4.1 |
| Polymer 22 (100) | — | Amine 1 (1.5) | — | PGMEA (500) CyH (1,500) | 95 | 40 | 70 | 4.6 |
| Polymer 23 (100) | — | Amine 1 (1.5) | — | PGMEA (500) CyH (1,500) | 90 | 42 | 70 | 4.6 |
| Polymer 24 (100) | — | Amine 1 (1.5) | — | PGMEA (500) CyH (1,500) | 95 | 43 | 70 | 4.3 |
| Polymer 25 (100) | — | Amine 1 (1.5) | — | PGMEA (500) CyH (1,500) | 95 | 47 | 70 | 4.2 |
| Polymer 26 (100) | — | Amine 1 (1.5) | — | PGMEA (500) CyH (1,500) | 95 | 44 | 65 | 4.8 |

TABLE 2

| Polymer (pbw) | Acid generator (pbw) | Base (pbw) | Dissolution regulator (pbw) | Organic solvent (pbw) | PEB temp. (° C.) | Sensitivity ($\mu C/cm^2$) | Resolution (nm) | LWR (nm) |
|---|---|---|---|---|---|---|---|---|
| Polymer 27 (100) | — | Amine 1 (1.5) | — | PGMEA (500) CyH (1,500) | 95 | 43 | 65 | 4.3 |
| Polymer 28 (100) | — | Amine 1 (1.5) | — | PGMEA (500) CyH (1,500) | 95 | 42 | 65 | 4.4 |
| Polymer 16 (100) | — | Amine 2 (0.5) | — | PGMEA (500) CyH (1,500) | 95 | 47 | 75 | 4.4 |
| Polymer 16 (100) | — | Amine 3 (0.7) | — | PGMEA (500) CyH (1,500) | 95 | 48 | 75 | 4.2 |
| Polymer 16 (100) | — | Amine 1 (1.5) | DRI 1 (10) | PGMEA (500) CyH (1,500) | 85 | 33 | 80 | 4.1 |
| Polymer 16 (100) | — | Amine 1 (1.5) | DRI 2 (10) | PGMEA (500) CyH (1,500) | 85 | 38 | 80 | 4.2 |
| Polymer 29 (100) | — | Amine 1 (1.5) | — | PGMEA (500) CyH (1,500) | 95 | 49 | 80 | 5.0 |

TABLE 2-continued

| Polymer (pbw) | Acid generator (pbw) | Base (pbw) | Dissolution regulator (pbw) | Organic solvent (pbw) | PEB temp. (°C.) | Sensitivity ($\mu C/cm^2$) | Resolution (nm) | LWR (nm) |
|---|---|---|---|---|---|---|---|---|
| Polymer 30 (100) | — | Amine 1 (1.5) | — | PGMEA (500) CyH (1,500) | 95 | 46 | 80 | 4.9 |
| Polymer 31 (100) | — | Amine 2 (0.5) | — | PGMEA (500) CyH (1,500) | 85 | 50 | 75 | 4.1 |
| Polymer 32 (100) | — | Amine 2 (0.5) | — | PGMEA (500) CyH (1,500) | 95 | 40 | 75 | 4.4 |
| Polymer 33 (100) | — | Amine 2 (0.5) | — | PGMEA (500) CyH (1,500) | 100 | 42 | 75 | 4.4 |
| Polymer 34 (100) | — | Amine 2 (0.5) | — | PGMEA (500) CyH (1,500) | 100 | 49 | 75 | 4.6 |
| Comparative Polymer 1 (100) | PAG 2 (10) | Amine 1 (1.5) | — | PGMEA (2,000) | 90 | 25 | 110 | 7.2 |
| Comparative Polymer 2 (100) | PAG 2 (10) | Amine 1 (1.5) | — | PGMEA (2,000) | 80 | 30 | 120 | 7.9 |
| Comparative Polymer 3 (100) | PAG 2 (10) | Amine 1 (1.5) | — | PGMEA (2,000) | 80 | 45 | 100 | 8.8 |
| Comparative Polymer 4 (100) | PAG 2 (10) | Amine 1 (1.5) | — | PGMEA (2,000) | 95 | 55 | 95 | 8.5 |
| Comparative Polymer 5 (100) | PAG 2 (10) | Amine 1 (1.5) | — | PGMEA (2,000) | 90 | 42 | 95 | 7.9 |
| Comparative Polymer 6 (100) | PAG 2 (10) | Amine 1 (1.5) | — | PGMEA (2,000) | 90 | 45 | 95 | 8.2 |
| Comparative Polymer 7 (100) | PAG 2 (10) | Amine 1 (1.5) | — | PGMEA (2,000) | 80 | 32 | 95 | 7.9 |
| Comparative Polymer 8 (100) | — | Amine 1 (1.5) | — | PGMEA (500) CyH (1,500) | 90 | 52 | 80 | 5.3 |

Dry Etching Test

Each polymer, 2 g, was thoroughly dissolved in 10 g of cyclohexanone, and passed through a filter having a pore size of 0.2 µm, obtaining a polymer solution. The polymer solution was spin coated onto a silicon substrate and baked to form a polymer film of 300 nm thick. Using a dry etching instrument TE-8500P (Tokyo Electron Ltd.), the polymer film was etched with $CHF_3/CF_4$ gas under the following conditions.

| | |
|---|---|
| Chamber pressure | 40.0 Pa |
| RF power | 1000 W |
| Gap | 9 mm |
| $CHF_3$ gas flow rate | 30 ml/min |
| $CF_4$ gas flow rate | 30 ml/min |
| Ar gas flow rate | 100 ml/min |
| Time | 60 sec |

The difference in polymer film thickness before and after etching was determined, from which an etching rate per minute was computed. The results are shown in Table 3. A smaller value of film thickness difference, i.e., a lower etching rate indicates better etching resistance.

TABLE 3

| | $CHF_3/CF_4$ gas etching rate (nm/min) |
|---|---|
| Polymer 1 | 98 |
| Polymer 2 | 106 |
| Polymer 3 | 105 |
| Polymer 4 | 114 |
| Polymer 5 | 94 |
| Polymer 6 | 105 |
| Polymer 7 | 100 |
| Polymer 8 | 91 |
| Polymer 9 | 93 |
| Polymer 10 | 98 |
| Polymer 11 | 95 |
| Polymer 12 | 91 |
| Polymer 13 | 88 |
| Polymer 14 | 98 |
| Polymer 15 | 96 |
| Polymer 16 | 102 |
| Polymer 17 | 97 |
| Polymer 18 | 95 |
| Polymer 19 | 98 |
| Polymer 20 | 101 |
| Polymer 21 | 101 |
| Polymer 22 | 102 |
| Polymer 23 | 96 |
| Polymer 24 | 97 |
| Polymer 25 | 98 |
| Polymer 26 | 98 |
| Polymer 27 | 93 |
| Polymer 28 | 94 |
| Polymer 29 | 96 |
| Polymer 30 | 98 |
| Polymer 31 | 100 |
| Polymer 32 | 96 |
| Polymer 33 | 96 |
| Polymer 34 | 100 |
| Comparative Polymer 1 | 122 |
| Comparative Polymer 2 | 110 |

TABLE 3-continued

| | CHF$_3$/CF$_4$ gas etching rate (nm/min) |
|---|---|
| Comparative Polymer 3 | 95 |
| Comparative Polymer 4 | 111 |
| Comparative Polymer 5 | 100 |
| Comparative Polymer 6 | 103 |
| Comparative Polymer 7 | 111 |
| Comparative Polymer 8 | 116 |

It is evident from Tables 1 and 2 that the resist compositions using the inventive polymers show satisfactory resolution, sensitivity and edge roughness. Although some polymers comprising an acid generator of polymer type copolymerized therein and having conventional acid labile groups are drastically improved in resolution and edge roughness properties and sometimes superior to those polymers which do not contain an acid generator of polymer type, but fall within the scope of the invention, the polymers having acid labile groups within the scope of the invention and comprising an acid generator copolymerized therein exhibit excellent resolution and minimized edge roughness owing to their synergy. These polymers have good dry etching resistance as demonstrated by a smaller difference in film thickness before and after etching in Table 3.

Japanese Patent Application No. 2011-218941 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive resist composition comprising as a base resin a polymer having carboxyl groups whose hydrogen is substituted by an acid labile group having the general formula (1), (2) or (3):

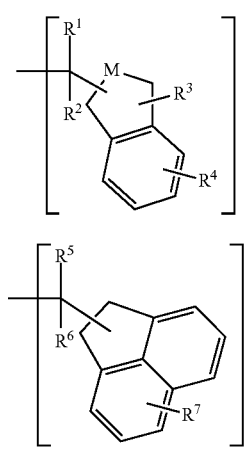

(1)

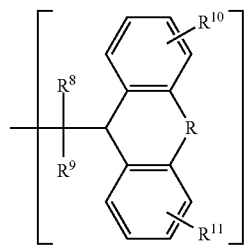

(3)

wherein $R^1$, $R^2$, $R^5$, $R^6$, $R^8$, and $R^9$ are each independently a straight, branched or cyclic $C_1$-$C_8$ alkyl, $C_6$-$C_{10}$ aryl, or $C_2$-$C_{10}$ alkenyl group, which may contain an oxygen or sulfur atom, $R^3$, $R^4$, $R^7$, $R^{10}$, and $R^{11}$ are each independently hydrogen, a straight, branched or cyclic $C_1$-$C_6$ alkyl, alkoxy, acyloxy, halogen, cyano, nitro, hydroxyl, or trifluoromethyl group, M is methylene or ethylene, R is a single bond or a $C_1$-$C_2$ linking group which may contain a double bond, oxygen atom or sulfur atom.

2. The resist composition of claim 1, comprising as the base resin a polymer comprising recurring units (a1), (a2) or (a3) of the general formula (4), selected from (meth)acrylic acid and derivatives thereof, styrenecarboxylic acid, and vinyl-naphthalenecarboxylic acid, each having substituted thereon an acid labile group of formula (1), (2) or (3), the polymer having a weight average molecular weight of 1,000 to 500,000,

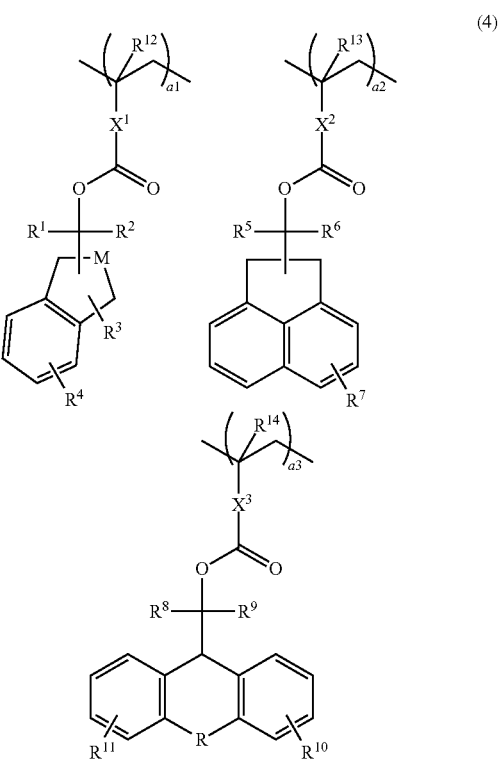

(4)

wherein $R^1$ to $R^{11}$, M and R are as defined above, $X^1$ to $X^3$ each are a single bond, —C(=O)—O—$R^{15}$—, phenylene or naphthylene group, $R^{15}$ is a straight, branched or cyclic $C_1$-$C_{10}$ alkylene group which may have an ester radical, ether radical or lactone ring, and $R^{12}$, $R^{13}$ and $R^{14}$ each are hydrogen or methyl.

3. The resist composition of claim 2 wherein said polymer is a copolymer comprising recurring units (a1), (a2) and/or (a3) of the general formula (4), selected from (meth)acrylic acid and derivatives thereof, styrenecarboxylic acid, and vinylnaphthalenecarboxylic acid, each having substituted thereon an acid labile group of formula (1), (2) and/or (3), and recurring units (b) having an adhesive group selected from the class consisting of hydroxyl, lactone, ether, ester, carbonyl, cyano, sulfonic acid ester, sulfonamide groups, cyclic —O—C(=O)—S— and —O—C(=O)—NH— groups, a1, a2, a3, and b being in the range: 0<a1+a2+a3<1.0, 0<b<1.0, and 0.05≤a1+a2+a3+b≤1.0, the copolymer having a weight average molecular weight of 1,000 to 500,000.

4. The resist composition of claim 3 wherein the recurring units (b) are recurring units having a phenolic hydroxyl group.

5. The resist composition of claim 4 wherein the recurring units having a phenolic hydroxyl group are selected from units (b1) to (b9) represented by the following general formula (5):

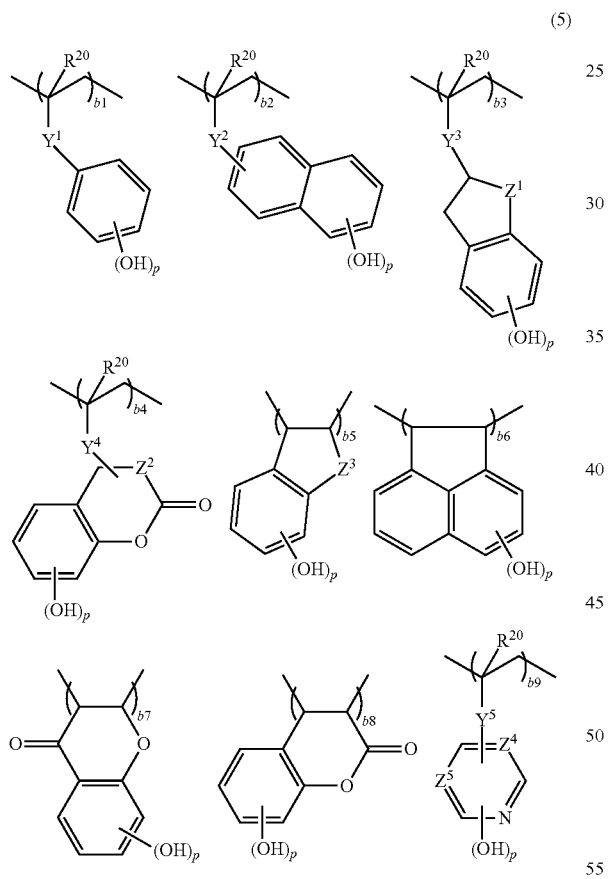

(5)

wherein $Y^1$, $Y^2$ and $Y^5$ each are a single bond or —C(=O)—O—$R^{21}$—, $Y^3$ and $Y^4$ each are —C(=O)—(O)$R^{22}$—, $R^{21}$ and $R^{22}$ each are a single bond or a straight, branched or cyclic $C_1$-$C_{10}$ alkylene group which may contain an ether or ester radical, $R^{20}$ is each independently hydrogen or methyl, $Z^1$ and $Z^2$ each are methylene or ethylene, $Z^3$ is methylene, oxygen or sulfur, $Z^4$ and $Z^5$ each are CH or nitrogen, and p is 1 or 2.

6. The resist composition of claim 3 wherein the copolymer has further copolymerized therein recurring units selected from units (c1) to (c5) of indene, acenaphthylene, chromone, coumarin, and norbornadiene, or derivatives thereof, represented by the following general formula (6):

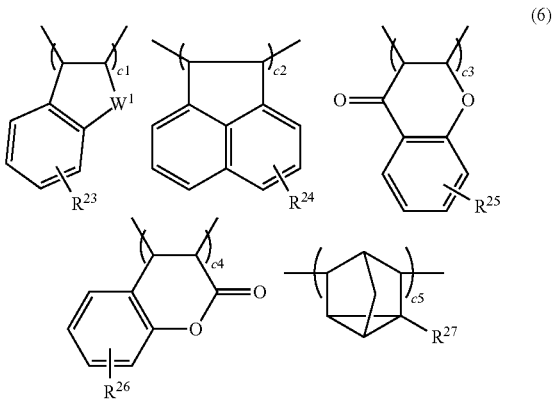

(6)

wherein $R^{23}$ to $R^{27}$ are each independently selected from the class consisting of hydrogen, $C_1$-$C_{30}$ alkyl, partially or entirely halo-substituted alkyl, alkoxy, alkanoyl or alkoxycarbonyl group, $C_6$-$C_{10}$ aryl group, halogen, and 1,1,1,3,3,3-hexafluoro-2-propanol, and $W^1$ is methylene, oxygen or sulfur.

7. The resist composition of claim 3 wherein the copolymer has further copolymerized therein units selected from sulfonium salts (d1) to (d3) represented by the following general formula (7):

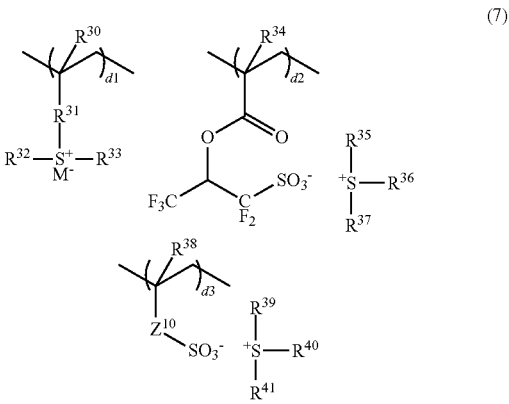

(7)

wherein $R^{30}$, $R^{34}$, and $R^{38}$ each are hydrogen or methyl, $R^{31}$ is a single bond, phenylene, —O—$R^{42}$—, or —C(=O)—$Y^{10}$—$R^{42}$—, $Y^{10}$ is oxygen or NH, $R^{42}$ is a straight, branched or cyclic $C_1$-$C_6$ alkylene group, alkenylene or phenylene group, which may contain a carbonyl, ester, ether or hydroxyl radical, $R^{32}$, $R^{33}$, $R^{35}$, $R^{36}$, $R^{37}$, $R^{39}$, $R^{40}$, and $R^{41}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group, $Z^{10}$ is a single bond, methylene, ethylene, phenylene, fluorophenylene, —O—$R^{43}$—, or —C(=O)—$Z^{11}$—$R^{43}$—, $Z^{11}$ is oxygen or NH, $R^{43}$ is a straight, branched or cyclic $C_1$-$C_6$ alkylene group, alkenylene or phenylene group, which may contain a carbonyl, ester, ether or hydroxyl radical, $M^-$ is a non-nucleophilic counter ion, d1, d2 and d3 are in the range of 0≤d1≤0.3, 0≤d2≤0.3, 0≤d3≤0.3, and 0<d1+d2+d3≤0.3.

8. The resist composition of claim 1, further comprising an organic solvent and an acid generator, the composition being a chemically amplified positive resist composition.

9. The resist composition of claim 8, further comprising a dissolution regulator.

10. The resist composition of claim 8, further comprising a basic compound and/or a surfactant as an additive.

11. A pattern forming process comprising the steps of applying the positive resist composition of claim 1 onto a substrate to form a coating, baking, exposing the coating to high-energy radiation, and developing the exposed coating in a developer.

* * * * *